US012777734B2

(12) United States Patent
Chung et al.

(10) Patent No.: US 12,777,734 B2
(45) Date of Patent: Oct. 27, 2026

(54) IMAGE SENSOR

(71) Applicant: SAMSUNG ELECTRONICS CO., LTD., Suwon-si (KR)

(72) Inventors: Haeyeon Chung, Suwon-si (KR); Sangcheon Park, Suwon-si (KR); Sungyong You, Suwon-si (KR); Sungsoo Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 256 days.

(21) Appl. No.: 18/614,335

(22) Filed: Mar. 22, 2024

(65) Prior Publication Data

US 2024/0321923 A1 Sep. 26, 2024

(30) Foreign Application Priority Data

Mar. 24, 2023 (KR) ........................ 10-2023-0038966
May 15, 2023 (KR) ........................ 10-2023-0062701

(51) Int. Cl.
*H10F 39/00* (2025.01)
*H04N 25/704* (2023.01)

(52) U.S. Cl.
CPC ....... *H10F 39/807* (2025.01); *H10F 39/8037* (2025.01); *H04N 25/704* (2023.01)

(58) Field of Classification Search
CPC .. H10F 39/807; H10F 39/8037; H10F 39/802; H10F 39/8063; H10F 39/811; H10F 39/813; H04N 25/704; H04N 25/59; H04N 25/771; H04N 25/778
See application file for complete search history.

(56) References Cited

U.S. PATENT DOCUMENTS

| | | | | |
|---|---|---|---|---|
| 10,573,676 | B2 * | 2/2020 | Yun | H10F 39/813 |
| 11,075,236 | B2 | 7/2021 | Shiraishi et al. | |
| 12,113,084 | B2 * | 10/2024 | Jung | H10F 39/8053 |
| 12,148,780 | B2 * | 11/2024 | Park | H10F 39/80373 |
| 2020/0075644 | A1 | 3/2020 | Aoki et al. | |
| 2020/0119082 | A1 | 4/2020 | Lee et al. | |
| 2020/0251521 | A1 | 8/2020 | Lee et al. | |

(Continued)

FOREIGN PATENT DOCUMENTS

| | | | |
|---|---|---|---|
| JP | 2018-201015 | A | 12/2018 |
| KR | 10-2020-0041144 | A | 4/2020 |

(Continued)

*Primary Examiner* — Allison Bernstein
(74) *Attorney, Agent, or Firm* — Sughrue Mion, PLLC

(57) ABSTRACT

An image sensor includes a substrate including a first pixel, a second pixel, a device isolation pattern, and at least one open region, wherein each of the first pixel and the second pixel includes a first pixel region including a first photoelectric conversion device and a second pixel region including a second photoelectric conversion device, the second pixel region being parallel with the first pixel region in a first direction, and wherein the device isolation pattern includes a first portion between the first pixel region and the second pixel region of the first pixel and between the first pixel region and the second pixel region of the second pixel, a second portion between the first pixel region of the first pixel and the first pixel region of the second pixel, and a third portion between the second pixel region of the first pixel and the second pixel region of the second pixel.

20 Claims, 35 Drawing Sheets

(56) References Cited

U.S. PATENT DOCUMENTS

| | | | |
|---|---|---|---|
| 2021/0375973 | A1 | 12/2021 | Ha et al. |
| 2022/0406825 | A1 | 12/2022 | Jin et al. |
| 2023/0044820 | A1 | 2/2023 | Park et al. |
| 2023/0143387 | A1 | 5/2023 | Matsumoto et al. |
| 2024/0170522 | A1* | 5/2024 | Choi ..................... H10F 39/806 |

FOREIGN PATENT DOCUMENTS

| | | | |
|---|---|---|---|
| KR | 10-2022-0170132 | A | 12/2022 |
| KR | 10-2023-0021428 | A | 2/2023 |
| WO | 2021/193915 | A1 | 9/2021 |

* cited by examiner

IMAGE SENSOR

CROSS-REFERENCE TO RELATED APPLICATION

This application is based on and claims priority under 35 U.S.C. § 119 to Korean Patent Application No. 10-2023-0062701, filed on May 15, 2023, in the Korean Intellectual Property Office, and Korean Patent Application No. 10-2023-0038966, filed on Mar. 24, 2023, in the Korean Intellectual Property Office, the disclosures of which are incorporated by reference herein in their entireties.

BACKGROUND

The disclosure relates to a semiconductor device, and more particularly, to an image sensor.

Image sensors may be mounted in various types of electronic devices. For example, electronic devices including image sensors may be included as components of various types of electronic devices, such as smartphones, tablet personal computers (PCs), laptop PCs, wearable devices, etc.

Image sensors may obtain image information about an external object by converting light reflected from the external object into an electrical signal. Electronic devices including image sensors may display images on a display panel by using the obtained image information.

Image sensors may generate images based on various settings. For example, image sensors may adjust exposure time, auto focus, white balance, etc. based on various settings. Additionally, image sensors may perform various compensation operations on images based on various settings, and may apply various filters to images.

SUMMARY

One or more example embodiments of the disclosure provide an image sensor with improved performance.

Additional aspects will be set forth in part in the description which follows and, in part, will be apparent from the description, or may be learned by practice of the presented embodiments.

According to an aspect of an example embodiment, an image sensor includes: a substrate including a first pixel, a second pixel, a device isolation pattern, and at least one open region, wherein each of the first pixel and the second pixel includes: a first pixel region including a first photoelectric conversion device; and a second pixel region including a second photoelectric conversion device, the first pixel region and the second pixel region being parallel to each other the first pixel region in a first direction, wherein the device isolation pattern includes: a first portion between the first pixel region and the second pixel region of the first pixel and between the first pixel region and the second pixel region of the second pixel; a second portion between the first pixel region of the first pixel and the first pixel region of the second pixel; a third portion between the second pixel region of the first pixel and the second pixel region of the second pixel; and a fourth portion at least partially surrounding the first pixel and the second pixel and physically connected to the first portion, the second portion, and the third portion, and wherein the at least one open region includes: a first open region between the first pixel region and the second pixel region, the first open region being adjacent to the first portion in a second direction that is orthogonal to the first direction, and the first open region being at an edge of first pixel and an edge of the second pixel; and a second open region between the first pixel and the second pixel and between the second portion and the third portion.

According to an aspect of an example embodiment, an image sensor includes: a substrate including a first pixel, a second pixel, and a device isolation pattern, wherein each of the first pixel and the second pixel includes a first pixel region including a first photoelectric conversion device; and a second pixel region including a second photoelectric conversion device, the first pixel region and the second pixel region being parallel to each other in a first direction, wherein the device isolation pattern includes: a first portion between the first pixel region and the second pixel region of the first pixel and between the first pixel region and the second pixel region of the second pixel; a second portion between the first pixel region of the first pixel and the first pixel region of the second pixel; a third portion between the second pixel region of the first pixel and the second pixel region of the second pixel; and a fourth portion at least partially surrounding the first pixel and the second pixel and physically connected to the first portion, the second portion, and the third portion, wherein the first portion of the first pixel and the first portion of the second pixel are spaced apart from each other in a second direction that is orthogonal to the first direction, and wherein the second portion and the third portion are spaced apart from each other in the first direction.

According to an aspect of an example embodiment, an image sensor includes: a substrate including a first pixel, a second pixel, a device isolation pattern, and at least one open region, wherein each of the first pixel and the second pixel includes: a first pixel region including a first photoelectric conversion device; and a second pixel region including a second photoelectric conversion device, the first pixel region and the second pixel region being parallel to each other in a first direction, wherein the device isolation pattern includes: a first portion between the first pixel region and the second pixel region of the first pixel and between the first pixel region and the second pixel region of the second pixel; a second portion spaced apart from the first portion in the first direction and on one side of the first pixel region; and a third portion at least partially surrounding the first pixel and the second pixel and physically connected to the first portion and the second portion, and wherein the at least one open region includes: a first open region between the first pixel region and the second pixel region, the first open region being adjacent to the first portion in a second direction that is orthogonal to the first direction, and the first open region being at an edge of each of the first pixel and the second pixel; and a second open region between the first pixel and the second pixel and between the second portion of the first pixel and the second portion of the second pixel.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
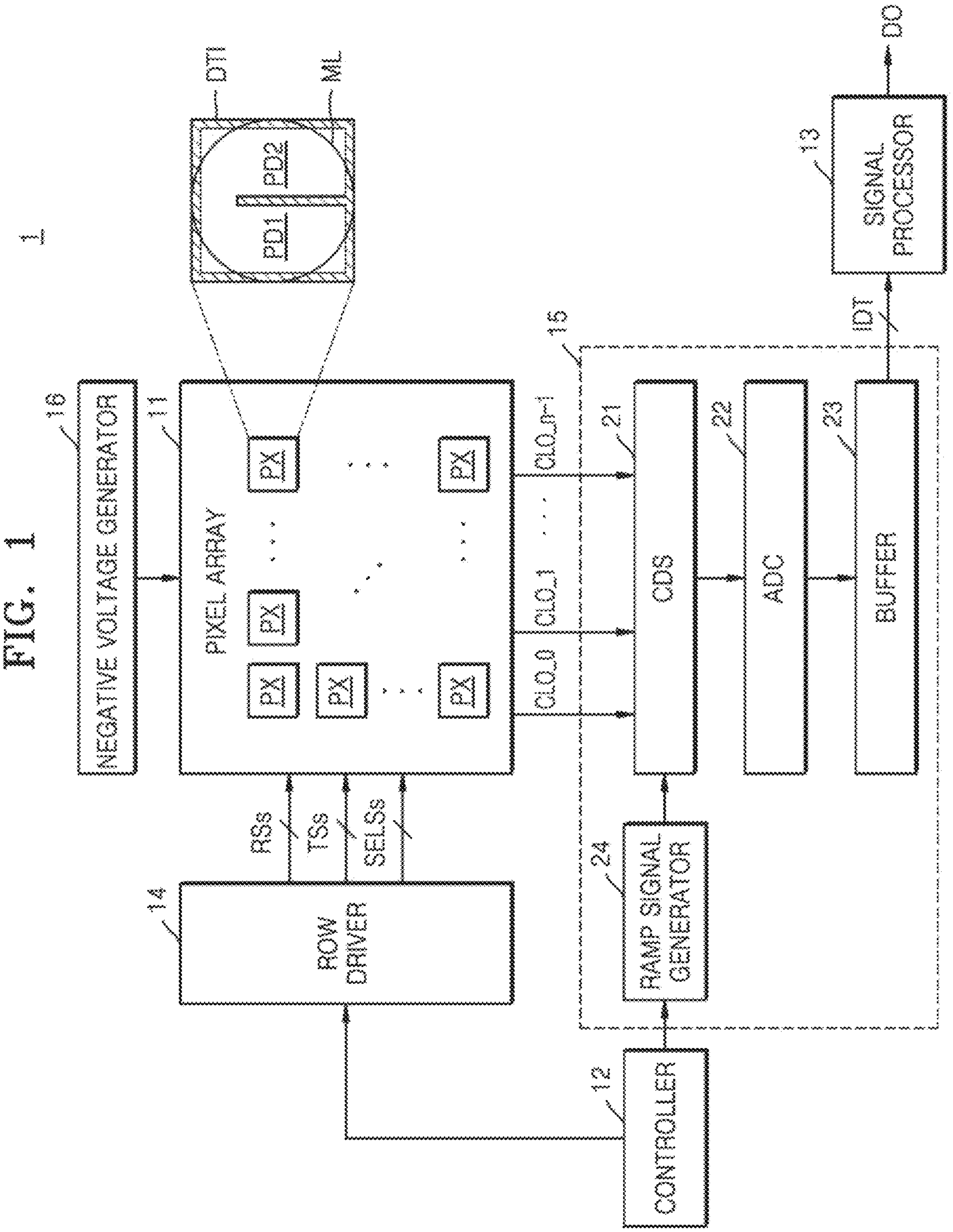
FIG. 1 is a block diagram of an image sensor according to an embodiment.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

FIG. 1 is a block diagram of an image sensor according to an embodiment.

Referring to FIG. 1, an image sensor 1 may include a pixel array 11, a controller 12, a signal processor 13, a row driver 14, and a read-out circuit 15. The read-out circuit 15 may include a correlated-double sampler (CDS) 21, an analog-digital converter (ADC) 22, and a buffer 23.

The pixel array 11 may convert optical signals into electrical signals and may include a plurality of pixels PXs that are two-dimensionally arranged. Each of the plurality of pixels PX may generate pixel signals according to detected intensity of light. The pixel PX may be implemented as a photoelectric conversion device such as a charge coupled device (CCD) or a complementary metal oxide semiconductor (CMOS), and other types of charge coupled devices. The pixel array 11 may include a color filter to sense various colors, and each of the plurality of pixels PX may sense a color corresponding thereto. The pixel array 11 may output pixel signals to the CDS 21 through first to nth column output lines CLO_0 to CLO_n−1 corresponding thereto.

The pixel array 11 may include the plurality of pixels PX. Each of the plurality of pixels PX may be defined by a deep device isolation pattern (or deep trench isolation (DTI) (or first device isolation pattern)). Each pixel PX may include a plurality of photoelectric conversion devices (for example, a first photoelectric conversion device PD1 and a second photoelectric conversion device PD2), and may generate photocharges by absorbing light. According to an embodiment, the pixel PX may be a pixel including two photoelectric conversion devices (e.g., a 2PD pixel). For example, the photoelectric conversion device may be a photodiode. In an embodiment, photocharges generated by each of the first photoelectric conversion device PD1 and the second photoelectric conversion device PD2 included in the same pixel PX may be accumulated in one floating diffusion region. An exemplary circuit corresponding to the pixel PX is described below with reference to FIG. 2.

Each of the plurality of pixels PX may include one microlens ML. All of the plurality of pixels PX included in the pixel array 11 may be auto focusing (AF) pixels capable of performing an AF function, and may be used to focus on an object.

A phase of a pixel signal generated from the pixel PX on which one microlens ML is disposed may vary according to a shape and refractive index of the microlens ML. In an embodiment, the first photoelectric conversion device PD1 and the second photoelectric conversion device PD2 included in the pixel PX may be disposed parallel to each other in a first direction (e.g., a row direction). The AF function in the first direction may be performed based on a phase difference between a first pixel signal according to the photocharges generated by the first photoelectric conversion device PD1 and a second pixel signal according to the photocharges generated by the second photoelectric conversion device PD2. Alternatively, in an embodiment, the first photoelectric conversion device PD1 and the second photoelectric conversion device PD2 included in the pixel PX may be disposed parallel to each other in a second direction (e.g., a column direction). The AF function in the second direction may be performed based on the phase difference between the first pixel signal according to the photocharges generated by the first photoelectric conversion device PD1 and the second pixel signal according to the photocharges generated by the second photoelectric conversion device PD2. As a result of performing the AF function, a focal position of a lens of an electronic device including the image sensor 1 may be calculated. For example, a position of the lens having the phase difference of 0 may be the focal position.

A deep device isolation pattern may be disposed between a region where the first photoelectric conversion device PD1 is formed and a region where the second photoelectric conversion device PD2 is formed, and the first photoelectric conversion device PD1 and the second photoelectric conversion device PD2 may be separated by the deep device isolation pattern. The pixel PX may include an open region disposed at an edge of the pixel PX, and at least a portion between the first photoelectric conversion device PD1 and the second photoelectric conversion device PD2 may be exposed by the open region. Accordingly, as the open region is formed at the edge, movement of the photocharges generated by each of the first photoelectric conversion device PD1 and the second photoelectric conversion device PD2 through the open region may be restricted, and AF contrast characteristics may be improved.

The controller 12 may control the row driver 14 such that the pixel array 11 may absorb light to accumulate photocharges or temporarily store the accumulated photocharges and may output a pixel signal according to the stored photocharges to the outside of the pixel array 11. Also, the controller 12 may control the read-out circuit 15 to measure a level of the pixel signal provided from the pixel array 11.

The row driver 14 may generate signals (e.g., reset control signals RS, transmission control signals TS, and selection signals SELS) for controlling the pixel array 11 and provide the signals to the pixel array 11. In an embodiment, the row driver 14 may determine timing of activation and deactivation of the reset control signals RS, the transmission control signals TS, and the selection signals SELS provided to the pixels PXs according to whether the AF function is performed.

The CDS 21 may sample and hold the pixel signal provided from the pixel array 11. The CDS 21 may double sample a level (reset level) of specific noise and a level (image level) according to an image signal, and output a level corresponding to a difference between the levels. Also, the CDS 21 may receive a ramp signal generated by a ramp signal generator 24, compare the ramp signal and the pixel signal, and output a comparison result.

The ADC 22 may convert an analog signal corresponding to the level received from the CDS 21 into a digital signal. The buffer 23 may latch digital signals, and the latched digital signals may be sequentially output to a signal processor 13 or the outside of the image sensor 1 as image data.

The signal processor 13 may perform signal processing on the image data output from the read-out circuit 15. For example, the signal processor 13 may perform noise reduction processing, gain adjustment, waveform shaping processing, interpolation processing, white balance processing, gamma processing, edge enhancement processing, etc. In addition, the signal processor 13 may output signal-processed information during an AF operation to a processor of the electronic device including the image sensor 1 such that the processor performs a phase difference calculation for the AF operation, or the signal processor 13 may perform the phase difference calculation for the AF operation. In an embodiment, the signal processor 13 may be provided in an external processor of the image sensor 1.

A negative voltage generator 16 may generate a negative voltage and provide a negative output voltage to the pixel array 11. The negative output voltage may be applied to the deep device isolation pattern of the pixel array 11.

The pixel array 11 according to an embodiment may include a pixel group. The pixel group may include first and second pixels. The first pixel may include a first pixel region and a second pixel region. The pixel group may include a first deep device isolation pattern separating the first pixel region and the second pixel region. The pixel group may include a first open region partially exposing the first pixel region and the second pixel region. The pixel group may include second and third deep device isolation patterns separating the first pixel and the second pixel. The pixel group may include a second open region partially exposing the first pixel and the second pixel. The first to third deep device isolation patterns may all be connected to each other without being separated from each other. A floating diffusion contact plug or a ground contact plug may be disposed on the second open region. The pixels PX may share the floating diffusion contact plug or the ground contact plug. Accordingly, crosstalk may be minimized, and simultaneously, a length of a conductive line may be reduced, and routing of the pixel array 11 may be facilitated.

Figure 2:
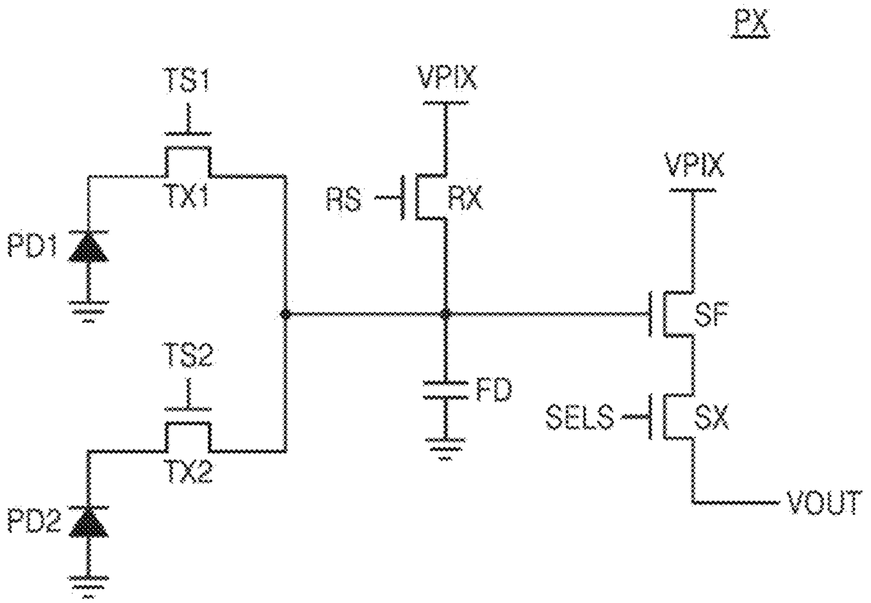
FIG. 2 is a circuit diagram of a pixel according to an embodiment.

FIG. 2 is a circuit diagram of a pixel according to an embodiment. The pixel PX of FIG. 2 may be applied to the pixel array 11 of FIG. 1.

Referring to FIG. 2, one pixel PX may include the first photoelectric conversion device PD1, the second photoelectric conversion device PD2, a first transfer transistor TX1, a second transfer transistor TX2, a reset transistor RX, an amplification transistor SF, and a selection transistor SX. Unlike shown in FIG. 2, at least one of the reset transistor RX, amplification transistor SF, or selection transistor SX may be omitted. One pixel PX may further include a dual conversion gain transistor.

The first photoelectric conversion device PD1 and the second photoelectric conversion device PD2 may generate photocharges that vary according to an intensity of light. For example, the first photoelectric conversion device PD1 and the second photoelectric conversion device PD2 are P-N junction diodes, and generate charges (that is, electrons which are negative charges and holes which are positive charges) in proportion to the amount of incident light. The first photoelectric conversion device PD1 and the second photoelectric conversion device PD2 are examples of photoelectric conversion devices, and include at least one of photo transistors, photo gates, and pinned photo diodes (PPDs) or combinations thereof.

The first transfer transistor TX1 may transmit photocharges generated by the first photoelectric conversion device PD1 to a floating diffusion region FD according to a first transfer control signal TS1, and the second transfer transistor TX2 may transmit photocharges generated by the second photoelectric conversion device PD2 to the floating diffusion region FD according to a second transfer control signal TS2. When each of the first transfer transistors TX1 and the second transfer transistor TX2 is turned on, the photocharges generated by each of the first photoelectric conversion device PD1 and the second photoelectric conversion device PD2 may be transmitted to one floating diffusion region FD, and may be accumulated and stored in the floating diffusion region FD.

The reset transistor RX may periodically reset charges accumulated in the floating diffusion region FD. A drain electrode of the reset transistor RX may be connected to the floating diffusion region FD, and a source electrode of the reset transistor RX may be connected to a power supply voltage VPIX. When the reset transistor RX is turned on according to the reset control signal RS, the power supply voltage VPIX connected to the source electrode of the reset transistor RX is transferred to the floating diffusion region FD. When the reset transistor RX is turned on, the charges accumulated in the floating diffusion region FD may be discharged such that the floating diffusion region FD may be reset.

The amplification transistor SF may be controlled according to the amount of photocharges accumulated in the floating diffusion region FD. The amplification transistor SF, which may be a buffer amplifier, may buffer a signal according to charges charged in the floating diffusion region FD. The amplification transistor SF may amplify a potential change in the floating diffusion region FD and output the potential change to a column output line (e.g., one of column output lines CLO_0 to CLO_n−1 in FIG. 1) as a pixel signal VOUT.

The selection transistor SX may have a drain terminal connected to a source terminal of the amplification transistor SF, and may output the pixel signal VOUT to the CDS 151 through the column output line in response to the selection signal SELS.

FIG. 2 illustrates an example in which the photocharges generated by each of the first photoelectric conversion device PD1 and the second photoelectric conversion device PD2 are accumulated in the same floating diffusion region FD, but the disclosure is not limited thereto. The photocharges generated by the first photoelectric conversion device PD1 may be accumulated in a first floating diffusion region, and the photocharges generated by the second photoelectric conversion device PD2 may be accumulated in a second floating diffusion region separated from the first floating diffusion region.

Figure 3:
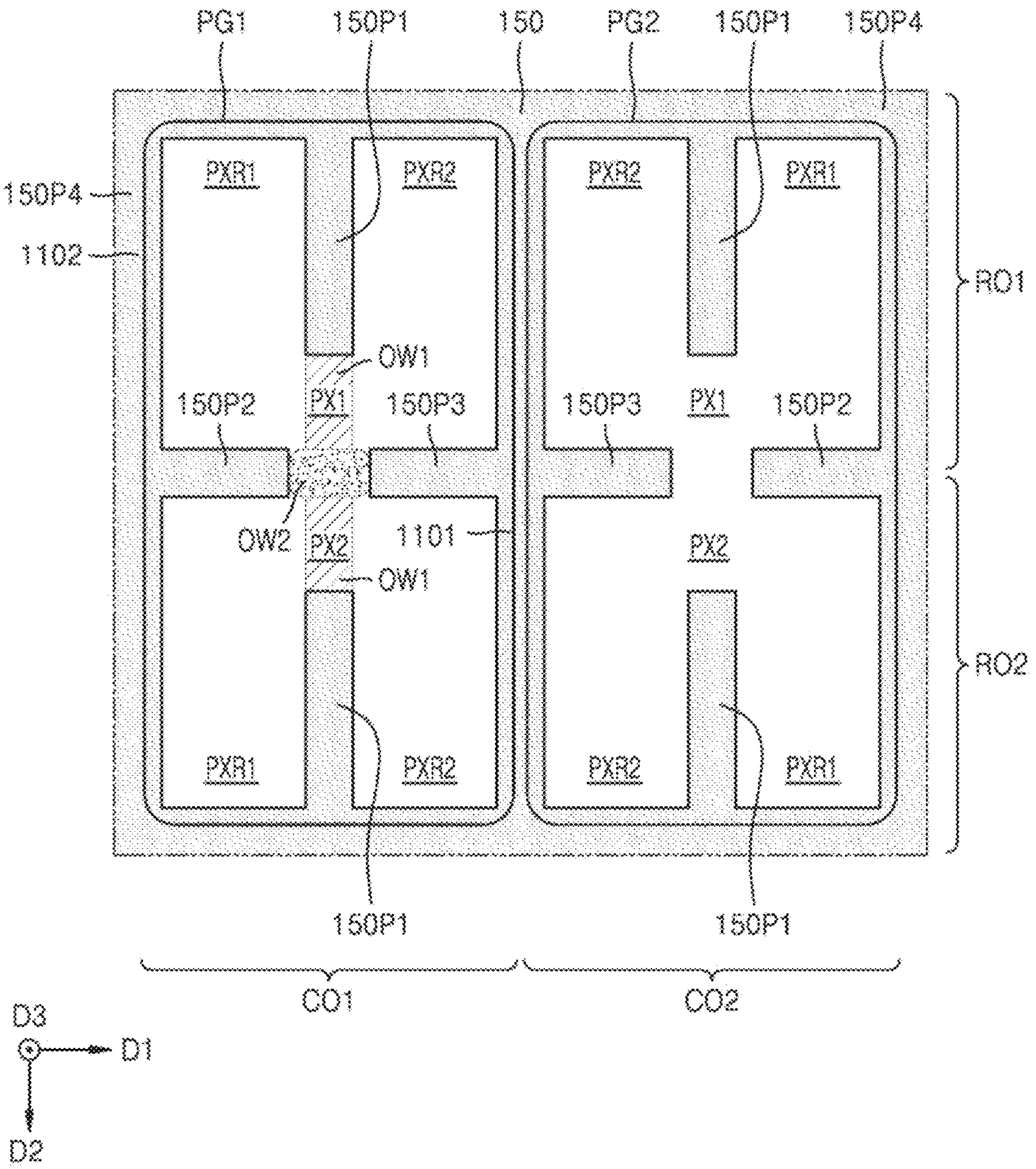
FIG. 3 is a plan view of pixels included in an image sensor according to an embodiment.

FIG. 3 is a plan view of pixels included in an image sensor according to an embodiment. FIG. 3 is a diagram illustrating an example of the pixels included in the pixel array 11 of FIG. 1.

For convenience of description, the four pixels are shown in FIG. 3. For brevity of the drawings and convenience of description, FIG. 3 illustrates only pixel groups PG1 and PG2, pixel regions PXR1 and PXR2, deep device isolation patterns 150, 150P1, 150P2, 150P3, and 150P4, and open regions OW1 and OW2.

The image sensor 1 may include the plurality of pixel groups PG1 and PG2. Each of the plurality of pixel groups PG1 and PG2 may include the plurality of pixel regions PXR1 and PXR2, the deep device isolation pattern 150 (e.g., 150P1, 150P2, 150P3, and 150P4), and the open regions OW1 and OW2.

The deep device isolation pattern 150 may be disposed in a substrate, and the plurality of pixels PX may be defined by the deep device isolation pattern 150. The deep device isolation pattern 150 may be disposed between the pixels PX. The plurality of pixels PX may be physically and electrically separated from each other by the deep device isolation pattern 150.

Referring to FIGS. 2 and 3, the pixels may be disposed in each of a plurality of rows RO1 and RO2. The pixels may be disposed in the first row RO1, and the pixels may be disposed in the second row RO2. The pixels disposed in the first row RO1 and the pixels disposed in the second row RO2 may have a symmetrical arrangement structure with respect to an axis of a first direction D1. The pixels may be disposed in each of a plurality of columns CO1 and CO2. The pixels may be disposed in the first column CO1, and the pixels may be disposed in the second column CO2. The pixels disposed in the first column C01 and the pixels disposed in the second column CO2 may have a symmetrical arrangement structure with respect to an axis of a second direction D2. The first direction D1 and the second direction D2 may intersect with (or be orthogonal to) each other.

The pixel groups PG1 and PG2 each may include two pixels disposed parallel to each other in the second direction D2. For example, the first pixel group PG1 may include the pixel disposed in the first row RO1 and the first column CO1 and the pixel disposed in the second row RO2 and the first column CO1. The second pixel group PG2 may include the pixel disposed in the first row RO1 and the second column CO2 and the pixel disposed in the second row RO2 and the second column CO2.

The pixel groups PG1 and PG2 each may include a first pixel PX1 and a second pixel PX2. The first pixel PX1 may be referred to as the pixel disposed at an upper portion of each of the pixel groups PG1 and PG2 in the second direction D2, and the second pixel PX2 may be referred to as the pixel disposed at a lower portion of each of the pixel groups PG1 and PG2 in the second direction D2. For example, the first pixels PX1 may be in the first row RO1, and the second pixels PX2 may be in the second row RO2.

The deep device isolation pattern 150 may be formed to surround the pixel and separate the pixel from the other pixels. That is, one pixel may be defined by the deep device isolation pattern 150. For example, the deep device isolation pattern 150 may be formed to separate the pixels extending in the first direction D1. For example, the deep device isolation pattern 150 may be formed to separate the pixel disposed in the first row RO1 and the first column CO1 and the pixel disposed in the first row RO1 and the second column CO2, and may be formed to separate the pixel disposed in the second row RO2 and the first column CO1 and the pixel disposed in the second row RO2 and the second column CO2.

The deep device isolation pattern 150 may be formed to separate the pixels extending in the second direction D2. For example, the deep device isolation pattern 150 may be formed to separate the pixel disposed in the first row RO1 and the first column CO1 and the pixel disposed in the second row RO2 and the first column CO1, and may be formed to separate the pixel disposed in the first row RO1 and second column CO2 and the pixel disposed in the second row RO2 and second column CO2.

In an embodiment, each of the plurality of pixels PX may include the first pixel region PXR1 and the second pixel region PXR2. The first pixel region PXR1 may be a region including the first photoelectric conversion device PD1 of the pixel, and the second pixel region PXR2 may be a region including the second photoelectric conversion device PD2 of the pixel. The first pixel region PXR1 and the second pixel region PXR2 may be disposed parallel to each other in the first direction D1. The deep device isolation pattern 150 may surround or at least partially surround the first pixel region PXR1 and the second pixel region PXR2.

In other words, the pixel may include the first photoelectric conversion device PD1 and the second photoelectric conversion device PD2. The first photoelectric conversion device PD1 and the second photoelectric conversion device PD2 may be disposed parallel to each other in the first direction D1.

The deep device isolation pattern 150 may include first to fourth portions 150P1 to 150P4. The deep device isolation pattern 150 may include the first portion 150P1 extending between the first pixel region PXR1 and the second pixel region PXR2. The first portion 150P1 may be disposed between the first pixel region PRX1 and the second pixel region PXR2. The first portion 150P1 may have a bar shape extending in the second direction D2.

The first portion 150P1 may be formed to separate the first pixel region PXR1 and the second pixel region PXR2 within the pixel. The first portion 150P1 may be formed to extend in the second direction D2 within the pixel. The first portion 150P1 may be formed to separate the first photoelectric conversion device PD1 and the second photoelectric conversion device PD2 within the pixel.

The deep device isolation pattern 150 may include the second portion 150P2 extending between the first pixel regions PXR1 in each of the pixel groups PG1 and PG2. The second portion 150P2 may be disposed between the first pixel region PXR1 of the first pixel PX1 and the first pixel region PXR1 of the second pixel PX2. The second portion 150P2 may have a bar shape extending in the first direction D1. The second portion 150P2 may be formed to separate the first pixel PX1 and the second pixel PX2 within each of the pixel groups PG1 and PG2. For example, the second portion 150P2 may be formed between the first pixel region PXR1 of the first pixel PX1 of the first pixel group PG1 and the first pixel region PXR1 of the second pixel PX2 of the first pixel group PG1.

The deep device isolation pattern 150 may include the third portion 150P3 extending between the second pixel regions PXR2 in each of the pixel groups PG1 and PG2. The third portion 150P3 may be disposed between the second pixel region PXR2 of the first pixel PX1 and the second pixel region PXR2 of the second pixel PX2. The third portion 150P3 may have a bar shape extending in the first direction D1. The third portion 150P3 may be formed to separate the first pixel PX1 and the second pixel PX2 within each of the pixel groups PG1 and PG2. For example, the third portion 150P3 may be formed between the second pixel region PXR2 of the first pixel PX1 of the first pixel group PG1 and the second pixel region PXR2 of the second pixel PX2 of the first pixel group PG1.

The fourth portion 150P4 may be a portion of the deep device isolation pattern 150 excluding the first to third portions 150P1 to 150P3. The fourth portion 150P4 may be connected to the first portion 150P1, may be connected to the second portion 150P2, and may be connected to the third portion 150P3. The deep device isolation pattern 150 may be continuously formed in a pixel array. All of the first to fourth portions 150P1 to 150P4 may be physically connected to each other.

The first portion 150P1 of the first pixel PX1 and the first portion 150P1 of the second pixel PX2 may be spaced apart from each other in the first direction D1 within each of the pixel groups PG1 and PG2. The second portion 150P2 and the third portion 150P3 may be spaced apart from each other in the second direction D2 within each of the pixel groups PG1 and PG2.

The first open region OW1 partially exposing an area between the first pixel region PXR1 and the second pixel region PRX2 may be formed in the pixel PX. That is, in the pixel PX, the first pixel region PXR1 and the second pixel region PXR2 may not be completely separated. The first pixel region PXR1 and the second pixel region PXR2 may be partially separated from each other by a cut edge region of the deep device isolation pattern 150 (i.e., the first portion 150P1).

The first open region OW1 may refer to a region in which the deep device isolation pattern 150 is not formed, and a width of the first open region OW1 may be configured in various ways. The first open region OW1 may be disposed at an edge of the pixel PX. That is, the pixel PX may have a DTI edge cut (DEC) structure.

The image sensor 1 according to the disclosure may include the first open region OW1 disposed at the edge of the pixel, and thus, movement of photocharges generated by each of the first pixel region PXR1 and the second pixel region PRX2 through the open region OW1 may be restricted, and AF contrast characteristics may be improved (as compared to designs where an open region is disposed at a center of a pixel).

The second open region OW2 partially exposing an area between the pixels may be formed in each of the pixel groups PG1 and PG2. The second open region OW2 may refer to a region in which the deep device isolation pattern 150 is not formed, and a width of the second open region OW2 may be configured in various ways. The second open region OW2 partially exposing an area between the pixels arranged in the second direction D2 may be formed. The second open region OW2 may be disposed at the center of each of the pixel groups PG1 and PG2. The second open region OW2 may be disposed at the center between the first pixel PX1 and the second pixel PX2.

For example, the second open region OW2 may be formed between the first pixel PX1 and the second pixel PX2. The second open region OW2 may be formed between the second portion 150P2 and the third portion 150P3. The second open region OW2 may be formed between the first open regions OW1. The second open region OW2 may be formed between the first open region OW1 of the first pixel PX1 and the first open region OW1 of the second pixel PX2.

The first open region OW1 may be adjacent to the first portion 150P1 in the second direction D2. The second open region OW2 may be adjacent to the second portion 150P2 in the first direction D1. The second open region OW2 may be adjacent to the third portion 150P3 in the first direction D1. The second open region OW2 may be adjacent to the first open region OW1 in the second direction D2.

The first open region OW1 may connect the first pixel region PXR1 to the second pixel region PXR2. The second open region OW2 may connect two pixels disposed in the second direction D2. The second open region OW2 may connect the first pixel PX1 to the second pixel PX2 in each of the pixel groups PG1 and PG2.

In the four pixels having the 2PD structure of FIG. 3, the first pixel group PG1 has been mainly described, but the description of the first pixel group PG1 may be applied to the second pixel group PG2 in the same way (i.e., the open regions are not specifically shown in the second pixel group PG2 for convenience of description). The first open region OW1 and the second open region OW2 are described a specific region among regions where the deep device isolation pattern 150 is not formed in the substrate.

Figure 4:
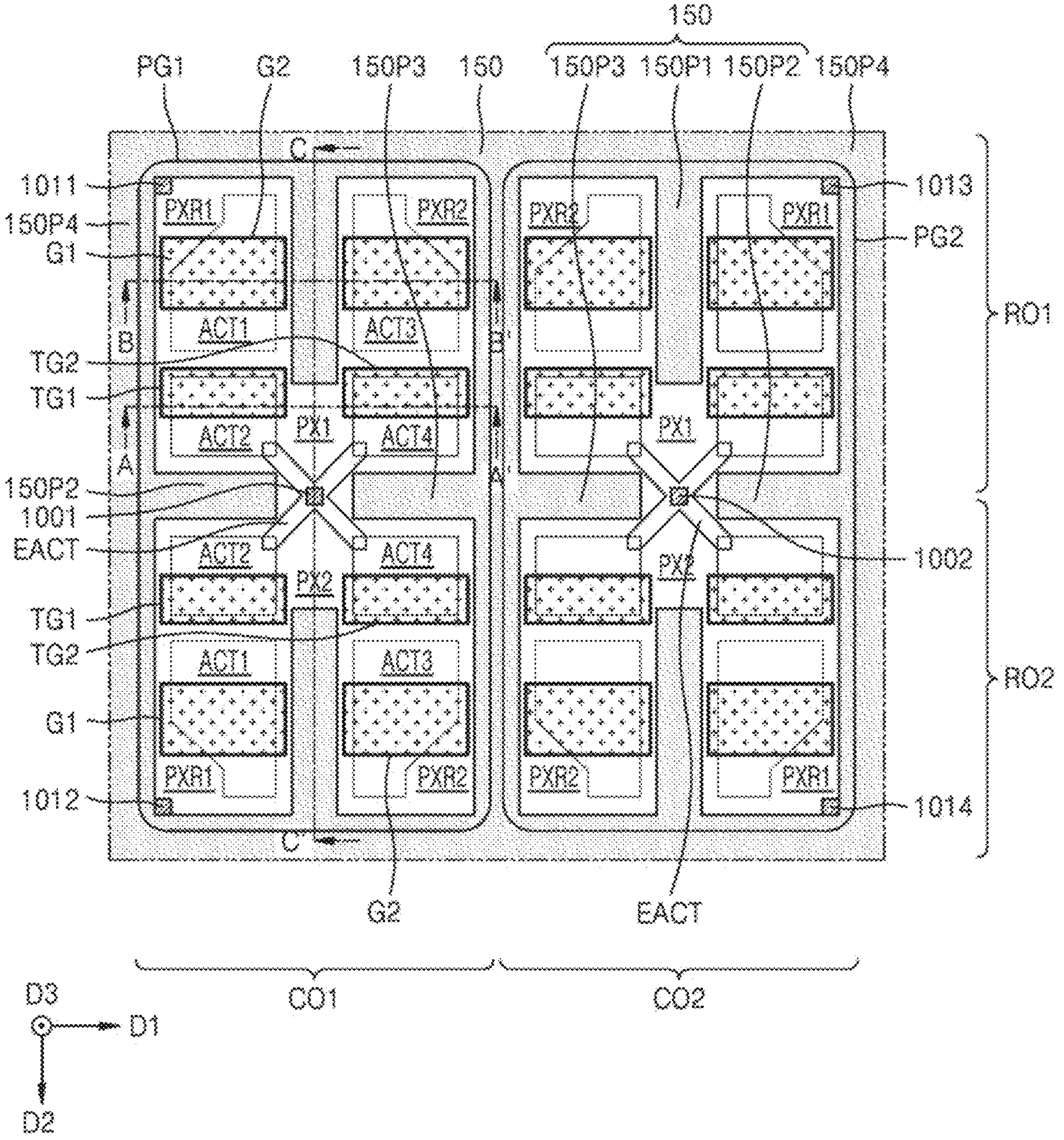
FIG. 4 is a plan view of pixels included in an image sensor according to an embodiment.
Figure 5A:
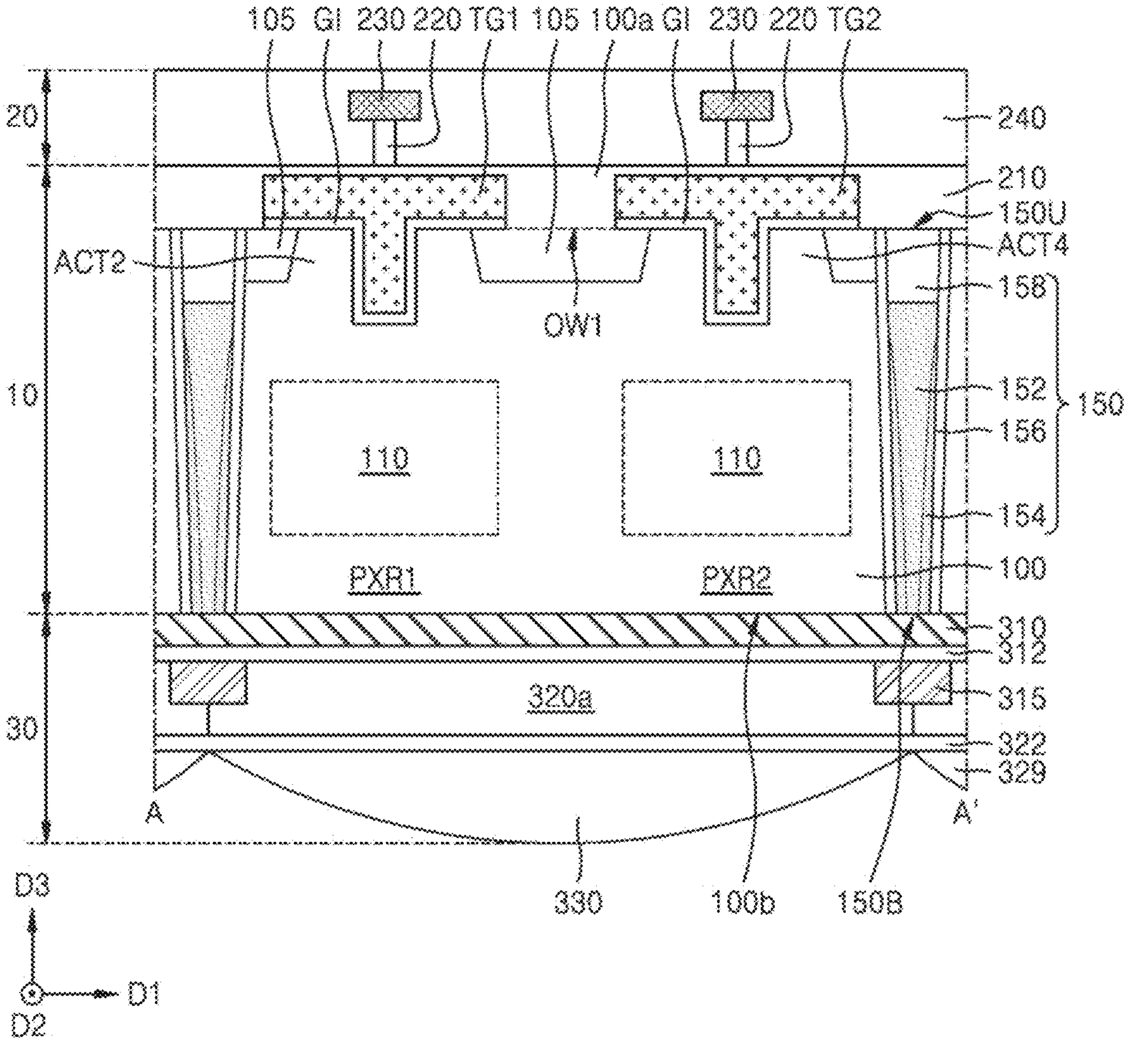
FIG. 5A is a cross-sectional view taken along a line A-A' in FIG. 4 according to an embodiment.
Figure 5B:
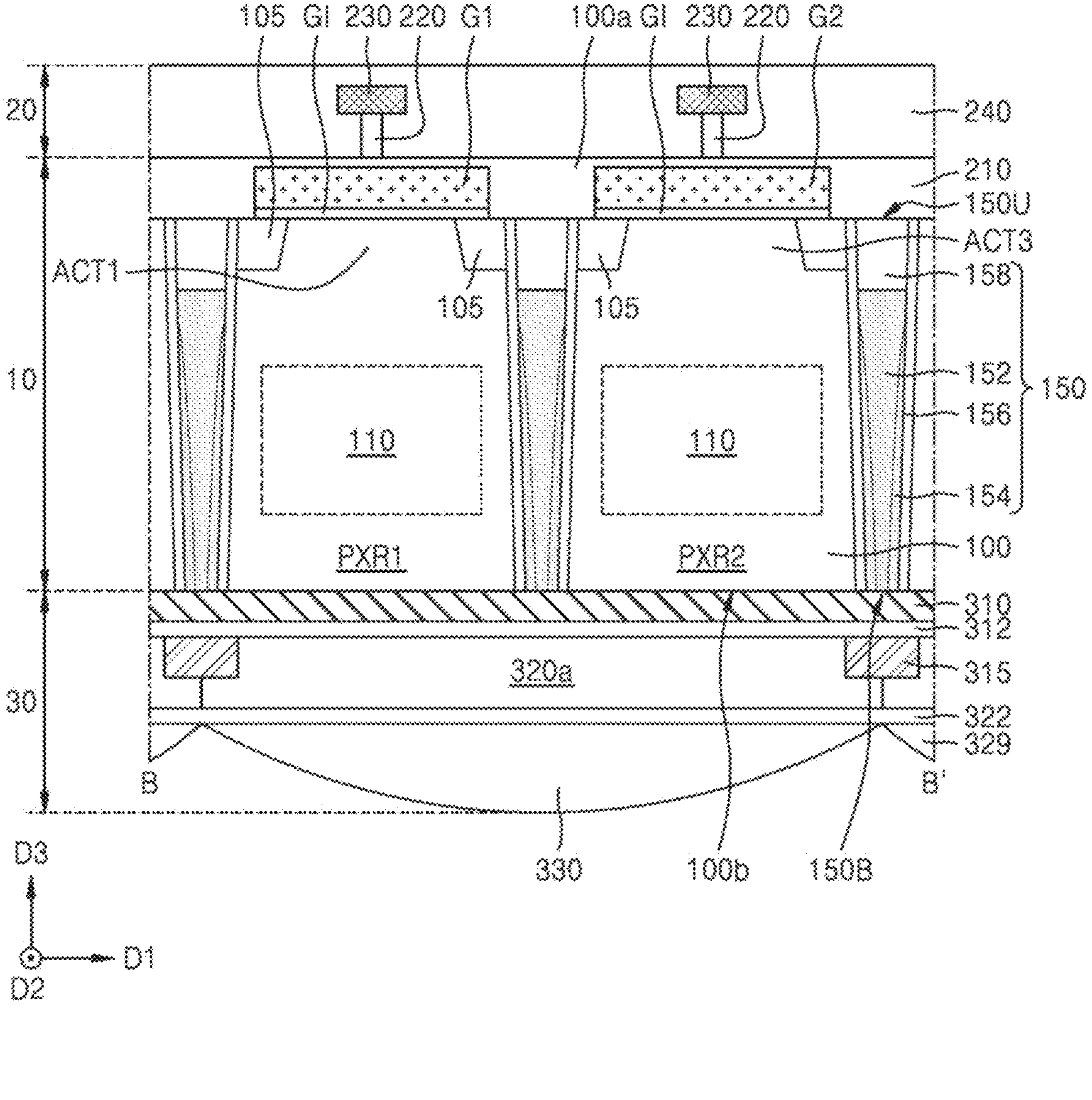
FIG. 5B is a cross-sectional view taken along a line B-B' of FIG. 4 according to an embodiment.
Figure 5C:
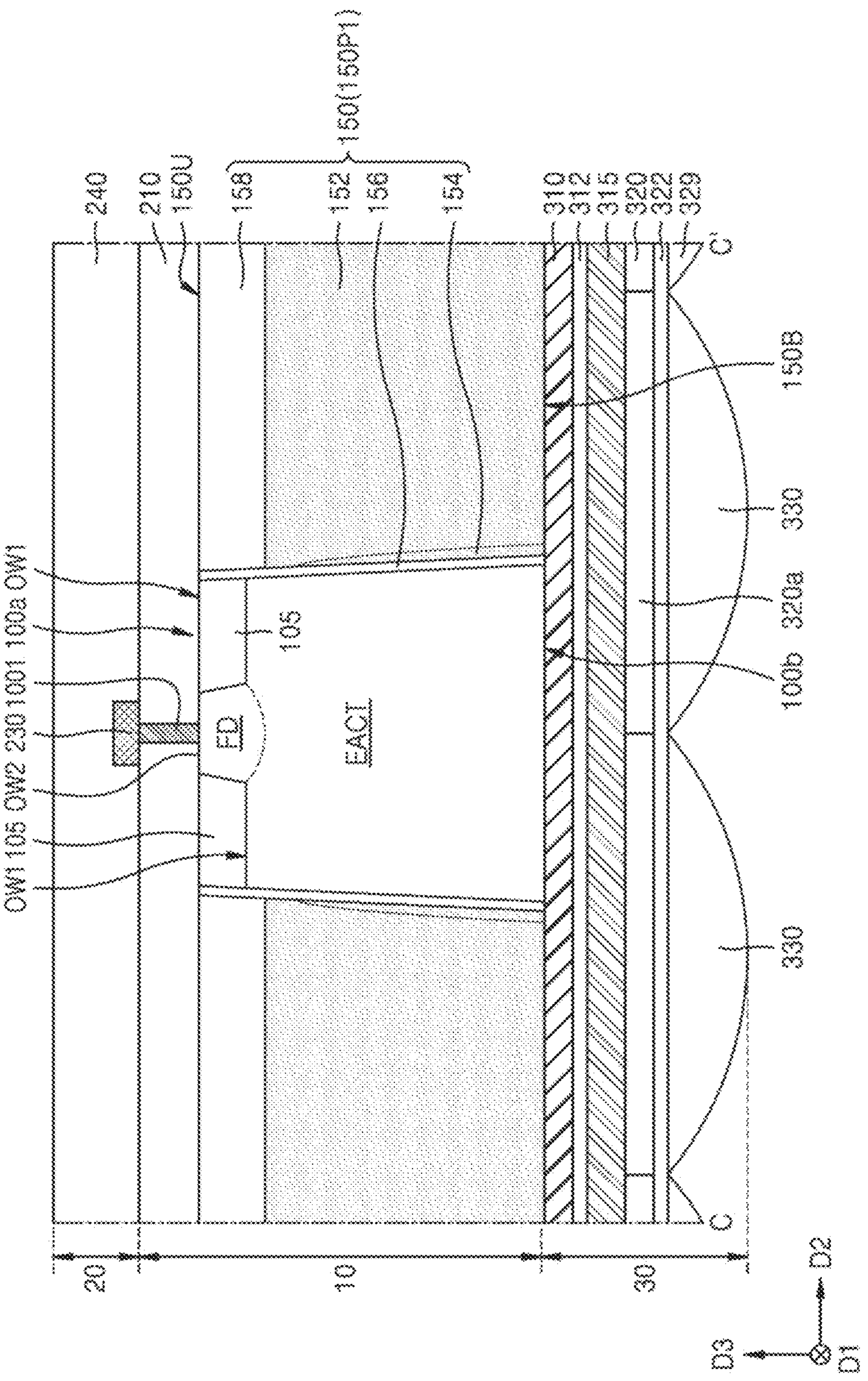
FIG. 5C is a cross-sectional view taken along a line C-C' of FIG. 4 according to an embodiment.

FIG. 4 is a plan view of pixels included in an image sensor according to an embodiment. FIG. 4 is a diagram illustrating an example of the pixels PX included in the pixel array 11 of FIG. 1. FIG. 5A is a cross-sectional view taken along a line A-A' in FIG. 4 according to an embodiment. FIG. 5B is a cross-sectional view taken along a line B-B' of FIG. 4 according to an embodiment. FIG. 5C is a cross-sectional view taken along a line C-C' of FIG. 4 according to an embodiment. Components of FIG. 4 are described with reference to FIG. 3 together.

For convenience of description, four pixels are shown in FIG. 4. The first and second open regions OW1 and OW2 are not shown in FIG. 4 for clarity of illustration.

Referring to FIGS. 3, 4, and 5A to 5C, the image sensor 1 may include a photoelectric conversion layer 10, a wiring layer 20, and a light transmission layer 30. The photoelectric conversion layer 10 may be disposed between the wiring layer 20 and the light transmission layer 30.

The photoelectric conversion layer 10 may include a substrate 100, and the substrate 100 may include the plurality of pixel groups PG1 and PG2. The substrate 100 may include the plurality of pixels PX1 and PX2. The substrate 100 may include the plurality of pixel regions PXR1 and PXR2. The substrate 100 may be a semiconductor substrate (e.g., a silicon substrate, a germanium substrate, a silicon-germanium substrate, an II-VI compound semiconductor substrate, or a III-V compound semiconductor substrate) or a silicon on insulator (SOI) substrate. The substrate 100 may have a first surface 100*a* and a second surface 100*b* facing each other.

The plurality of pixel regions PXR1 and PXR2 may be arranged in the first direction D1 parallel to the first surface 100*a* of the substrate 100. The plurality of pixels PX1 and PX2 may be arranged in the second direction D2 parallel to the first surface 100*a* of the substrate 100. The plurality of pixel groups PG1 and PG2 may be arranged in the first direction D1 parallel to the first surface 100*a* of the substrate 100. A pixel portion including the first pixel group PG1 and the second pixel group PG2 may be arranged two-dimensionally in the first direction D1 and the second direction D2 parallel to the first surface 100*a* of the substrate 100. The first direction D1 and the second direction D2 may intersect with each other.

The photoelectric conversion layer 10 may further include the deep device isolation pattern 150 penetrating the substrate 100 and disposed between the plurality of pixel regions PXR1 and PXR2. The deep device isolation pattern 150 may penetrate the substrate 100 in a third direction D3 perpendicular to the first surface 100*a* of the substrate 100. The deep device isolation pattern 150 may extend from the first surface 100*a* of the substrate 100 toward the second surface 100*b* of the substrate 100. The first surface 100*a* of the substrate 100 may expose an upper surface 150U of the deep device isolation pattern 150, and the second surface 100*b* of the substrate 100 may expose a bottom surface 150B of the deep device isolation pattern 150. The upper surface 150U of the deep device isolation pattern 150 may be substantially coplanar with the first surface 100*a* of the substrate 100, and the bottom surface 150B of the deep device isolation pattern 150 may be substantially coplanar with the second surface 100*b* of the substrate 100. The deep device isolation pattern 150 may prevent cross-talk between the adjacent pixel regions PXR1 and PXR2.

The deep device isolation pattern 150 may include semiconductor patterns 152 and 154 penetrating at least a portion of the substrate 100, a buried insulating pattern 158 on the semiconductor patterns 152 and 154, and a side insulating pattern 156 disposed between the semiconductor patterns 152 and 154 and the substrates 100. The side insulating pattern 156 may extend from side surfaces of the semiconductor patterns 152 and 154 to a side surface of the buried insulating pattern 158. The semiconductor patterns 152 and 154 may include a first semiconductor pattern 152 penetrating at least a portion of the substrate 100 and a second semiconductor pattern 154 between the first semiconductor pattern 152 and the side insulating pattern 156. The first semiconductor pattern 152 may cover or at least partially cover the uppermost surface of the second semiconductor pattern 154 and may contact the side insulating pattern 156. The buried insulating pattern 158 may be disposed on the first semiconductor pattern 152. The first semiconductor pattern 152 may extend between the buried insulating pattern 158 and the second semiconductor pattern 154 and may contact the side insulating pattern 156.

Each of the first semiconductor pattern 152 and the second semiconductor pattern 154 may include a semiconductor material doped with impurities. The impurity may have a P-type or N-type conductivity. For example, each of the first semiconductor pattern 152 and the second semiconductor pattern 154 may include boron-doped polycrystalline silicon. Each of the side insulating pattern 156 and the buried insulating pattern 158 may include, for example, silicon oxide, silicon nitride, and/or silicon oxynitride.

The first pixel region PXR1 and the second pixel region PXR2 may be adjacent to each other in the first direction D1. The first pixel PX1 and the second pixel PX2 may be adjacent to each other in the second direction D2. The first pixel group PG1 and the second pixel group PG2 may be adjacent to each other in the first direction D1.

The deep device isolation pattern 150 may surround or at least partially surround each of the pixel groups PG1 and PG2 in a plan view. The deep device isolation pattern 150 may surround or at least partially surround each of the pixels PX1 and PX2 in a plan view. The deep device isolation pattern 150 may surround or at least partially surround each of the pixel regions PXR1 and PXR2 in a plan view.

The deep device isolation pattern 150 may include the first to fourth portions 150P1 to 150P4. The first portion 150P1 may be formed to extend between the first pixel region PXR1 and the second pixel region PXR2. The second portion 150P2 may extend between the first pixel region PXR1 of the first pixel PX1 and the first pixel region PXR1 of the second pixel PX2. The third portion 150P3 may extend between the second pixel region PXR2 of the first pixel PX1 and the second pixel region PXR2 of the second pixel PX2. The fourth portion 150P4 may refer to a portion of the deep device isolation pattern 150 excluding the first to third portions 150P1 to 150P3. The fourth portion 150P4 may be connected to the first portion 150P1, may be connected to the second portion 150P2, and may be connected to the third portion 150P3. The deep device isolation pattern 150 may be continuously formed in the pixel array. All of the first to fourth portions 150P1 to 150P4 may be electrically/physically connected to each other.

The first pixel region PXR1 and the second pixel region PXR2 may be partially separated from each other by the first portion 150P1 of the deep device isolation pattern 150. The first pixel PX1 and the second pixel PX2 may be partially separated from each other by the second portion 150P2 and the third portion 150P3 of the deep device isolation pattern 150. For example, the first pixel region PXR1 of the first pixel PX1 and the first pixel region PXR1 of the second pixel PX2 may be partially separated from each other by the second portion 150P2 of the deep device isolation pattern 150. The second pixel region PXR2 of the first pixel PX1 and the second pixel region PRX2 of the second pixel PX2 may be partially separated from each other by the third portion 150P3 of the deep device isolation pattern 150.

The first portion 150P1 of the first pixel PX1 and the first portion 150P1 of the second pixel PX2 may be spaced apart from each other in the second direction D2 within the pixel group. The second portion 150P2 and the third portion 150P3 may be spaced apart from each other in the first direction D1 within the pixel group. Accordingly, portions of the substrate 100 of the pixel group may be connected to each other. For example, portions of the substrate 100 of the first and second pixel regions PXR1 and PXR2 of the first pixel PX1 of the first pixel group PG1 and the first and second pixel regions PXR1 and PXR2 of the second pixel PX2 of the first pixel group PG1 may be connected to each other.

At least a portion of the first portion 150P1 may be disposed between a first active pattern ACT1 and a third active pattern ACT3 within the pixel PX. For example, a portion of the first portion 150P1 may be disposed between the first active pattern ACT1 of the first pixel PX1 and the third active pattern ACT3 of the first pixel PX1. The second portion 150P2 may be disposed between a second active pattern ACT2 of the first pixel PX1 and the second active pattern ACT2 of the second pixel PX2 within the pixel group. The third portion 150P3 may be disposed between a fourth active pattern ACT4 of the first pixel PX1 and the fourth active pattern ACT4 of the second pixel PX2 within the pixel group.

Portions of the substrate 100 in the first pixel region PXR1 and the second pixel region PXR2 may be connected to each other due to the first open region OW1. Portions of the substrate 100 in the first pixel PX1 and the second pixel PX2 may be connected to each other due to the second open region OW2.

Each of the plurality of pixel regions PXR1 and PXR2 may include the photoelectric conversion region 110. The substrate 100 may have a first conductivity type, and the photoelectric conversion region 110 may be a region doped with impurities of a second conductivity type different from the first conductivity type. For example, the first conductivity type and the second conductivity type may be a P type and an N type, respectively. In this case, the impurities of the second conductivity type may include N-type impurities such as phosphorus, arsenic, bismuth, and/or antimony. The photoelectric conversion region 110 may form a photodiode by forming a PN junction with the substrate 100. According to some embodiments, the semiconductor patterns 152 and 154 of the deep device isolation pattern 150 may include a semiconductor material doped with impurities of the first conductivity type (e.g., P-type impurities).

A shallow device isolation pattern 105 (or a second device isolation pattern) may be disposed adjacent to the first surface 100*a* of the substrate 100. Each of the plurality of pixel regions PXR1 and PXR2 may include active patterns ACT (e.g., first to fourth active patterns ACT1 to ACT4 and an extended active pattern EACT) defined by the shallow device isolation pattern 105. For example, the active pattern ACT may include the first to fourth active patterns ACT1 to ACT4 and the extended active pattern EACT. The shallow device isolation pattern 105 may include, for example, at least one of a silicon oxide layer, a silicon nitride layer, or a silicon oxynitride layer.

Each of the first and second pixel regions PXR1 and PXR2 may include an active pattern defined by the shallow device isolation pattern 105. For example, the first pixel region PXR1 may include the first and second active patterns ACT1 and ACT2. The second pixel region PXR2 may include the third and fourth active patterns ACT3 and ACT4.

The deep device isolation pattern 150 may penetrate the shallow device isolation pattern 105 and extend into the substrate 100. The buried insulating pattern 158 of the deep device isolation pattern 150 may be disposed within the shallow device isolation pattern 105. The buried insulating pattern 158 may penetrate the shallow device isolation pattern 105 and contact the semiconductor patterns 152 and 154. The side insulating pattern 156 of the deep device isolation pattern 150 may extend between the shallow device isolation pattern 105 and the buried insulating pattern 158.

First and second transfer gate electrodes TG1 and TG2 may be disposed on the first surface 100*a* of the substrate 100 and each of the plurality of pixel regions PXR1 and PXR2. For example, the first transfer gate electrode TG1 may be disposed on the second active pattern ACT2. The second transfer gate electrode TG2 may be disposed on the fourth active pattern ACT4.

The first transfer gate electrode TG1 may constitute the first transfer transistor TX1 of FIG. 2. The second transfer gate electrode TG2 may constitute the second transfer transistor TX2 of FIG. 2. A lower portion of the first transfer gate electrode TG1 may penetrate the second active pattern ACT2 and extend into the substrate 100. An upper portion of each of the first transfer gate electrodes TG1 may protrude above an upper surface of the second active pattern ACT2 (i.e., the first surface 100*a* of the substrate 100). A lower portion of each of the second transfer gate electrodes TG2 may penetrate the fourth active pattern ACT4 and extend into the substrate 100. An upper portion of the second transfer gate electrode TG2 may protrude above an upper surface of the fourth active pattern ACT4 (i.e., the first surface 100*a* of the substrate 100).

A plurality of gate electrodes G1 and G2 may be disposed on the first surface 100*a* of the substrate 100 and on each of the plurality of pixel regions PXR1 and PXR2. For example, the first gate electrode G1 may be disposed on the first active pattern ACT1. The second gate electrode G2 may be disposed on the third active pattern ACT3.

The first gate electrode G1 and the second gate electrode G2 may configure the amplification transistor SF, the selection transistor SX, and the reset transistor RX of FIG. 2. For example, at least one of the first gate electrode G1 or the second gate electrode G2 may be the amplification gate electrode of the amplification transistor SF of FIG. 2, and at least another one of the first gate electrode G1 or the second gate electrode G2 may be a selection gate electrode of the selection transistor SX of FIG. 2. At least another one of the first gate electrode G1 or the second gate electrode G2 may be a reset gate electrode of the reset transistor RX of FIG. 2.

A gate dielectric layer GI may be disposed between the first transfer gate electrode TG1 and the substrate 100 (i.e., the second active pattern ACT2). The gate dielectric layer G1 may be disposed between the second transfer gate electrode TG2 and the substrate 100 (i.e., the fourth active pattern ACT4). The gate dielectric layer G1 may be disposed between the first gate electrode G1 and the substrate 100 (i.e., the first active pattern ACT1). The gate dielectric layer G1 may be disposed between the second gate electrode G2 and the substrate 100 (i.e., the third active pattern ACT3).

The extended active pattern EACT may be connected to the second and fourth active patterns ACT2 and ACT4. The extended active pattern EACT may be connected to the second active pattern ACT2 of the first pixel PX1. The extended active pattern EACT may be connected to the fourth active pattern ACT4 of the first pixel PX1. The extended active pattern EACT may be connected to the second active pattern ACT2 of the second pixel PX2. The extended active pattern EACT may be connected to the fourth active pattern ACT4 of the second pixel PX2.

The floating diffusion region FD may be disposed on the extended active pattern EACT. The floating diffusion region FD may be a region doped with impurities of a second conductivity type different from the first conductivity type of the substrate 100 (e.g., N-type impurities).

The wiring layer 20 may be disposed on the first surface 100*a* of the substrate 100. The wiring layer 20 may include a first insulating interlayer 210 and a second insulating interlayer 240 sequentially stacked on the first surface 100*a* of the substrate 100. The first interlayer insulating layer 210 may be disposed on the first surface 100*a* of the substrate 100 to cover or at least partially cover the first and second transfer gate electrodes TG1 and TG2, and the first and second gate electrodes G1 and G2. The wiring layer 20 may further include the first and second transfer gate electrodes TG1 and TG2, the first and second gate electrodes G1 and G2, contact plugs 220, 1001, 1002 connected to the floating diffusion region FD, and conductive lines 230 connected to the contact plugs 220, 1001, 1002. The contact plugs 220, 1001, 1002 may penetrate the first interlayer insulating layer 210 and be connected to the first and second transfer gate electrodes TG1 and TG2, and the first and second gate electrodes G1 and G2, and the floating diffusion region FD. The conductive lines 230 may be disposed in the second interlayer insulating layer 240. At least some of the contact plugs 220, 1001, 1002 may extend into the second interlayer insulating layer 240 and be connected to the conductive lines 230. The first interlayer insulating layer 210 and the second interlayer insulating layer 240 each may include an insulating material, and the contact plugs 220, 1001, 1002 and the conductive lines 230 each may include a conductive material.

The light transmission layer 30 may be disposed on the second surface 100*b* of the substrate 100. The light transmission layer 30 may include a color filter array 320 and a microlens array 329 disposed on the second surface 100*b* of the substrate 100. The color filter array 320 may be disposed between the second surface 100*b* of the substrate 100 and the microlens array 329. The light transmission layer 30 may condense and filter light incident from the outside and provide the light to the photoelectric conversion layer 10.

100*b* of the substrate 100 and the color filter array. The anti-reflection layer 310 may prevent light from being reflected such that light incident on the second surface 100*b* of the substrate 100 may smoothly reach the photoelectric conversion region 110. A first insulating layer 312 may be disposed between the anti-reflection layer 310 and the color filter array 320, and a second insulating layer 322 may be disposed between the color filter array 320 and the microlens array. A grid 315 may be disposed between the first insulating layer 312 and the color filter array. The grid 315 may be disposed to vertically overlap the deep device isolation pattern 150. The grid 315 may guide light incident on the second surface 100*b* of the substrate 100 to be incident into the photoelectric conversion region 110. The grid 315 may include, for example, metal. The color filter array 320 may extend between adjacent grids 315 and contact the first insulating layer 312.

The floating diffusion region FD may be disposed on the extended active pattern EACT. The floating diffusion region FD may be formed in the second open region OW2. The contact plug of the floating diffusion region FD may be formed in the second open region OW2. For example, the first floating diffusion contact plug 1001 may be disposed in the second open region OW2 of the first pixel group PG1. The second floating diffusion contact plug 1002 may be disposed in the second open region OW2 of the second pixel group PG2. The first pixel PX1 and the second pixel PX2 may share the floating diffusion region FD. That is, pixels in a pixel group may share a floating diffusion contact plug with each other. A ground contact plug may be disposed at an edge of the first pixel region PXR1. This is described in detail with reference to FIG. 6.

Figure 6:
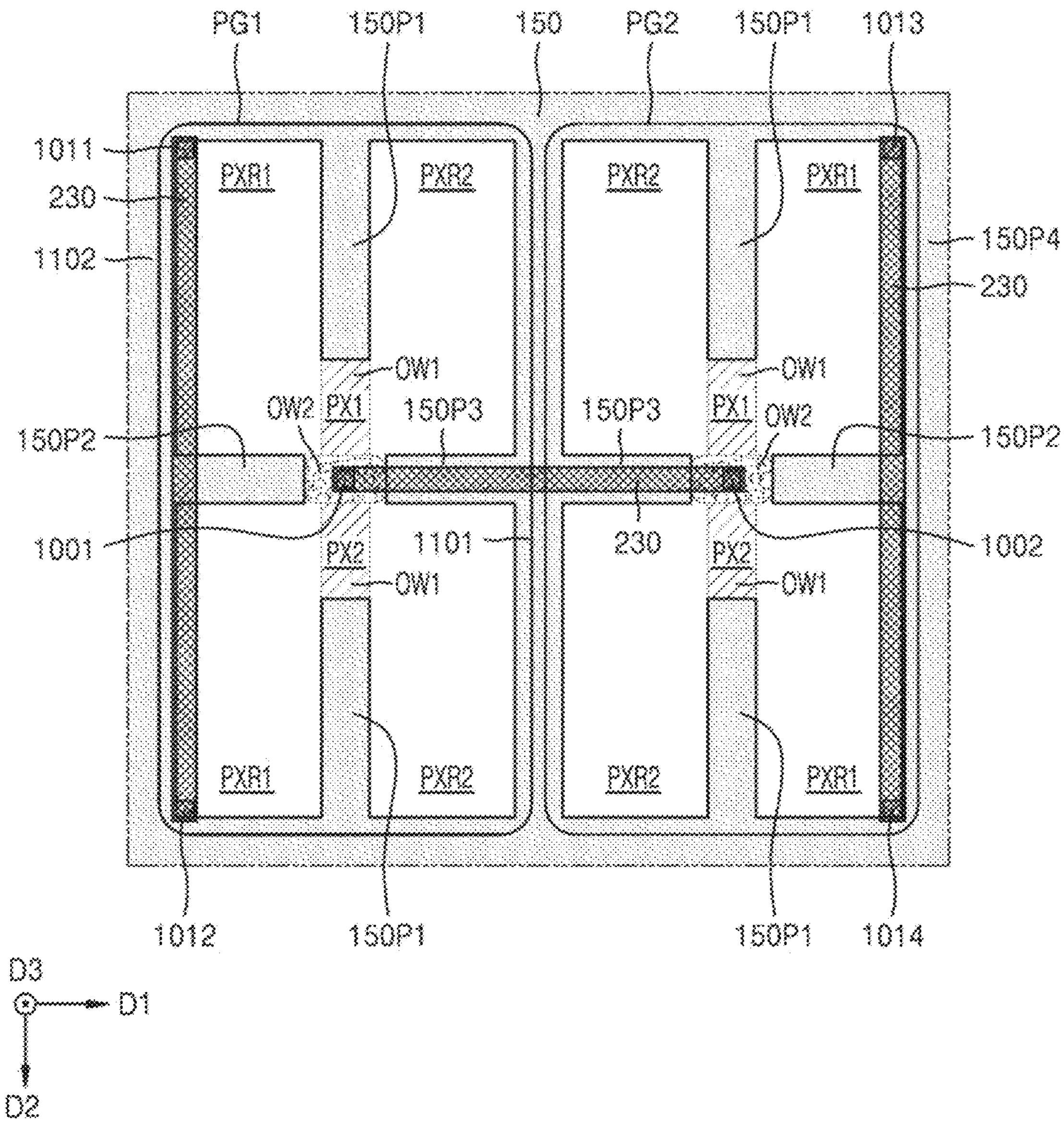
FIG. 6 is a plan view of pixels included in an image sensor according to an embodiment.

FIG. 6 is a plan view of pixels included in an image sensor according to an embodiment. FIG. 6 is a diagram illustrating an example of the pixels PX included in the pixel array 11 of FIG. 1.

For convenience of description, the four pixels are shown in FIG. 6. For brevity of the drawings and convenience of description, FIG. 6 illustrates only some of the components described in FIGS. 3 and 4.

Referring to FIGS. 1, 3, 4, and 6, the image sensor 1 may include the first and second pixel groups PG1 and PG2. Each of the first and second pixel groups PG1 and PG2 may include the first and second pixel regions PXR1 and PXR2, the deep device isolation patterns 150, 150P1, 150P2, 150P3, and 150P4, the first and second open regions OW1 and OW2, a floating diffusion contact plug, ground contact plugs, and conductive lines. For convenience of description, repeated descriptions of the components described above may be omitted.

The first pixel group PG1 may include the first floating diffusion contact plug 1001. The first floating diffusion contact plug 1001 may be formed on the second open region OW2. The first floating diffusion contact plug 1001 may be formed on the extended active pattern EACT. The first floating diffusion contact plug 1001 may be disposed between the first portion 150P1 of the first pixel PX1, the first portion 150P1, the second portion 150P2, and the third portion 150P3 of the second pixel PX2. The first floating diffusion contact plug 1001 may be connected to the conductive line 230.

The second pixel group PG2 may include the second floating diffusion contact plug 1002. The second floating diffusion contact plug 1002 may be formed on the second open region OW2. The second floating diffusion contact plug 1002 may be formed on the extended active pattern EACT. The second floating diffusion contact plug 1002 may be disposed between the first portion 150P1 of the first pixel PX1, the first portion 150P1, the second portion 150P2, and the third portion 150P3 of the second pixel PX2. The second floating diffusion contact plug 1002 may be connected to the conductive line 230.

The first floating diffusion contact plug 1001 and the second floating diffusion contact plug 1002 may be spaced apart from each other in the first direction D1. The first floating diffusion contact plug 1001 and the second floating diffusion contact plug 1002 may extend in the first direction D1. The first floating diffusion contact plug 1001 and the second floating diffusion contact plug 1002 may be connected to each other through the conductive line 230.

The first pixel region PXR1 may include a ground contact plug. The ground contact plug may provide a ground voltage. The ground contact plug may be formed at an edge of the first pixel region PXR1. The ground contact plug may be formed to contact the fourth portion 150P4 of the deep device isolation pattern 150.

For example, a first ground contact plug 1011 may be formed in the first pixel region PXR1 of the first pixel PX1 of the first pixel group PG1. The first ground contact plug 1011 may be connected to the conductive line 230. A second ground contact plug 1012 may be formed in the first pixel region PXR1 of the second pixel PX2 of the first pixel group PG1. The second ground contact plug 1012 may be connected to the conductive line 230. A third ground contact plugs 1013 may be formed in the first pixel region PXR1 of the first pixel PX1 of the second pixel group PG2. The third ground contact plug 1013 may be connected to the conductive line 230. A fourth ground contact plug 1014 may be formed in the first pixel region PXR1 of the second pixel PX2 of the second pixel group PG2. The fourth ground contact plugs 1014 may be connected to the conductive line 230.

The first ground contact plug 1011 and the second ground contact plug 1012 may be spaced apart from each other in the second direction D2. The first ground contact plug 1011 and the third ground contact plug 1013 may be spaced apart from each other in the first direction D1. The fourth ground contact plug 1014 and the second ground contact plug 1012 may be spaced apart from each other in the first direction D1. The fourth ground contact plug 1014 and the third ground contact plug 1013 may be spaced apart from each other in the second direction D2.

The conductive lines 230 connected to the first ground contact plug 1011 and the second ground contact plug 1012 may extend in the second direction D2. The first ground contact plug 1011 and the second ground contact plug 1012 may be connected to each other through the conductive line 230. The conductive lines 230 connected to the third ground contact plug 1013 and the fourth ground contact plug 1014 may extend in the second direction D2. The third ground contact plug 1013 and the fourth ground contact plug 1014 may be connected to each other through the conductive line 230.

Figure 7:
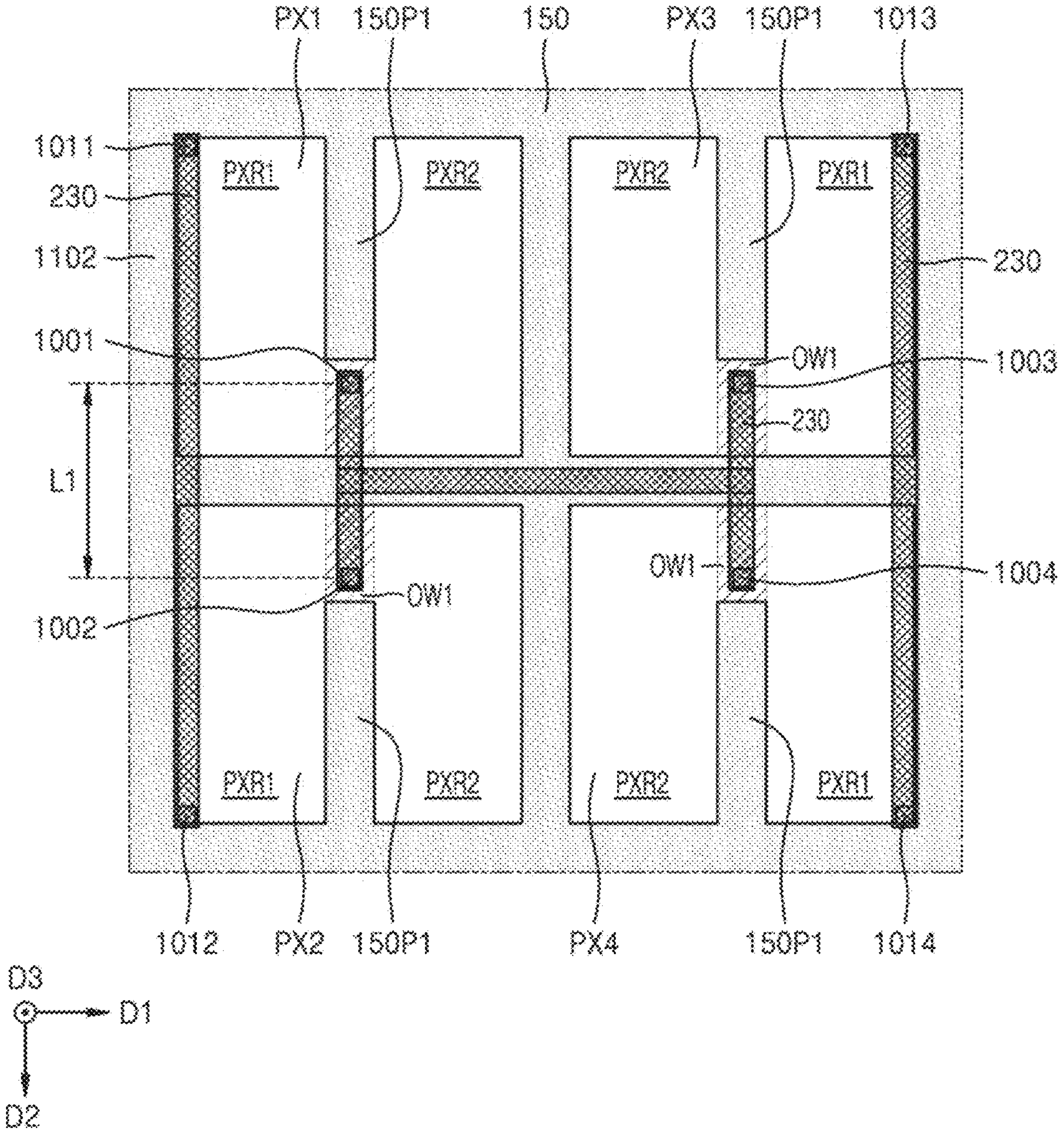
FIG. 7 is a plan view of pixels included in an image sensor according to an embodiment.

FIG. 7 is a plan view of pixels included in an image sensor according to an embodiment.

For convenience of description, four pixels are shown in FIG. 7. For brevity of the drawings and convenience of description, FIG. 7 illustrates only the first to fourth pixels PX1 to PX4, the first and second pixel regions PXR1 and PXR2, the deep device isolation pattern 150, the first and second portions 150P1 and 150P4, the first to fourth floating diffusion contact plugs 1001 to 1004, the first open region OW1, the first to fourth ground contact plugs 1011 to 1014, and the conductive lines 230.

The image sensor may include the plurality of pixels PX1 to PX4. Each of the plurality of pixels PX1 to PX4 may include the first and second pixel regions PXR1 and PXR2, the deep device isolation patterns 150, 150P1, and 150P4, a floating diffusion contact plug, a ground contact plug, and a conductive line. For example, the first pixel PX1 may include the first and second pixel regions PXR1 and PXR2, the deep device isolation patterns 150, 150P1, and 150P4, the first open region OW1, the first floating diffusion contact plug 1001, the first ground contact plug 1011, and the conductive line 230. The remaining pixels PX2 to PX4 are similar to the first pixel PX1, and thus, detailed descriptions thereof are omitted.

The deep device isolation pattern 150 may include the first portion 150P1 and the fourth portion 150P4. The first portion 150P1 may be formed to separate the first pixel region PXR1 and the second pixel region PXR2 within the pixel. The first portion 150P1 may be formed to extend in the second direction D2 within the pixel. The fourth portion 150P4 may refer to a portion of the deep device isolation pattern 150 excluding the first portion 150P1. The fourth portion 150P4 may be connected to the first portion 150P1.

The first open region OW1 partially exposing an area between the first pixel region PXR1 and the second pixel region PRX2 may be formed in the pixel. However, in FIG. 7, the second open region OW2 may not be formed. Accordingly, the first pixel PX1 and the second pixel PX2 may be separated from each other by the deep device isolation pattern 150. The first pixel PX1 and the second pixel PX2 may not have a region partially exposed by an open region.

A floating diffusion contact plug may be formed on the first open region OW1. For example, the first floating diffusion contact plug 1001 may be disposed in the first open region OW1 of the first pixel PX1. The first floating diffusion contact plug 1001 may be connected to the conductive line 230. The second floating diffusion contact plug 1002 may be disposed in the first open region OW1 of the second pixel PX2. The second floating diffusion contact plug 1002 may be connected to the conductive line 230. The third floating diffusion contact plug 1003 may be disposed in the first open region OW1 of the third pixel PX3. The third floating diffusion contact plug 1003 may be connected to the conductive line 230. The fourth floating diffusion contact plug 1004 may be disposed in the first open region OW1 of the fourth pixel PX4. The fourth floating diffusion contact plug 1004 may be connected to the conductive line 230.

The first floating diffusion contact plug 1001 and the second floating diffusion contact plug 1002 may be spaced apart from each other in the second direction D2. The first floating diffusion contact plug 1001 and the third floating diffusion contact plug 1003 may be spaced apart from each other along the first direction D1. The fourth floating diffusion contact plug 1004 and the second floating diffusion contact plug 1002 may be spaced apart from each other in the first direction D1. The fourth floating diffusion contact plug 1004 and the third floating diffusion contact plug 1003 may be spaced apart from each other in the second direction D2.

The conductive line 230 (e.g., a first conductive line) connected to the first floating diffusion contact plug 1001 and the second floating diffusion contact plug 1002 may extend in the second direction D2. The first floating diffusion contact plug 1001 and the second floating diffusion contact plug 1002 may be connected to each other through the conductive line 230 (e.g., the first conductive line).

The conductive line 230 (e.g., a second conductive line) connected to the third floating diffusion contact plug 1003 and the fourth floating diffusion contact plug 1004 may extend in the second direction D2. The third floating diffusion contact plug 1003 and the fourth floating diffusion contact plug 1004 may be connected to each other through the conductive line 230 (e.g., the second conductive line).

The first conductive line and the second conductive line may be connected to each other through the conductive line 230 (e.g., the third conductive line). The third conductive line may extend in the first direction D1. A length of the first conductive line may be a first length L1, and a length of the second conductive line may be the first length L1.

The first pixel PX1 may include a ground contact plug. The ground contact plug may provide a ground voltage. The ground contact plug may be formed at an edge of the first pixel region PXR1 of the first pixel PX1. The first ground contact plug 1011 may be formed to contact the fourth portion 150P4 of the deep device isolation pattern 150.

For example, the first ground contact plug 1011 may be formed in the first pixel region PXR1 of the first pixel PX1. The first ground contact plug 1011 may be connected to the conductive line 230. The second ground contact plug 1012 may be formed in the first pixel region PXR1 of the second pixel PX2. The second ground contact plug 1012 may be connected to the conductive line 230. The third ground contact plug 1013 may be formed in the first pixel region PXR1 of the third pixel PX3. The third ground contact plug 1013 may be connected to the conductive line 230. The fourth ground contact plug 1014 may be formed in the first pixel region PXR1 of the fourth pixel PX4. The fourth ground contact plug 1014 may be connected to the conductive line 230.

The first ground contact plug 1011 and the second ground contact plug 1012 may be spaced apart from each other in the second direction D2. The first ground contact plug 1011 and the third ground contact plug 1013 may be spaced apart from each other in the first direction D1. The fourth ground contact plug 1014 and the second ground contact plug 1012 may be spaced apart from each other in the first direction D1. The fourth ground contact plug 1014 and the third ground contact plug 1013 may be spaced apart from each other in the second direction D2.

A conductive line connected to the first ground contact plug 1011 and the second ground contact plug 1012 may extend in the second direction D2. The first ground contact plug 1011 and the second ground contact plug 1012 may be connected to each other through the conductive line 230. A conductive line connected to the third ground contact plug 1013 and the fourth ground contact plug 1014 may extend in the second direction D2. The third ground contact plug 1013 and the fourth ground contact plug 1014 may be connected to each other through the conductive line 230.

As shown in FIG. 6, the floating diffusion region FD may be formed on the second open region OW2. The first and second pixels PX1 and PX2 may share the floating diffusion region FD. The first and second pixels PX1 and PX2 may share a floating diffusion contact plug. Accordingly, the first pixel group PG1 may include one floating diffusion contact plug 1001. On the other hand, as shown in FIG. 7, the first and second pixels PX1 and PX2 may not share the floating diffusion region FD. A floating diffusion region of the first pixel PX1 may be formed in the first open region OW1 of the first pixel PX1, and a floating diffusion region of the second pixel PX2 may be formed in the second open region OW2 of the second pixel PX2. Accordingly, the image sensor of FIG. 7 may further include first and second conductive lines. The image sensor of FIG. 7 requires more floating diffusion contact plugs than the image sensor of FIG. 6, and accordingly, an active pattern space in which a floating diffusion contact plug is to be disposed needs to be secured.

As described above, the image sensor according to the embodiment may share the floating diffusion contact plug through the second open region OW2. That is, the number of conductive lines (or wirings) of a wiring layer may be reduced. The number of conductive lines is reduced, and thus, a degree of freedom of conductive line routing may increase, and routing may be performed efficiently. Also, a conversion gain may be improved.

Figure 8:
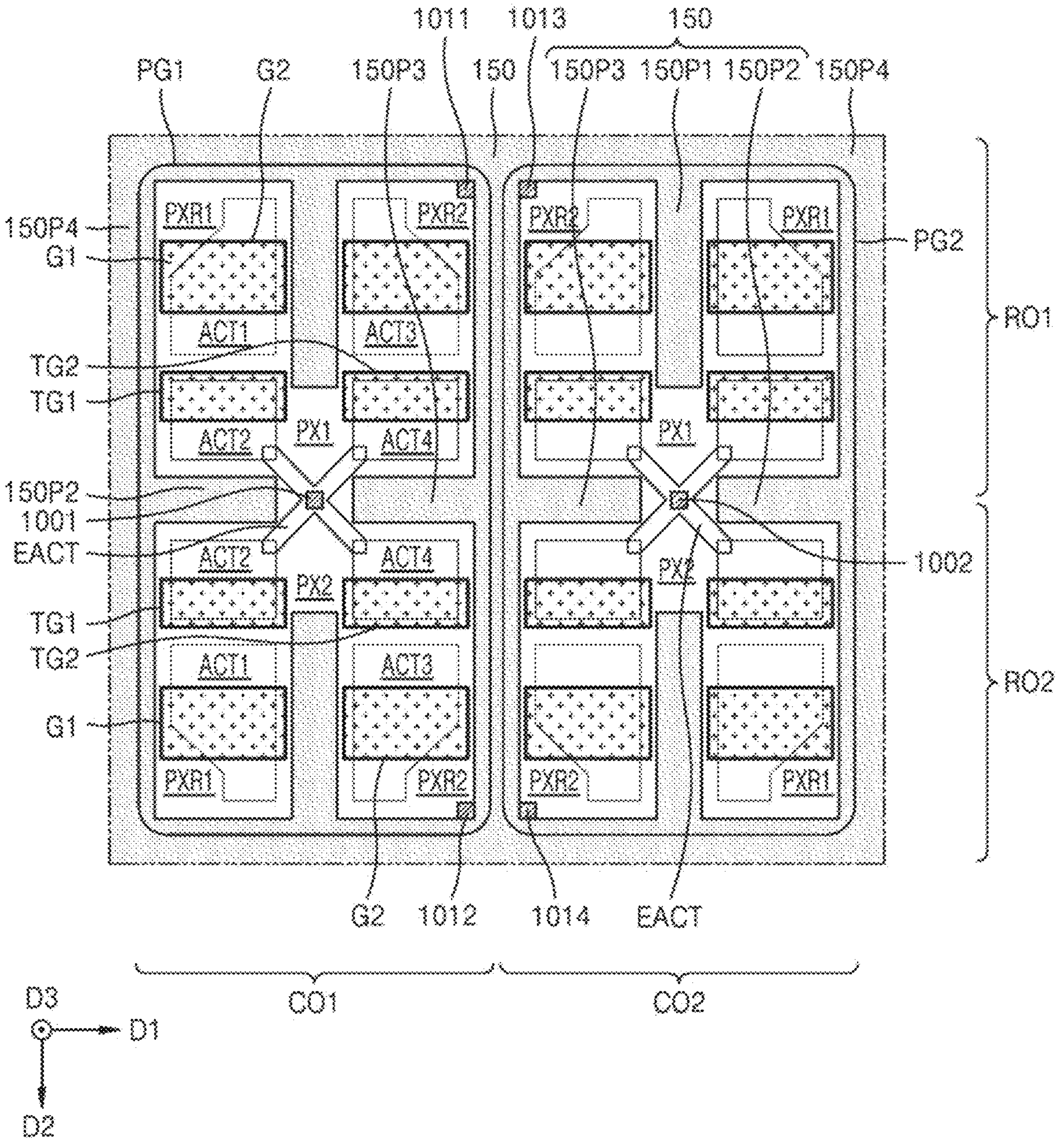
FIG. 8 is a plan view of pixels included in an image sensor according to an embodiment.

FIG. 8 is a plan view of pixels included in an image sensor according to an embodiment. FIG. 8 is a diagram illustrating an example of the pixels PX included in the pixel array 11 of FIG. 1.

Referring to FIGS. 1, 3, 4, and 8, the image sensor 1 may include the plurality of pixel groups PG1 and PG2. Each of the plurality of pixel groups PG1 and PG2 may include the plurality of pixel regions PXR1 and PXR2, the deep device isolation pattern 150, the first to fourth portions 150P1, 150P2, 150P3, and 150P4, the first to fourth active patterns ACT1, ACT2, ACT3, and ACT4, the extended active pattern EACT, the plurality of transfer gate electrodes TG1 and TG2, the plurality of gate electrodes G1 and G2, the first and second floating diffusion contact plug 1001 and 1002, and the first to fourth ground contact plugs 1011, 1012, 1013, and 1014. For convenience of description, repeated descriptions of the components described above may be omitted.

The second pixel region PXR2 may include the ground contact plug 220. The ground contact plug 220 may be formed at an edge of the second pixel region PXR2. The ground contact plug 220 may be formed to contact the fourth portion 150P4 of the deep device isolation pattern 150.

For example, the first ground contact plug 1011 may be formed in the second pixel region PXR2 of the first pixel PX1 of the first pixel group PG1. The first ground contact plug 1011 may be connected to the conductive line 230. The second ground contact plug 1012 may be formed in the second pixel region PXR2 of the second pixel PX2 of the first pixel group PG1. The second ground contact plug 1012 may be connected to the conductive line 230. The third ground contact plugs 1013 may be formed in the second pixel region PXR2 of the first pixel PX1 of the second pixel group PG2. The third ground contact plugs 1013 may be connected to the conductive line 230. The fourth ground contact plug 1014 may be formed in the second pixel region PXR2 of the second pixel PX2 of the second pixel group PG2. The fourth ground contact plug 1014 may be connected to the conductive line 230.

Figure 9:
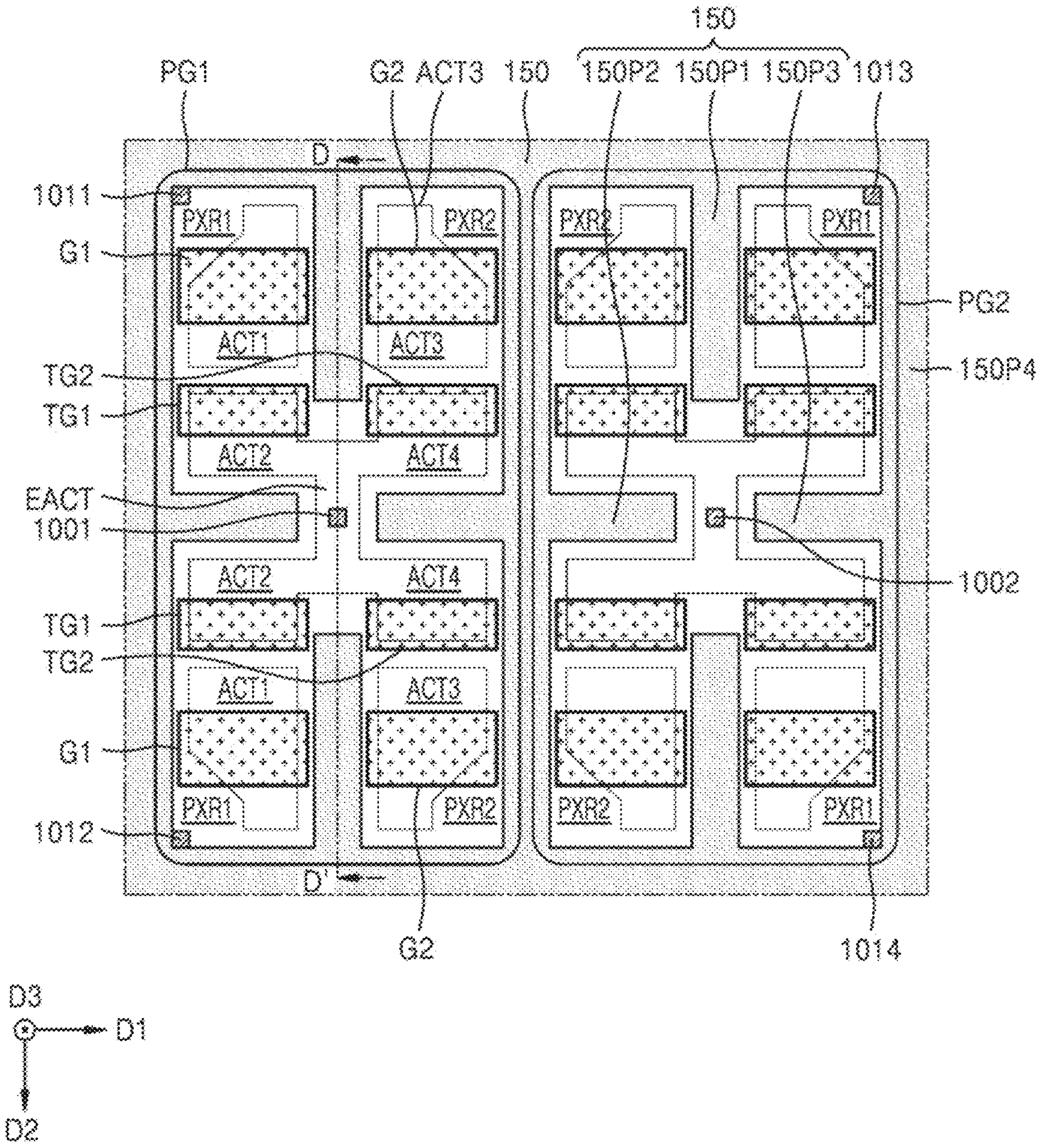
FIG. 9 is a plan view of pixels included in an image sensor according to an embodiment.
Figure 10:
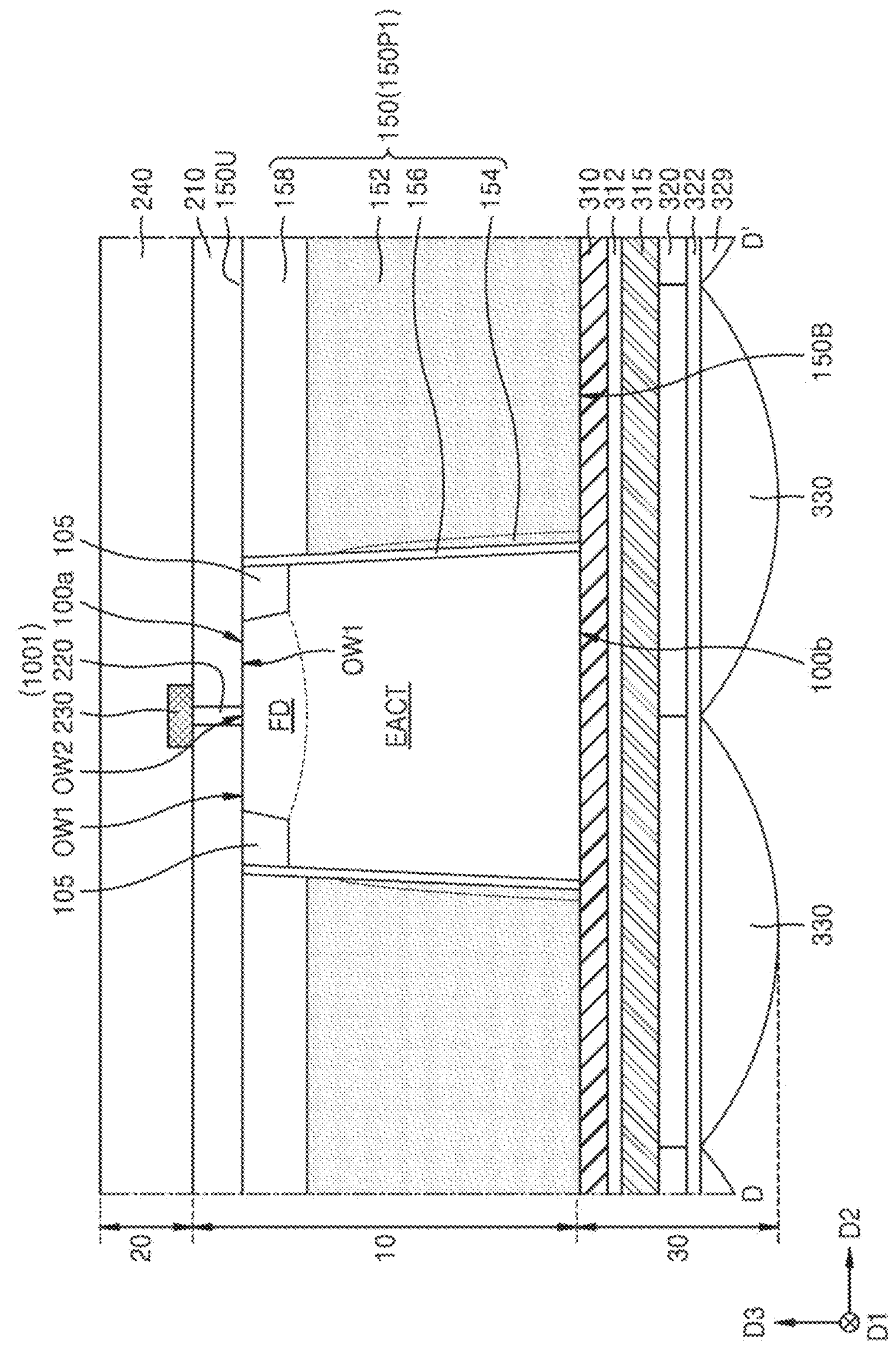
FIG. 10 is a cross-sectional view along a line D-D' of FIG. 9 according to an embodiment.

FIG. 9 is a plan view of pixels included in an image sensor according to an embodiment. FIG. 9 is a diagram illustrating an example of the pixels PX included in the pixel array 11 of FIG. 1. FIG. 10 is a cross-sectional view along a line D-D' of FIG. 9 according to an embodiment. Components of FIG. 9 are described with reference to FIG. 3 together.

Referring to FIGS. 1, 3, 4, 9, and 10, the image sensor 1 may include the plurality of pixel groups PG1 and PG2. Each of the plurality of pixel groups PG1 and PG2 may include the plurality of pixel regions PXR1 and PXR2, the deep device isolation pattern 150, the first to fourth portions 150P1, 150P2, 150P3, and 150P4, the first to fourth active patterns ACT1, ACT2, ACT3, and ACT4, the extended active pattern EACT, the plurality of transfer gate electrodes TG1 and TG2, the plurality of gate electrodes G1 and G2, the first and second floating diffusion contact plug 1001 and 1002, and the first to fourth ground contact plugs 1011, 1012, 1013, and 1014. For convenience of description, repeated descriptions of the components described above may be omitted.

A plurality of active patterns may be connected to each other within each of the pixel groups PG1 and PG2 For example, the second active pattern ACT2 of the first pixel region PXR1 of the first pixel PX1 and the fourth active pattern ACT4 of the second pixel region PXR2 of the first pixel PX1 may be connected to each other. The second active pattern ACT2 of the first pixel region PXR1 of the second pixel PX2 and the fourth active pattern ACT4 of the second pixel PX2 may be connected to each other. The extended active pattern EACT may be formed on the first open region OW1 and the second open region OW2. The extended active pattern EACT may extend in the second direction D2. The extended active pattern EACT may be physically/electrically connected to the second and fourth active patterns ACT2 and ACT4. The second active pattern ACT2 and the fourth active pattern ACT4 may be connected to each other through the extended active pattern EACT. The second and fourth active patterns ACT2 and ACT4 of the first pixel PX1 and the second and fourth active patterns ACT2 and ACT4 of the second pixel PX2 may be connected to each other through the extended active pattern EACT.

The first floating diffusion contact plug 1001 may be disposed in the second open region OW2 of the first pixel group PG1. The second floating diffusion contact plug 1002 may be disposed in the second open region OW2 of the second pixel group PG2. The ground contact plug may be disposed at an edge of the first pixel region PXR1. For example, the first ground contact plug 1011 may be formed in the first pixel region PXR1 of the first pixel PX1 of the first pixel group PG1. The second ground contact plug 1012 may be formed in the first pixel region PXR1 of the second pixel PX2 of the first pixel group PG1. The third ground contact plug 1013 may be formed in the first pixel region PXR1 of the first pixel PX1 of the second pixel group PG2. The fourth ground contact plug 1014 may be formed in the first pixel region PXR1 of the second pixel PX2 of the second pixel group PG2.

Figure 11:
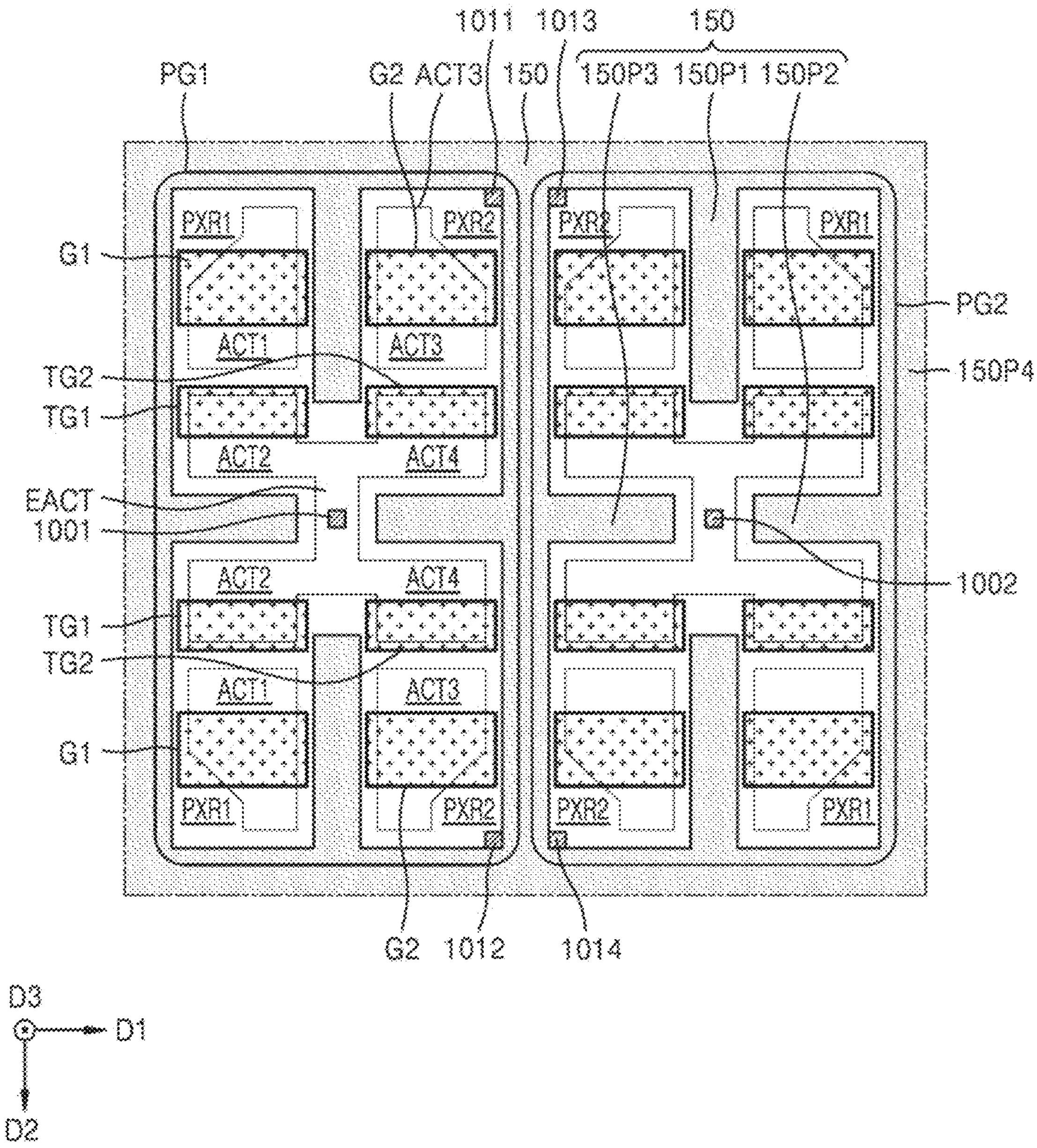
FIG. 11 is a plan view of pixels included in an image sensor according to an embodiment.

FIG. 11 is a plan view of pixels included in an image sensor according to an embodiment. FIG. 11 is a diagram illustrating an example of the pixels PX included in the pixel array 11 of FIG. 1.

Referring to FIGS. 1, 3, 4, and 11, the image sensor 1 may include the plurality of pixel groups PG1 and PG2. Each of the plurality of pixel groups PG1 and PG2 may include the plurality of pixel regions PXR1 and PXR2, the deep device isolation pattern 150, the first to fourth portions 150P1, 150P2, 150P3, and 150P4, the first to fourth active patterns ACT1, ACT2, ACT3, and ACT4, the extended active pattern EACT, the plurality of transfer gate electrodes TG1 and TG2, the plurality of gate electrodes G1 and G2, the first and second floating diffusion contact plug 1001 and 1002, and the first to fourth ground contact plugs 1011, 1012, 1013, and 1014. For convenience of description, detailed descriptions of the components described above are omitted.

In FIG. 9, a ground contact plug may be disposed in the first pixel region PXR1. On the other hand, in FIG. 11, a ground contact plug may be disposed in the second pixel region PXR2. Each of the ground contact plugs 1011, 1012, 1013, and 1014 may be disposed in the corresponding second pixel region PXR2. Each of the ground contact plugs 1011, 1012, 1013, and 1014 may be formed at an edge of the second pixel region PXR2. Each of the ground contact plugs 1011, 1012, 1013, and 1014 may be formed to contact the fourth portion 150P4 of the deep device isolation pattern 150.

Figure 12:
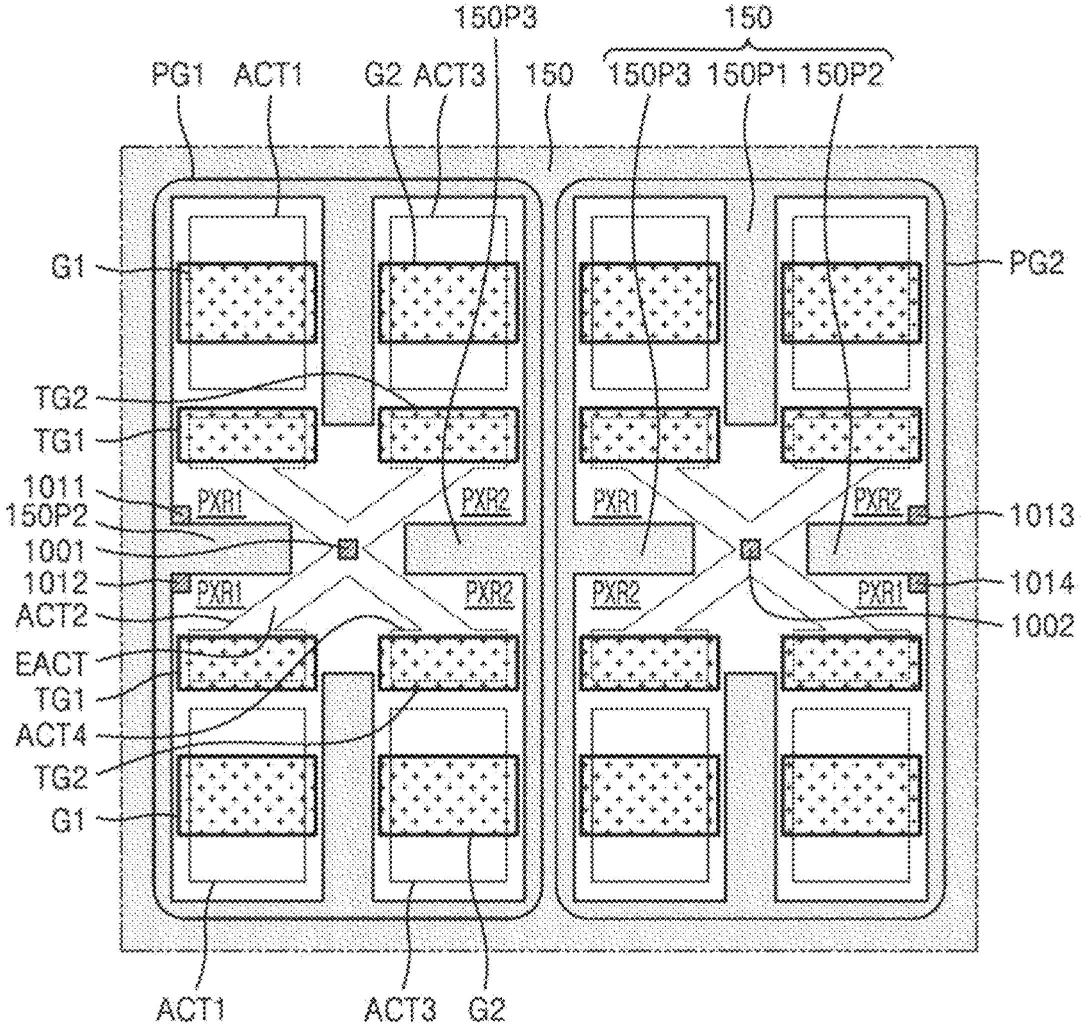
FIG. 12 is a plan view of pixels included in an image sensor according to an embodiment.

FIG. 12 is a plan view of pixels included in an image sensor according to an embodiment. FIG. 12 is a diagram illustrating an example of the pixels PX included in the pixel array 11 of FIG. 1.

Referring to FIGS. 1, 3, 4, and 12, the image sensor 1 may include the plurality of pixel groups PG1 and PG2. Each of the plurality of pixel groups PG1 and PG2 includes the plurality of pixel regions PXR1 and PXR2, the deep device isolation pattern 150, the first to fourth portions 150P1, 150P2, 150P3, and 150P4, the first to fourth active patterns ACT1, ACT2, ACT3, and ACT4, the extended active pattern EACT, the plurality of transfer gate electrodes TG1 and TG2, the plurality of gate electrodes G1 and G2, the first and second floating diffusion contact plug 1001 and 1002, the first to fourth ground contact plugs 1011, 1012, 1013, and 1014. For convenience of description, repeated descriptions of the components described above may be omitted.

In FIG. 12, a ground contact plug may be disposed in the first pixel region PXR1. Each of the ground contact plugs 1011, 1012, 1013, and 1014 may be disposed in the corresponding first pixel region PXR1. Each of the ground contact plugs 1011, 1012, 1013, and 1014 may be formed at an edge of the first pixel region PXR1. Each of the ground contact plugs 1011, 1012, 1013, and 1014 may be formed to contact the fourth portion 150P4 and the second portion 150P2 of the deep device isolation pattern 150.

Figure 13:
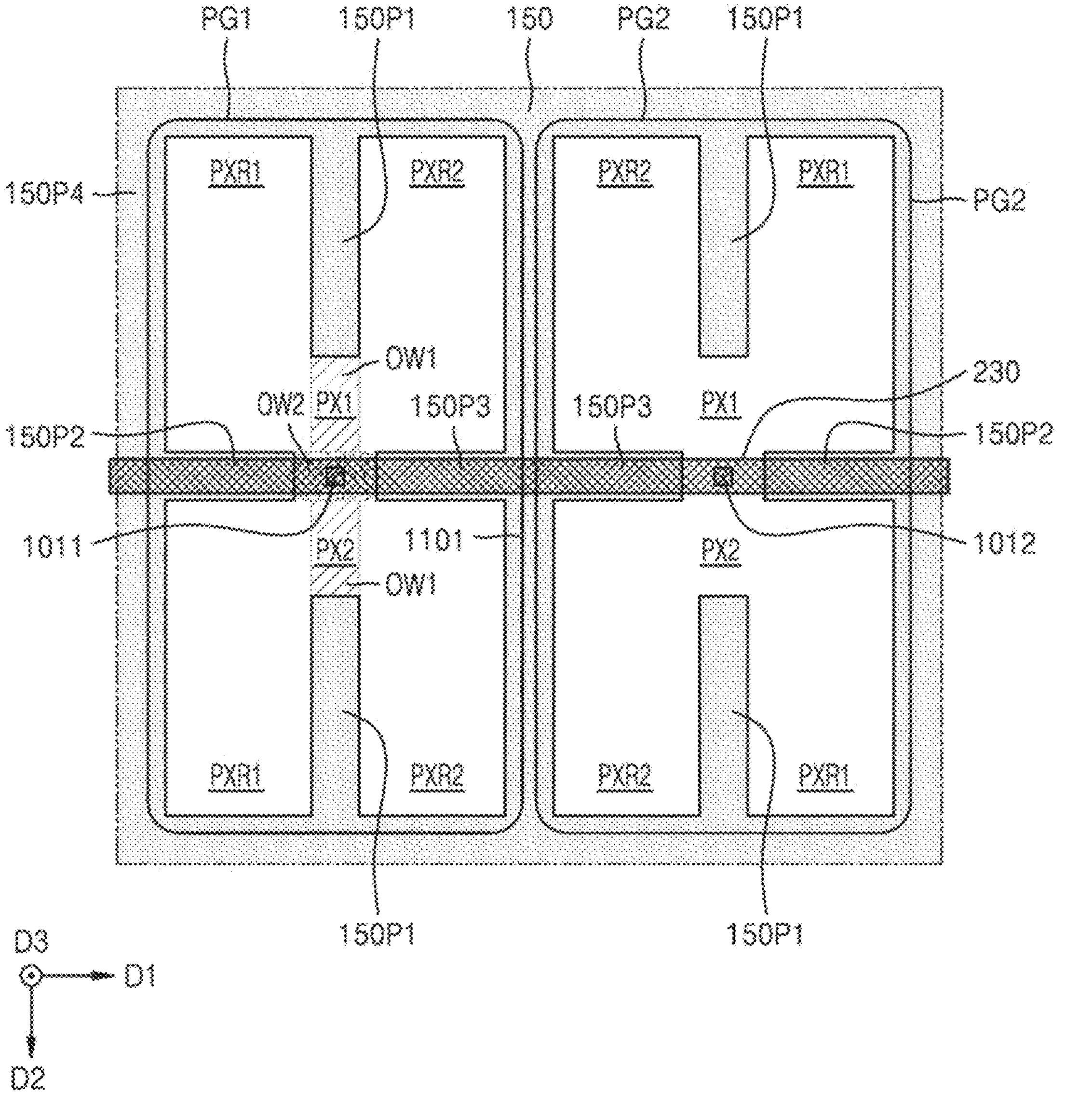
FIG. 13 is a plan view of pixels included in an image sensor according to an embodiment.

FIG. 13 is a plan view of pixels included in an image sensor according to an embodiment. FIG. 13 is a diagram illustrating an example of the pixels PX included in the pixel array 11 of FIG. 1.

For convenience of description, four pixels PX are shown in FIG. 13. For brevity of the drawings and convenience of description, FIG. 13 illustrates only the first and second pixel groups PG1 and PG2, the first and second pixel regions PXR1 and PXR2, the deep device isolation pattern 150, the first to fourth portions 150P1, 150P2, 150P3, and 150P4, and the first and second open regions OW1 and OW2. For convenience of description, repeated descriptions of the components described above may be omitted. Also, for convenience of description, the first open region OW1 and the second open region OW2 in the first pixel group PG1 are not shown in the second pixel group PG2. It should be understood that the first open region OW1 and the second open region OW2 are defined to describe a specific region among regions where the deep device isolation pattern 150 is not formed in a substrate.

In an embodiment, each of the pixel groups PG1 and PG2 may share a ground contact. The pixels PX may share the ground contact in each of the pixel groups PG1 and PG2. For example, the first pixel group PG1 may share the ground contact. The ground contact may be disposed in the second open region OW2. The first pixel PX1 and the second pixel PX2 may receive a ground voltage through the ground contact formed in the second open region OW2.

In FIG. 3, a floating diffusion contact plug may be disposed in the second open region OW2. On the other hand, in FIG. 13, a ground contact plug may be disposed in the second open region OW2. For example, the first ground contact plug 1011 may be disposed in the second open region OW2 of the first pixel group PG1. The second ground contact plug 1012 may be disposed in the second open region OW2 of the second pixel group PG2. The first ground contact plug 1011 and the second ground contact plug 1012 may be spaced apart from each other in the first direction D1. The first ground contact plug 1011 may be connected to the conductive line 230. The second ground contact plug 1012 may be connected to the conductive line 230. The conductive line 230 connected to the first ground contact plug 1011 and the second ground contact plug 1012 may extend in the first direction D1. The first ground contact plug 1011 and the second ground contact plug 1012 may be connected to each other through the conductive line 230.

Figure 14:
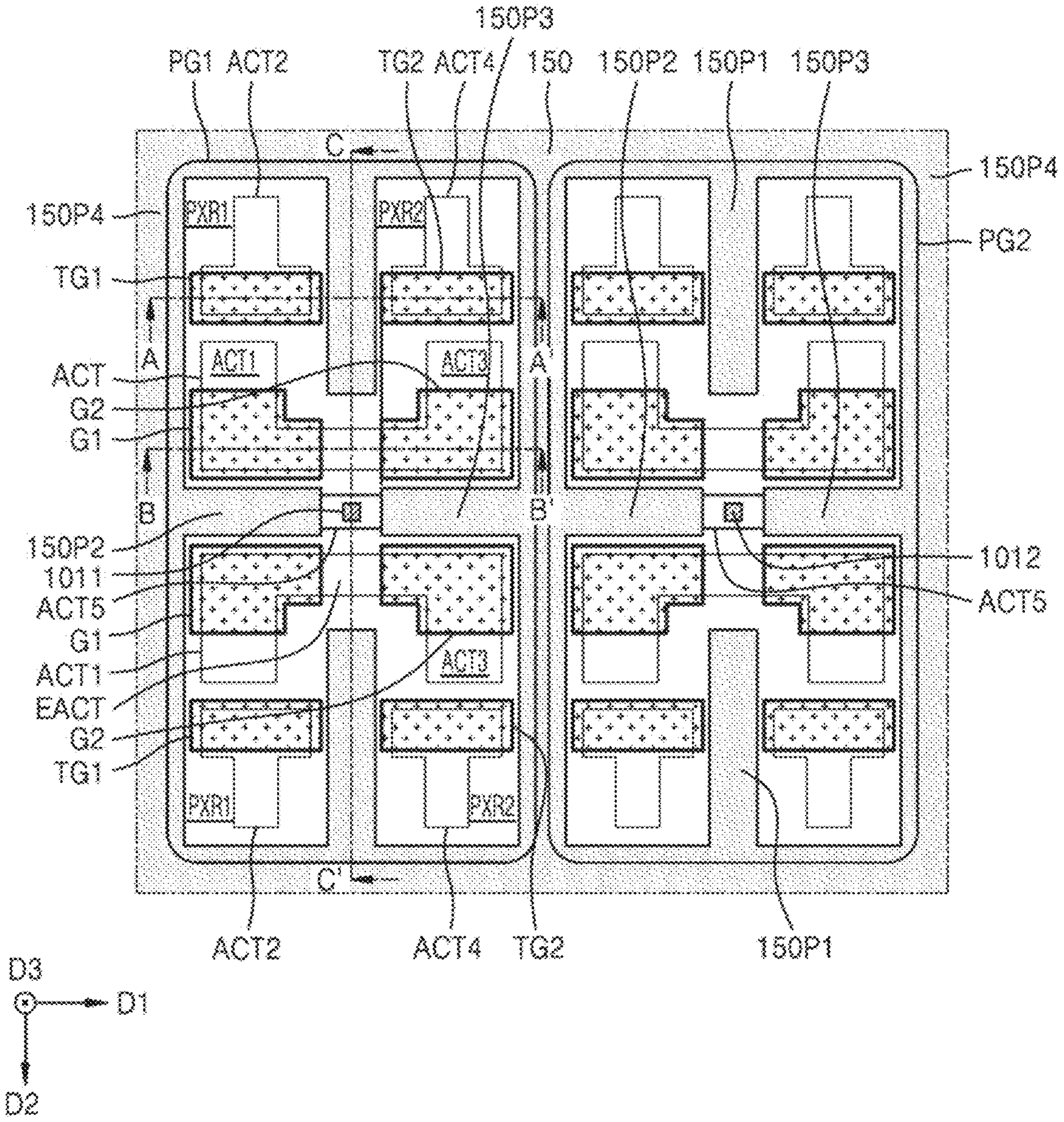
FIG. 14 is a plan view of pixels included in an image sensor according to an embodiment.
Figure 15A:
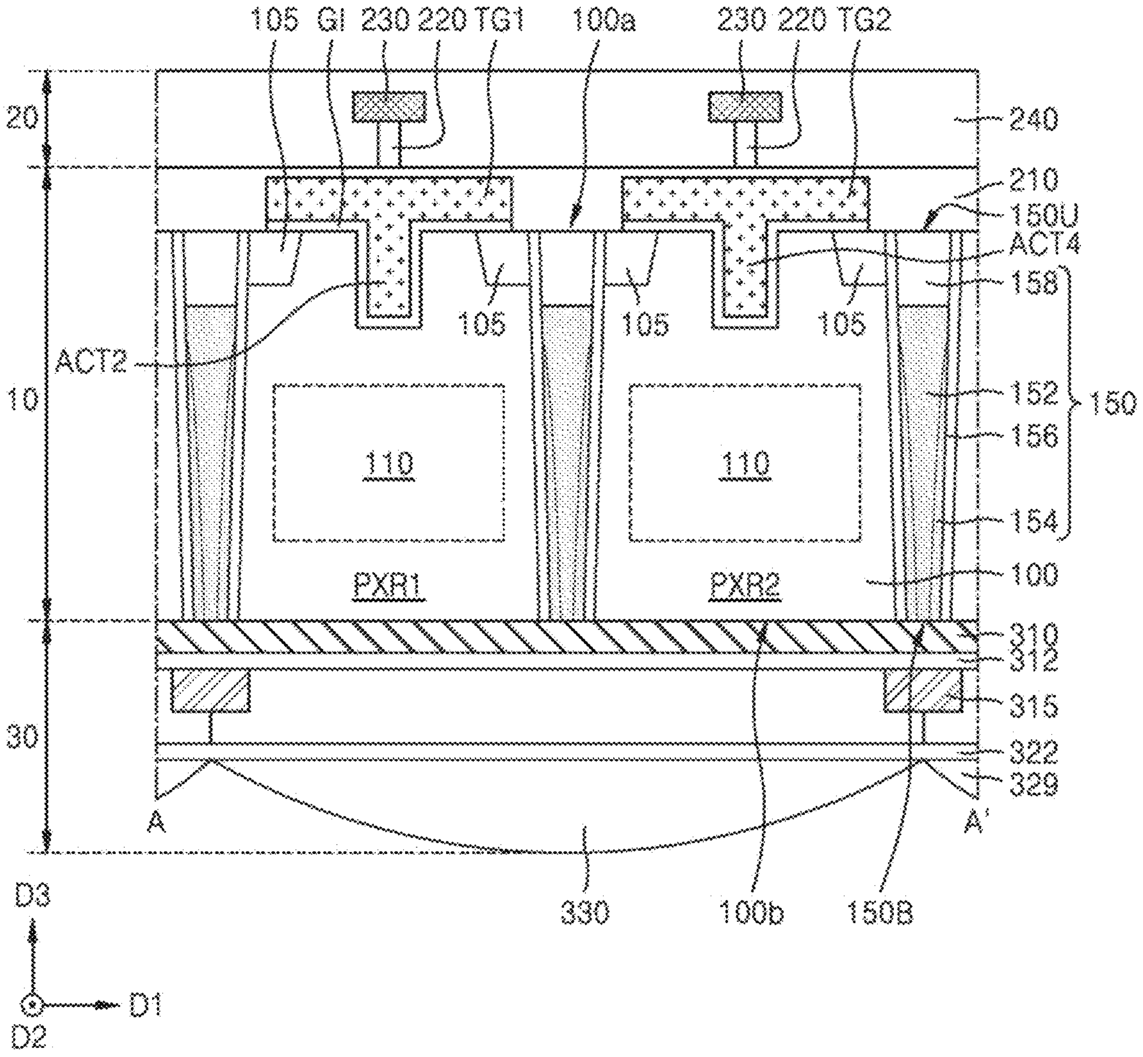
FIG. 15A is a cross-sectional view taken along a line A-A' in FIG. 14 according to an embodiment.
Figure 15B:
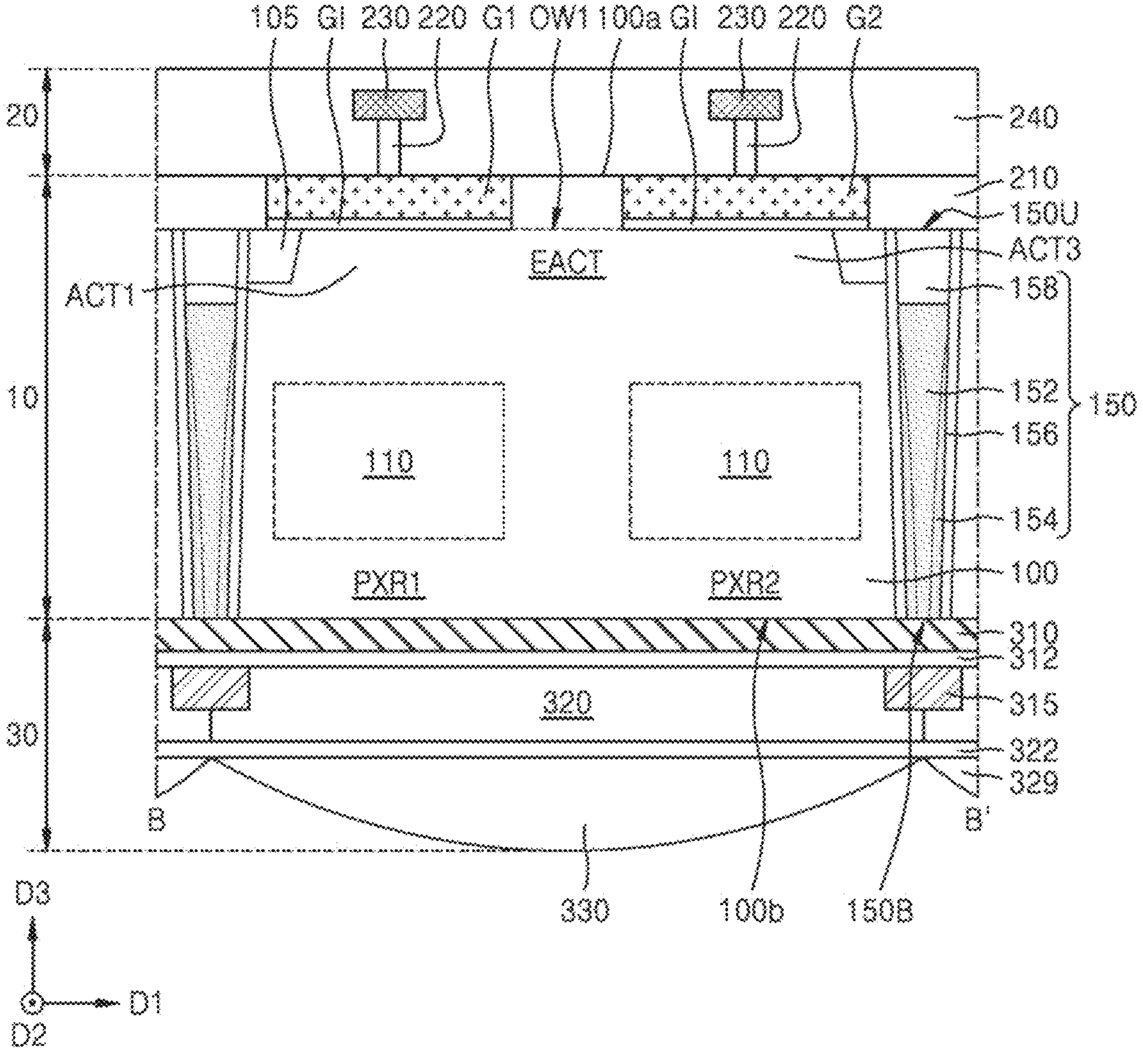
FIG. 15B is a cross-sectional view along a line B-B' in FIG. 14 according to an embodiment.
Figure 15C:
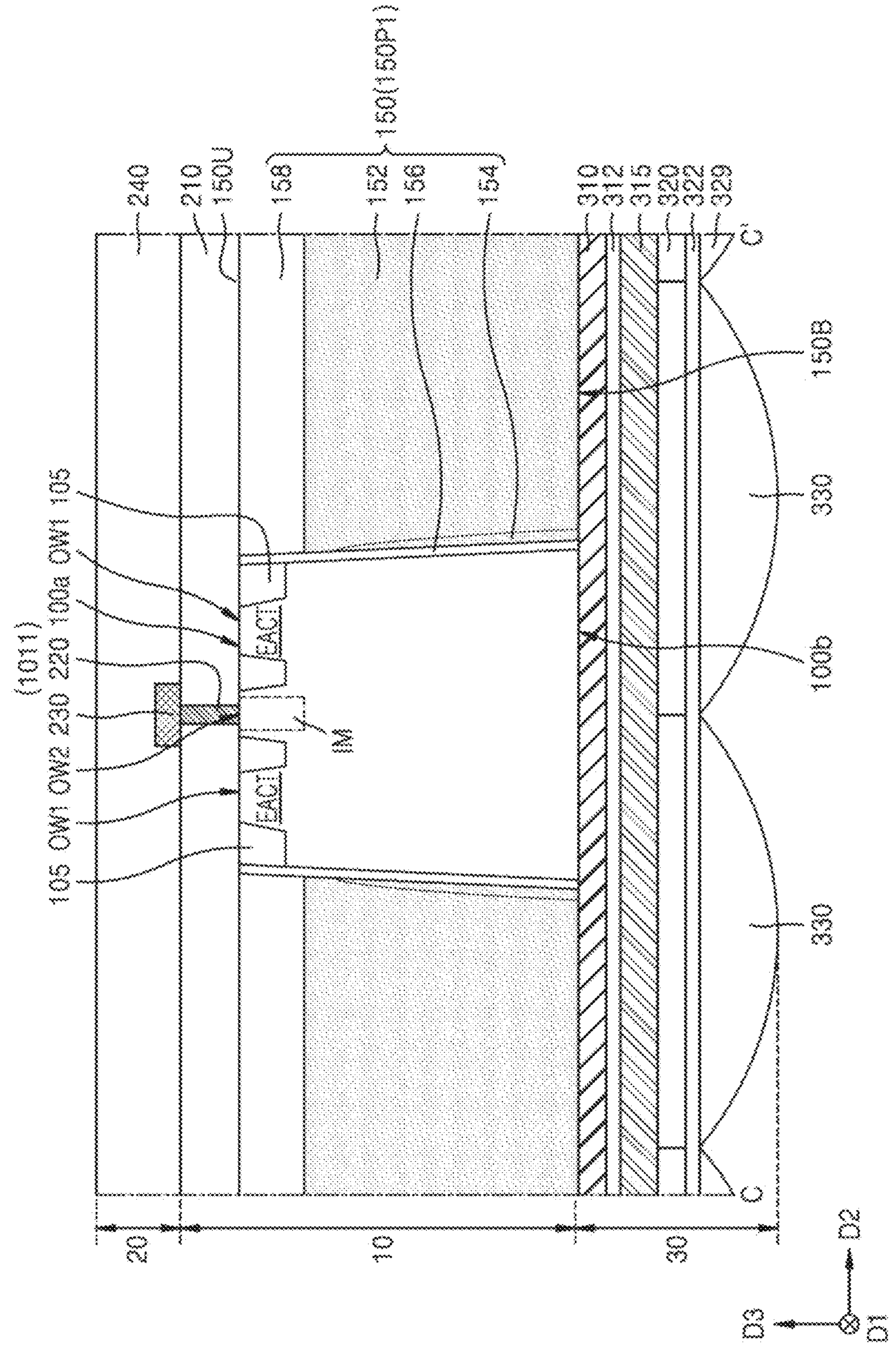
FIG. 15C is a cross-sectional view taken along a line C-C' of FIG. 14 according to an embodiment.

FIG. 14 is a plan view of pixels included in an image sensor according to an embodiment. FIG. 14 is a diagram illustrating an example of the pixels PX included in the pixel array 11 of FIG. 1. FIG. 15A is a cross-sectional view taken along a line A-A' in FIG. 14 according to an embodiment. FIG. 15*b* is a cross-sectional view taken along a line BB' in FIG. 14 according to an embodiment. FIG. 15C is a cross-sectional view taken along a line C-C' of FIG. 14 according to an embodiment. For brevity of the drawings, FIG. 14 illustrates only some of the components described in FIG. 13, and is described with reference to FIG. 13 together. For simplicity of description, differences from the image sensor 1 described with reference to FIGS. 4 and 5A to 5C are mainly described.

Referring to FIGS. 13, 14, and 15A to 15C, the image sensor 1 may include the plurality of pixel groups PG1 and PG2. Each of the plurality of pixel groups PG1 and PG2 includes the plurality of pixel regions PXR1 and PXR2, the deep device isolation pattern 150, the first to fourth portions 150P1, 150P2, 150P3, and 150P4, the first to fifth active patterns ACT1, ACT2, ACT3, ACT4, and ACT5, the extended active pattern EACT, the plurality of transfer gate electrodes TG1 and TG2, the plurality of gate electrodes G1 and G2, and the first and second ground contact plugs 1011 and 1012. For convenience of description, repeated descriptions of the components described above may be omitted.

The extended active pattern EACT may be disposed in the first open region OW1. The extended active pattern EACT may be connected to the first active pattern ACT1. The extended active pattern EACT may be connected to the third active pattern ACT3. The first active pattern ACT1 and the third active pattern ACT3 of the first pixel PX1 may be connected to each other. The first active pattern ACT1 and the third active pattern ACT3 may be electrically/physically connected to each other through the extended active pattern EACT.

The fifth active pattern ACT5 may be disposed in the second open region OW2. The fifth active pattern ACT5 may not be connected to the first active pattern ACT1. The fifth active pattern ACT5 may not be connected to the second active pattern ACT2. The fifth active pattern ACT5 may not be connected to the third active pattern ACT3. The fifth active pattern ACT5 may not be connected to the fourth active pattern ACT4. The ground contact plugs 1011, 1012 may be disposed ion the fifth active pattern ACT5. For example, the first ground contact plug 1011 may be disposed in the second open region OW2 of the first pixel group PG1. The second ground contact plug 1012 may be disposed in the second open region OW2 of the second pixel group PG2.

At least a portion of the first portion 150P1 may be disposed between the second active pattern ACT2 and the fourth active pattern ACT4 in the pixel. For example, a portion of the first portion 150P1 may be disposed between the second active pattern ACT2 of the first pixel PX1 and the fourth active pattern ACT4 of the first pixel PX1. The second portion 150P2 may be disposed between the first active pattern ACT1 of the first pixel PX1 and the first active pattern ACT1 of the second pixel PX2 within each the pixel groups PG1 and PG2. The third portion 150P3 may be disposed between the third active pattern ACT3 of the first pixel PX1 and the third active pattern ACT3 of the second pixel PX2 within each of the pixel groups PG1 and PG2.

Each of the plurality of transfer gate electrodes TG1 and TG2 may be disposed on the first surface 100*a* of the substrate 100 and on each of the plurality of pixel regions PXR1 and PXR2. The first transfer gate electrode TG1 may be disposed on the second active pattern ACT2 of the first pixel region PXR1. The second transfer gate electrode TG2 may be disposed on the fourth active pattern ACT4 of the second pixel region PXR2. The plurality of transfer gate electrodes TG1 and TG2 may respectively constitute the transfer transistors TX1 and TX2 of FIG. 2. A lower portion of the first transfer gate electrode TG1 may penetrate the second active pattern ACT2 and extend into the substrate 100. A lower portion of the second transfer gate electrode TG2 may penetrate the fourth active pattern ACT4 and extend into the substrate 100. An upper portion of the first transfer gate electrode TG1 may protrude above an upper surface of the second active pattern ACT2 (i.e., the first surface 100*a* of the substrate 100). An upper portion of the second transfer gate electrode TG2 may protrude above an upper surface of the fourth active pattern ACT4 (i.e., the first surface 100*a* of the substrate 100).

The plurality of gate electrodes G1 and G2 may be disposed on the first surface 100*a* of the substrate 100 and on the first and third active patterns ACT1 and ACT3. The first gate electrode G1 and the second gate electrode G2 may configure the amplification transistor SF, the selection transistor SX, and the reset transistor RX of FIG. 2.

The gate dielectric layer G1 may be disposed between the first transfer gate electrode TG1 and the substrate 100 (that is, the second active pattern ACT2), between the second transfer gate electrode TG2 and the substrate 100 (that is, the fourth active pattern. ACT4), between the first gate electrode G1 and the substrate 100 (that is, the first active pattern ACT1), and between the second gate electrode G2 and the substrate 100 (that is, the third active pattern ACT3).

A doped region IM may be disposed within the fifth active pattern ACT5. The doped region IM may have the same conductivity type as that of the substrate 100. The doped region IM may be a region doped with impurities of a first conductivity type (e.g., P-type impurities). The doped region IM may be electrically connected to the corresponding contact plug 220 among the contact plugs 220 and the corresponding conductive line 230 among the conductive lines 230. A ground voltage may be applied to the substrate 100 through the conductive line 230, the ground contact plugs 1001, 1002, and the doped region IM.

According to some embodiments, portions of the substrate 100 of the first pixel PX1 and the second pixel PX2 may be connected to each other due to the second open region OW2. That is, due to the second open region OW2, portions of the substrate 100 of the pixel groups PG1 and PG2 may be connected to each other. In this case, the ground voltage may be commonly applied to portions of the substrate 100 of plurality of pixel regions PXR1 and PXR2 of each of the first pixel PX1 and the second pixel PX2 through the conductive line 230, the contact plug 220, and the doped region IM.

As described above, by disposing the ground contact plug in the second open region OW2, the pixels PX may share the ground contact plug. Due to the unification of ground contact plugs, an active pattern (or active region) space within the pixel PX may be additionally secured, and thus, a region where a gate electrode may be disposed may increase. The size of the gate electrode may be increased. In addition, while sharing the ground contact plug, a length of the conductive line may be reduced and routing of a pixel array may be facilitated. By sharing the ground contact plug through the second open region OW2, the image sensor 1 according to embodiments of the present disclosure may be advantageous in terms of DTI voids, and a pattern shift may be improved.

Figure 16:
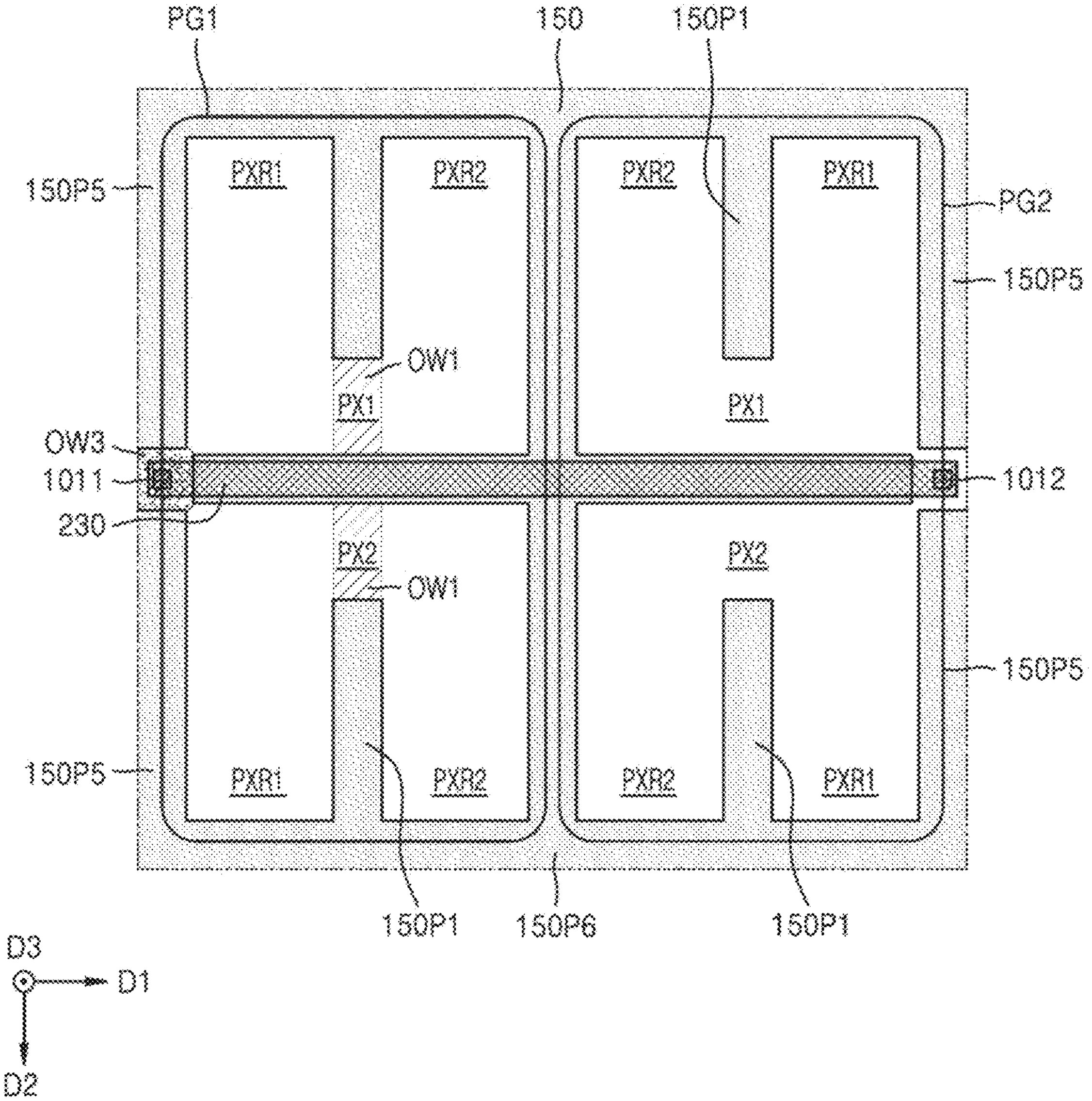
FIG. 16 is a plan view of pixels included in an image sensor according to an embodiment.

FIG. 16 is a plan view of pixels included in an image sensor according to an embodiment. FIG. 16 is a diagram illustrating an example of the pixels PX included in the pixel array 11 of FIG. 1.

For convenience of description, four pixels are shown in FIG. 16. For brevity of the drawings and convenience of description, FIG. 16 illustrates only the first and second pixel groups PG1 and PG2, the first and second pixel regions PXR1 and PXR2, the deep device isolation pattern 150, the first, fifth, and sixth portions 150P1, 150P5, and 150P6, the first and third open regions OW1 and OW3, the first and second ground contact plugs 1011 and 1012, and the conductive line 230. For convenience of description, repeated descriptions of the components described above may be omitted. Also, for convenience of description, the first open region OW1 and the third open region OW3 in the first pixel group PG1 are not shown in the second pixel group PG2. It should be understood that the first open region OW1 and the third open region OW3 are defined to describe a specific region among regions where the deep device isolation pattern 150 is not formed in a substrate.

The image sensor 1 may include the plurality of pixel groups PG1 and PG2. Each of the plurality of pixel groups PG1 and PG2 may include the plurality of pixel regions PXR1, the deep device isolation pattern 150, the first, fifth, and sixth portions 150P1, 150P5, and 150P6, the first and third open regions OW1 and OW3, the first and second ground contact plugs 1011 and 1012, and the conductive line 230. For convenience of description, repeated descriptions of the components described above may be omitted.

The deep device isolation pattern 150 may include the first portion 150P1 and the fifth and sixth portions 150P5 to 150P6. The deep device isolation pattern 150 may include the first portion 150P1 extending between the first pixel region PXR1 and the second pixel region PXR2. The first portion 150P1 may extend in the second direction D2. The first portion 150P1 is the same as the first portion 150P1 described with reference to FIGS. 3 to 15.

The deep device isolation pattern 150 may include the fifth portion 150P5 adjacent to the first pixel region PXR1 and extending in the second direction D2. The fifth portion 150P5 of the first pixel PX1 and the fifth portion 150P5 of the second pixel PX2 may be spaced apart from each other in the second direction D2. The first portion 150P1 and the fifth portion 150P5 may be spaced apart from each other in the first direction D1. The fifth portion 150P5 may be disposed on one side of the first pixel region PXR1. A length of the fifth portion 150P5 may be longer than that of the first portion 150P1. The sixth portion 150P6 may indicate a portion of the deep device isolation pattern 150 excluding the first portion 150P1 and the fifth portion 150P5. The sixth portion 150P6 may be connected to the first portion 150P1 and may be connected to the fifth portion 150P5. The deep device isolation pattern 150 may be continuously formed in the pixel array. All of the deep device isolation patterns 150 (i.e., the first portion 150P1, the fifth portion 150P5, and the sixth portion 150P6) may be physically connected to each other.

The first open region OW1 partially exposing an area between the first pixel region PXR1 and the second pixel region PRX2 may be formed in the pixel PX. The first open region OW1 may be formed at an edge of the pixel PX. The first open region OW1 may refer to a region in which the deep device isolation pattern 150 is not formed, and a width of the first open region OW1 may be configured in various ways. The first open region OW1 may be adjacent to the first portion 150P1 in the second direction D2.

The third open region OW3 partially exposing an area between the pixels PX may be formed in each of the pixel groups PG1 and PG2. The third open region OW3 partially exposing an area between the pixels PX arranged in the second direction D2 may be formed. The third open region OW3 partially exposing an area between the first pixel PX1 and the second pixel PX2 may be formed in each of the pixel groups PG1 and PG2. The third open region OW3 may refer to a region in which the deep device isolation pattern 150 is not formed, and a width of the third open region OW3 may be configured in various ways.

The second open region OW2 of FIG. 3 may be disposed at the center of each of the pixel groups PG1 and PG2. That is, the second open region OW2 may be disposed in the middle between the first pixel PX1 and the second pixel PX2. The third open region OW3 of FIG. 16 may be disposed at an edge of each of the pixel groups PG1 and PG2. That is, the third open region OW3 may be disposed at an edge between the first pixel PX1 and the second pixel PX2. The third open region OW3 may be formed between the fifth portions 150P5. The third open region OW3 may be formed between the fifth portion 150P5 of the first pixel PX1 and the fifth portion 150P5 of the second pixel PX2. The third open region OW3 may be adjacent to the fifth portion 150P5 in the second direction D2.

In FIG. 3, a floating diffusion contact plug may be disposed in the second open region OW2. On the other hand, a ground contact plug may be disposed in the third open region OW3 in FIG. 16. For example, the first ground contact plug 1011 may be disposed in the third open region OW3 of the first pixel group PG1. The second ground contact plug 1012 may be disposed in the third open region OW3 of the second pixel group PG2. The first ground contact plug 1011 and the second ground contact plug 1012 may be spaced apart from each other in the first direction D1. The first ground contact plug 1011 may be connected to the conductive line 230. The second ground contact plug 1012 may be connected to the conductive line 230. The conductive line 230 connected to the first ground contact plug 1011 and the second ground contact plug 1012 may extend in the first direction D1. The first ground contact plug 1011 and the second ground contact plug 1012 may be connected to each other through the conductive line 230.

Figure 17:
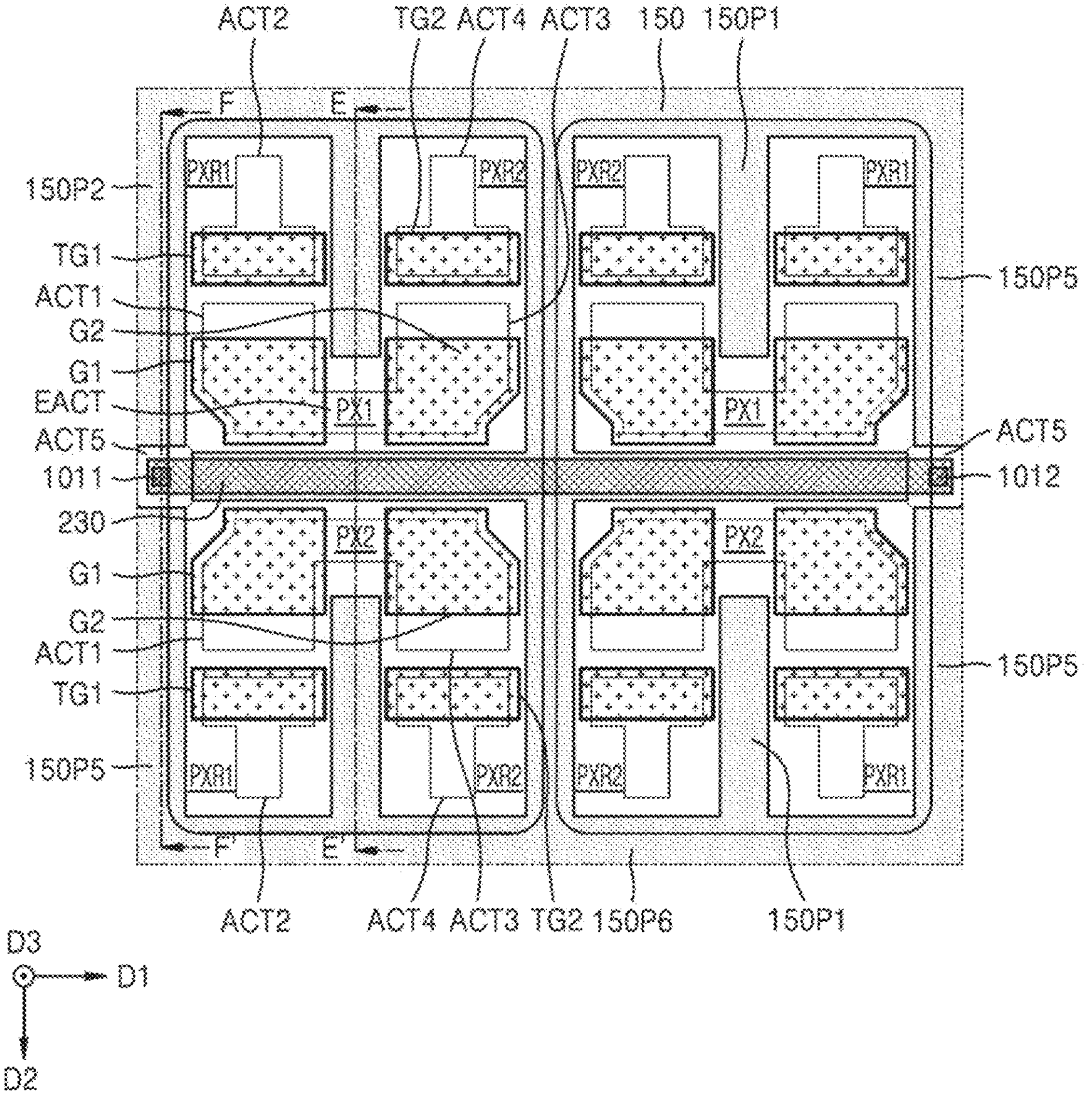
FIG. 17 is a plan view of pixels included in an image sensor according to an embodiment.
Figure 18A:
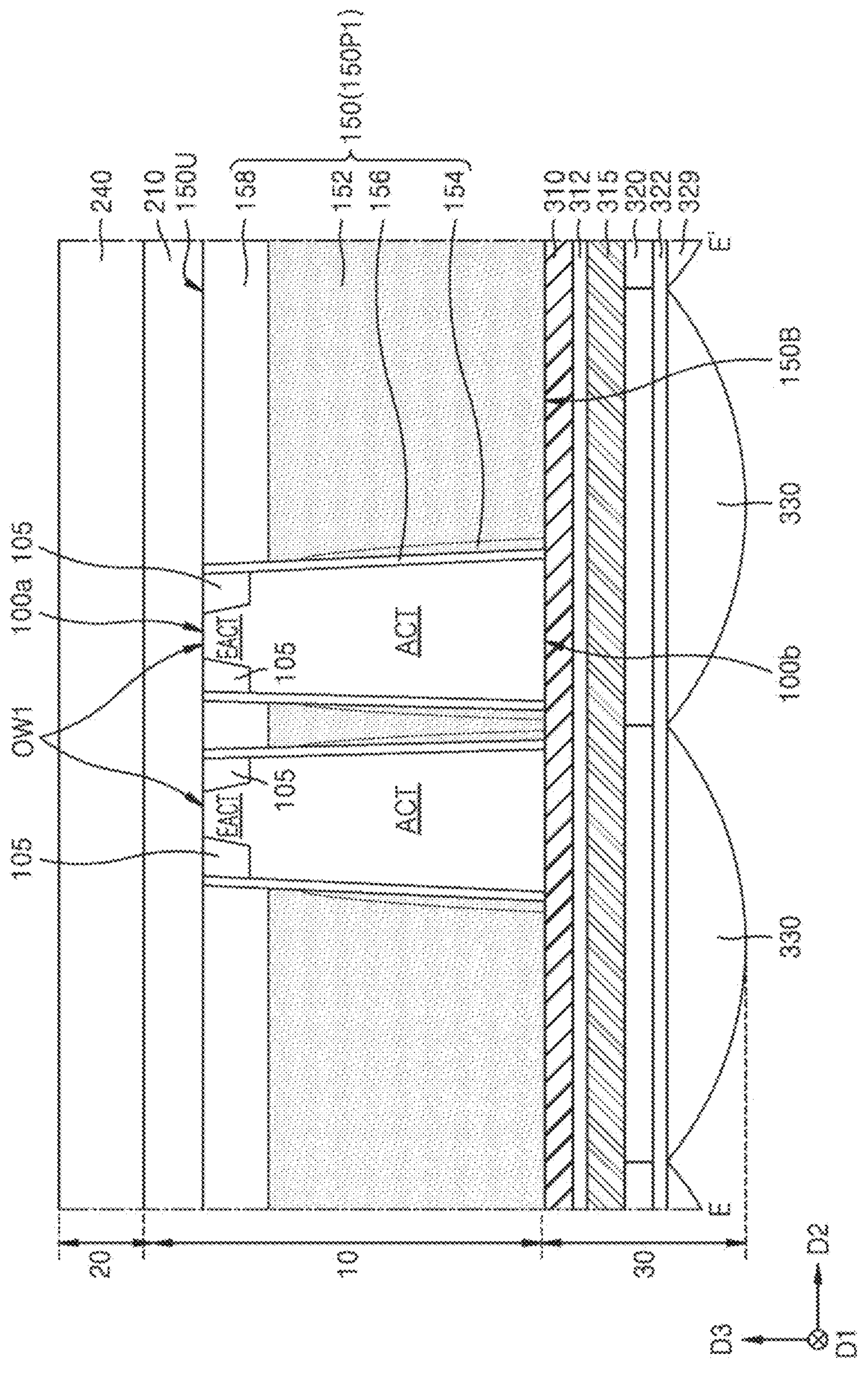
FIG. 18A is a cross-sectional view along a line E-E' in FIG. 17 according to an embodiment.
Figure 18B:
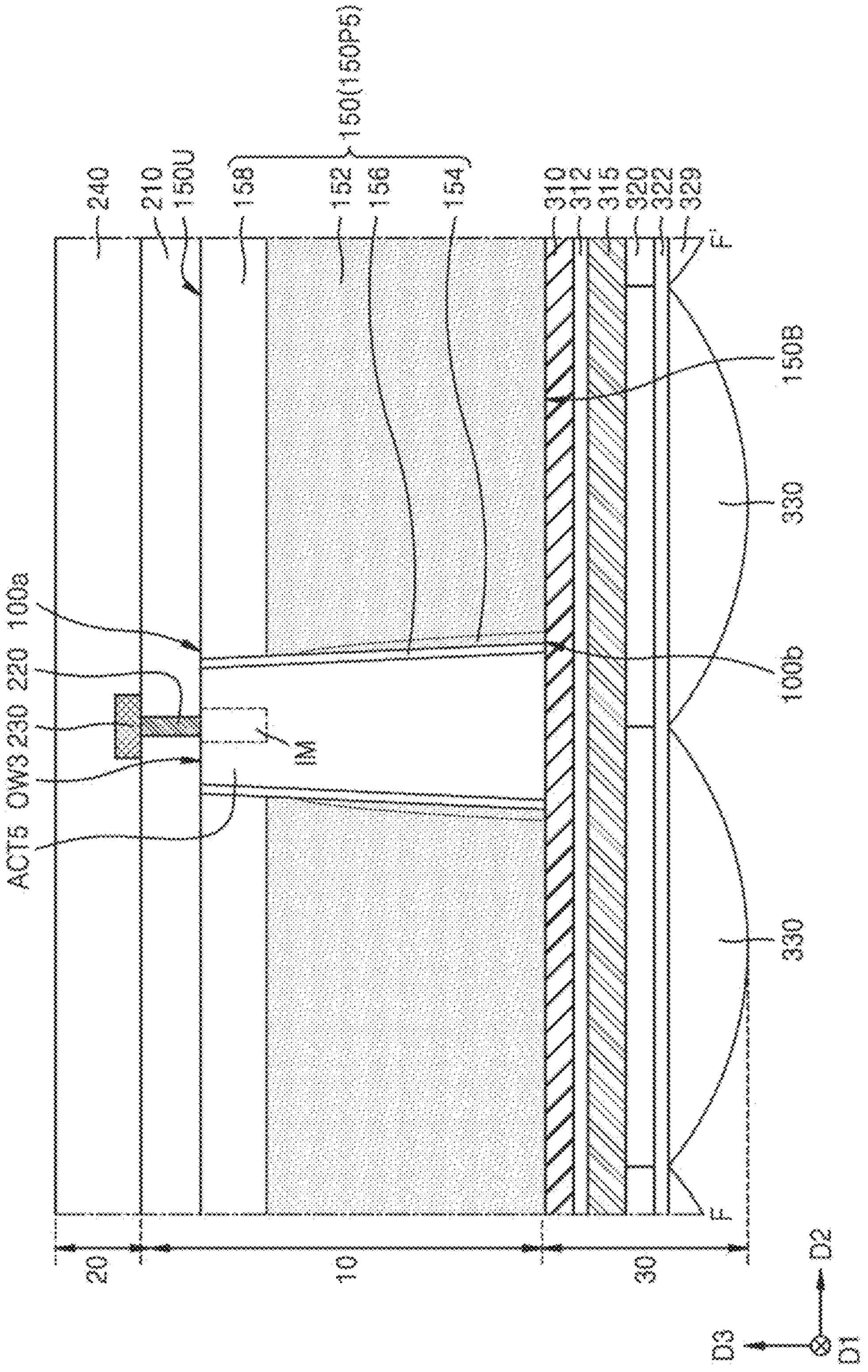
FIG. 18B is a cross-sectional view taken along a line F-F' in FIG. 17 according to an embodiment.

FIG. 17 is a plan view of pixels included in an image sensor according to an embodiment. FIG. 17 is a diagram illustrating an example of the pixels PX included in the pixel array 11 of FIG. 1. FIG. 18A is a cross-sectional view taken along a line E-E' in FIG. 17 according to an embodiment. FIG. 18B is a cross-sectional view taken along a line F-F' in FIG. 17 according to an emboidment. For brevity of the drawings, FIG. 17 illustrates only some of the components described in FIG. 16, and is described with reference to FIG. 16 together. For simplicity of description, differences from the image sensor 1 described with reference to FIGS. 4 and 5A to 5C are mainly described.

Referring to FIGS. 16, 17, and 18A to 18B, the image sensor 1 may include the plurality of pixel groups PG1 and PG2. Each of the plurality of pixel groups PG1 and PG2 may include the plurality of pixel regions PXR1, the deep device isolation pattern 150, the first, fifth, and sixth portions 150P1, 150P5, and 150P6, the first to fifth active patterns ACT1, ACT2, ACT3, ACT4, and ACT5, the extended active pattern EACT, the plurality of transfer gate electrodes TG1 and TG2, the plurality of gate electrodes G1 and G2, and the first and second ground contact plugs 1011 and 1012. For convenience of description, repeated descriptions of the components described above may be omitted.

The extended active pattern EACT may be disposed in the first open region OW1. The extended active pattern EACT may be connected to the first active pattern ACT1. The extended active pattern EACT may be connected to the third active pattern ACT3. The first active pattern ACT1 and the third active pattern ACT3 of the first pixel PX1 may be connected to each other. The first active pattern ACT1 and the third active pattern ACT3 may be electrically/physically connected to each other through the extended active pattern EACT.

The third open region OW3 may be disposed on the fifth active pattern ACT5. The fifth active pattern ACT5 may not be connected to the first active pattern ACT1. The fifth active pattern ACT5 may not be connected to the second active pattern ACT2. The fifth active pattern ACT5 may not be connected to the third active pattern ACT3. The fifth active pattern ACT5 may not be connected to the fourth active pattern ACT4. The fifth active pattern ACT5 may be blocked from the first to fourth active patterns ACT1 to ACT4. The ground contact plugs 1011, 1012 may be disposed on the fifth active pattern ACT5. The first ground contact plug 1011 may be disposed in the third open region OW3 of the first pixel group PG1. The second ground contact plug 1012 may be disposed in the third open region OW3 of the second pixel group PG2.

At least a portion of the first portion 150P1 may be disposed between the second active pattern ACT2 and the fourth active pattern ACT4 in the pixel PX. For example, a portion of the first portion 150P1 may be disposed between the second active pattern ACT2 of the first pixel PX1 and the fourth active pattern ACT4 of the first pixel PX1. The fifth portion 150P5 may contact the first pixel region PXR1. The fifth portion 150P5 may not contact the second pixel region PXR2.

Each of the plurality of transfer gate electrodes TG1 and TG2 may be disposed on the first surface 100*a* of the substrate 100 and on each of the plurality of pixel regions PXR1 and PXR2. The first transfer gate electrode TG1 may be disposed on the second active pattern ACT2 of the first pixel region PXR1. The second transfer gate electrode TG2 may be disposed on the fourth active pattern ACT4 of the second pixel region PXR2. The plurality of transfer gate electrodes TG1 and TG2 may respectively constitute the transfer transistors TX1 and TX2 of FIG. 2. A lower portion of the first transfer gate electrode TG1 may penetrate the second active pattern ACT2 and extend into the substrate 100. A lower portion of the second transfer gate electrode TG2 may penetrate the fourth active pattern ACT4 and extend into the substrate 100. An upper portion of the first transfer gate electrode TG1 may protrude above an upper surface of the second active pattern ACT2 (i.e., the first surface 100*a* of the substrate 100). An upper portion of the second transfer gate electrode TG2 may protrude above an upper surface of the fourth active pattern ACT4 (i.e., the first surface 100*a* of the substrate 100).

The plurality of gate electrodes G1 and G2 may be disposed on the first surface 100*a* of the substrate 100 and on the first and third active patterns ACT1 and ACT3. The first gate electrode G1 and the second gate electrode G2 may configure the amplification transistor SF, the selection transistor SX, and the reset transistor RX of FIG. 2.

The gate dielectric layer G1 may be disposed between the first transfer gate electrode TG1 and the substrate 100 (that is, the second active pattern ACT2), between the second transfer gate electrode TG2 and the substrate 100 (that is, the fourth active pattern. ACT4), between the first gate electrode G1 and the substrate 100 (that is, the first active pattern ACT1), and between the second gate electrode G2 and the substrate 100 (that is, the third active pattern ACT3).

The doped region IM may be disposed within the fifth active pattern ACT5. The doped region IM may have the same conductivity type as that of the substrate 100. The doped region IM may be a region doped with impurities of a first conductivity type (e.g., P-type impurities). The doped region IM may be electrically connected to the corresponding contact plug 220 among the contact plugs 220 and the corresponding conductive line 230 among the conductive lines 230. A ground voltage may be applied to the substrate 100 through the conductive line 230, the contact plug 220, and the doped region IM.

According to some embodiments, portions of the substrate 100 of the first pixel PX1 and the second pixel PX2 may be connected to each other due to the third open region OW3. That is, due to the third open region OW3, portions of the substrate 100 of the pixel groups PG1 and PG2 may be connected to each other. In this case, the ground voltage may be commonly applied to portions of the substrate 100 of plurality of pixel regions PXR1 and PXR2 of each of the first pixel PX1 and the second pixel PX2 through the conductive line 230, the contact plug 220, and the doped region IM.

FIGS. 19A to 19E are circuit diagrams of pixels according to an embodiment. Pixel portions PXPa to PXPe of FIGS. 19A to 19E may be applied to the pixel array 11 of FIG. 1. FIGS. 19A to 19E are described with reference to FIGS. 3 and 4 together.

Referring to FIGS. 1, 3, 4, and 19A, the pixel portion PXPa may include the first and second pixel groups PG1 and PG2. The pixel portion PXPa may include four pixels PX. For example, the pixel portion PXPa may include the first pixel PX1 of the first pixel group PG1, the second pixel PX2 of the first pixel group PG1, the first pixel PX1 of the second pixel group PG2, and the second pixel PX2 of the second pixel group PG2.

The pixel portion PXPa may include the first to eighth photoelectric conversion devices PD1 to PD8, the first to eighth transfer transistors TX1 to TX8, the reset transistor RX, a double conversion gain transistor DCX, the amplification transistor SF, and the selection transistor SX.

The first pixel region PXR1 of the first pixel PX1 of the first pixel group PG1 may include the first photoelectric conversion device PD1, the second pixel region PXR2 of the first pixel PX1 of the first pixel group PG1 may include the second photoelectric conversion device PD2, the first pixel region PXR1 of the second pixel PX2 of the first pixel group PG1 may include the third photoelectric conversion device PD3, and the second pixel region PXR2 of the second pixel PX2 of the first pixel group PG1 may include the fourth photoelectric conversion device PD4.

The first pixel region PXR1 of the first pixel PX1 of the second pixel group PG2 may include the fifth photoelectric conversion device PD5, the second pixel region PXR2 of the first pixel PX1 of the second pixel group PG2 may include the sixth photoelectric conversion device PD6, the first pixel region PXR1 of the second pixel PX2 of the second pixel group PG2 may include the seventh photoelectric conversion device PD7, and the second pixel region PXR2 of the second pixel PX2 of the second pixel group PG2 may include the eighth photoelectric conversion device PD8.

The first to eighth transfer transistors TX1 to TX8 may respectively transmit photocharges generated by the first to eighth photoelectric conversion devices PD1 to PD8 to the floating diffusion region FD according to the first to eighth transmission control signals TS1 to TS8. When each of the first to eighth transfer transistors TX1 to TX8 is turned on, the photocharges generated by each of the first to eighth photoelectric conversion devices PD1 to PD8 may be transmitted to the floating diffusion region FD, and may be accumulated and stored in the floating diffusion region FD.

The reset transistor RX may periodically reset charges accumulated in the floating diffusion region FD. A drain electrode of the reset transistor RX may be connected to the double conversion gain transistor DCX, and a source electrode of the reset transistor RX may be connected to the power supply voltage VPIX. When the reset transistor RX is turned on according to the reset control signal RS, the power supply voltage VPIX connected to the source electrode of the reset transistor RX is transferred to the floating diffusion region FD. When the reset transistor RX is turned on, the charges accumulated in the floating diffusion region FD may be discharged such that the floating diffusion region FD may be reset.

The double conversion gain transistor DCX may be connected between the reset transistor RX and the floating diffusion region FD. The dual conversion gain transistor DCX may vary a conversion gain of a unit pixel by varying the capacitance of the floating diffusion region FD in response to a double conversion gain control signal DCS.

The amplification transistor SF may be controlled according to the amount of photocharges accumulated in the floating diffusion region FD. The amplification transistor SF, which is a buffer amplifier, may buffer a signal according to charges charged in the floating diffusion region FD. The amplification transistor SF may be connected between the power supply voltage VPIX and the selection transistor SX. The amplification transistor SF may amplify a potential change in the floating diffusion region FD and output the potential change to a column output line (e.g., one of the column output lines CLO_0 to CLO_n−1 in FIG. 1) as the pixel signal VOUT.

The selection transistor SX has a drain terminal connected to the source terminal of the amplification transistor SF, and may output the pixel signal VOUT to the CDS 151 through the column output line in response to the selection signal SELS.

The first and second gate electrodes G1 and G2 of FIGS. 4, 8, 9, 11, 12, 14, and 17 may constitute the double conversion gain transistor DCX, the amplification transistor SF, the selection transistor SX, and the reset transistor RX. For example, at least one of the first gate electrode G1 or the second gate electrode G2 may be an amplification gate electrode of the amplification transistor SF. At least another one of the first gate electrode G1 or the second gate electrode G2 may be a selection gate electrode of the selection transistor SX. At least another one of the first gate electrode G1 or the second gate electrode G2 may be a reset gate electrode of the reset transistor RX. At least another one of the first gate electrode G1 or the second gate electrode G2 may be a double conversion gain gate electrode of the double conversion gain transistor DCX.

Figure 19A:
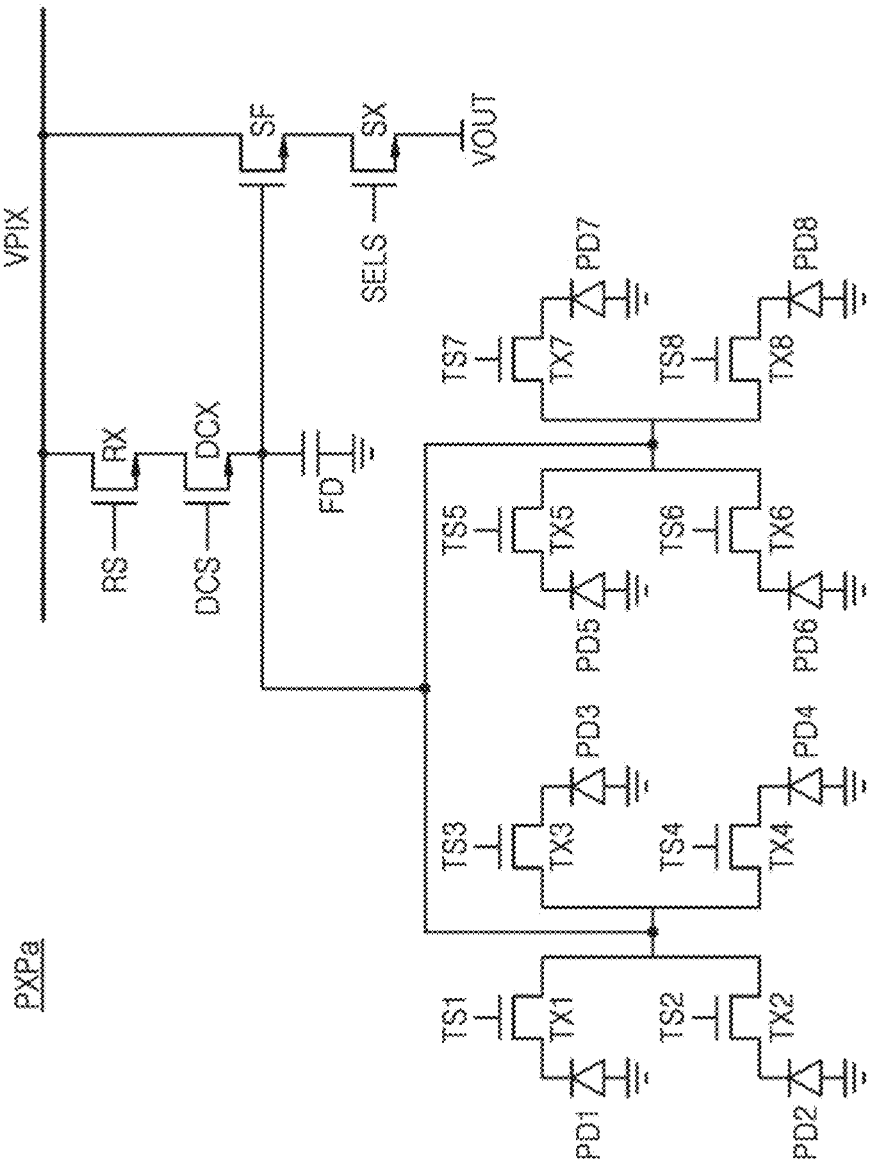
FIGS. 19A to 19E are circuit diagrams of pixels according to an embodiment.

Referring to FIGS. 1, 3, 4, and 19B, the pixel portion PXPb may include the first to eighth photoelectric conversion devices PD1 to PD8, the first to eighth transfer transistors TX1 to TX8, the reset transistor RX, the double conversion gain transistor DCX, first and second amplification transistors SF1 and SF2, and the selection transistor SX. Differences from the pixel portion PXPa described with reference to FIG. 19A are mainly described.

The pixel portion PXPb may further include the second amplification transistor SF2. The first amplification transistor SF1 may be connected between the power supply voltage VPIX and the selection transistor SX. The second amplification transistor SF2 may be connected between the power supply voltage VPIX and the selection transistor SX. The first and second amplification transistors SF1 and SF2 may be connected in parallel to each other.

The first and second gate electrodes G1 and G2 of FIGS. 4, 8, 9, 11, 12, 14, and 17 may constitute the double conversion gain transistor DCX, the first amplification transistor SF1, the second amplification transistor SF2, the selection transistor SX, and the reset transistor RX. For example, at least one of the first gate electrode G1 or the second gate electrode G2 may be an amplification gate electrode of the first amplification transistor SF1. At least another one of the first gate electrode G1 or the second gate electrode G2 may be an amplification gate electrode of the second amplification transistor SF2. At least another one of the first gate electrode G1 or the second gate electrode G2 may be a selection gate electrode of the selection transistor SX. At least another one of the first gate electrode G1 or the second gate electrode G2 may be a reset gate electrode of the reset transistor RX. At least another one of the first gate electrode G1 or the second gate electrode G2 may be a double conversion gain gate electrode of the double conversion gain transistor DCX.

Figure 19B:
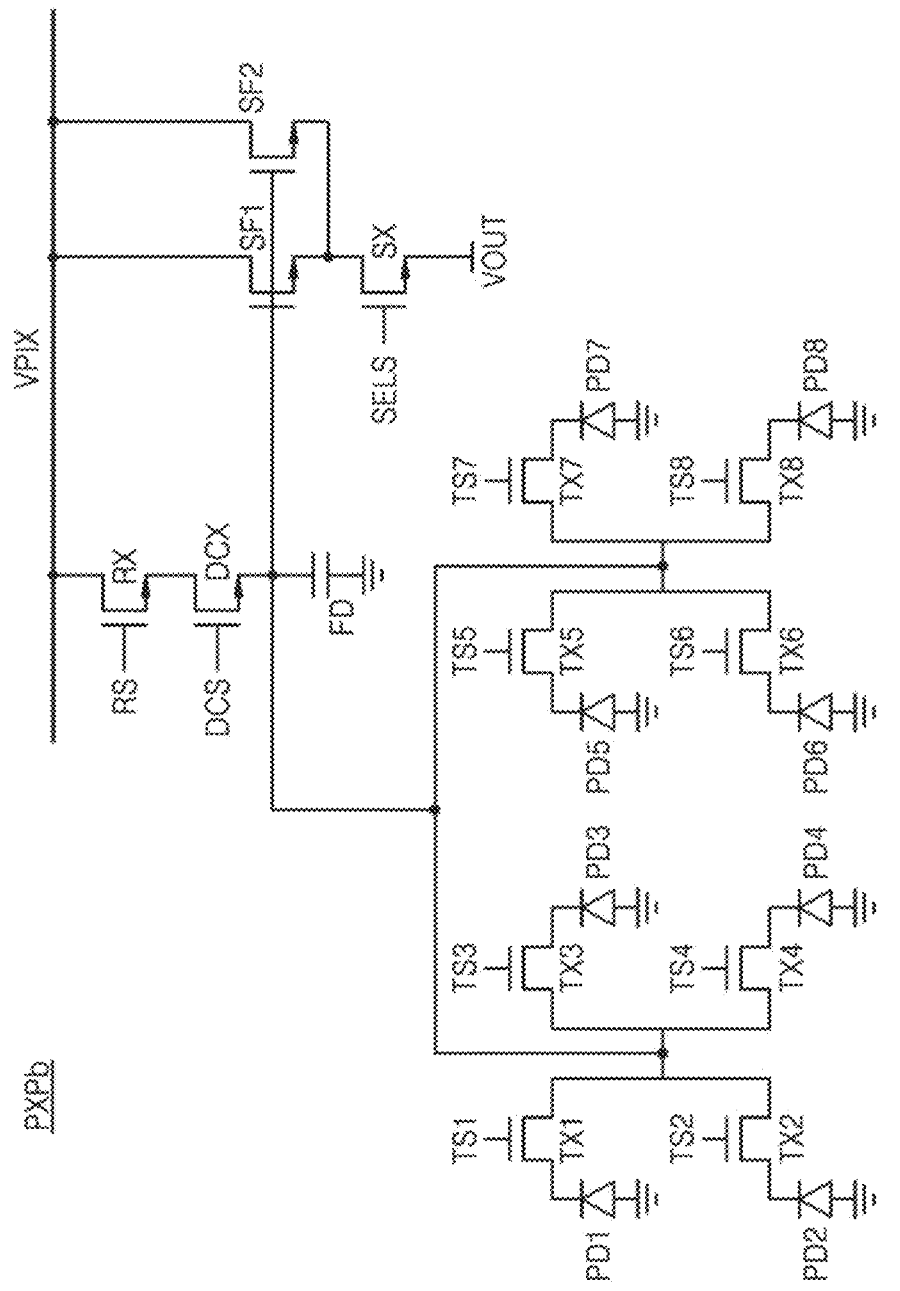
Figure 19C:
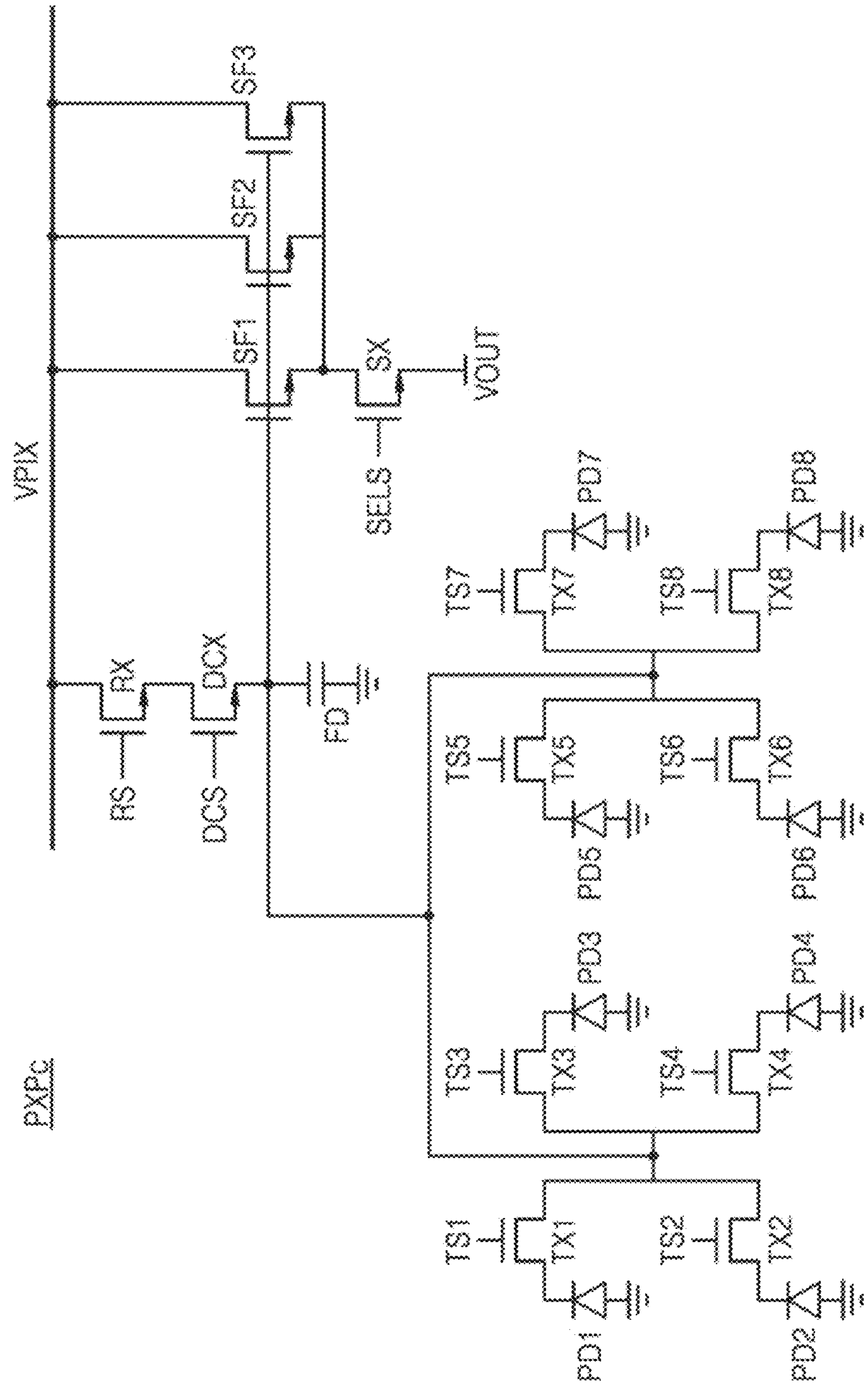

Referring to FIGS. 1, 3, 4, and 19C, the pixel portion PXPc may include the first to eighth photoelectric conversion devices PD1 to PD8, the first to eighth transfer transistors TX1 to TX8, the reset transistor RX, the double conversion gain transistor DCX, the first to third amplification transistors SF1 to SF3, and the selection transistor SX. Differences from the pixel portion PXPb described with reference to FIG. 19B are mainly described.

The pixel portion PXPc may further include the third amplification transistor SF3. The first amplification transistor SF1 may be connected between the power supply voltage VPIX and the selection transistor SX. The second amplification transistor SF2 may be connected between the power supply voltage VPIX and the selection transistor SX. The third amplification transistor SF3 may be connected between the power supply voltage VPIX and the selection transistor SX. The first to third amplification transistors SF1 to SF3 may be connected in parallel to each other.

The first and second gate electrodes G1 and G2 of FIGS. 4, 8, 9, 11, 12, 14, and 17 may constitute the double conversion gain transistor DCX, the first amplification transistor SF1, the second amplification transistor SF2, the third amplification transistor SF3, the selection transistor SX, and the reset transistor RX. For example, at least one of the first gate electrode G1 or the second gate electrode G2 may be an amplification gate electrode of the first amplification transistor SF1. At least another one of the first gate electrode G1 or the second gate electrode G2 may be an amplification gate electrode of the second amplification transistor SF2. At least another one of the first gate electrode G1 or the second gate electrode G2 may be an amplification gate electrode of the third amplification transistor SF3. At least another one of the first gate electrode G1 or the second gate electrode G2 may be a selection gate electrode of the selection transistor SX. At least another one of the first gate electrode G1 or the second gate electrode G2 may be a reset gate electrode of the reset transistor RX. At least another one of the first gate electrode G1 or the second gate electrode G2 may be a double conversion gain gate electrode of the double conversion gain transistor DCX.

Referring to FIGS. 1, 3, 4, and 19D, the pixel portion PXPd may include the first to eighth photoelectric conversion devices PD1 to PD8, the first to eighth transfer transistors TX1 to TX8, the reset transistor RX, the double conversion gain transistor DCX, the first and second amplification transistors SF1 and SF2, and first and second selection transistors SX1 and SX2. Differences from the pixel portion PXPb described with reference to FIG. 19B are mainly described.

The pixel portion PXPd may further include a second selection transistor SX2. The first selection transistor SX1 may be connected between the first amplification transistor SF1 and a column output line. The second selection transistor SX2 may be connected between the second amplification transistor SF2 and the column output line. The first and second selection transistors SX1 and SX2 may be connected in parallel to each other.

The first and second gate electrodes G1 and G2 of FIGS. 4, 8, 9, 11, 12, 14, and 17 may constitute the double conversion gain transistor DCX and a first amplification transistor SF1, the second amplification transistor SF2, the first selection transistor SX1, the second selection transistor SX2, and the reset transistor RX. For example, at least one of the first gate electrode G1 or the second gate electrode G2 may be an amplification gate electrode of the first amplification transistor SF1. At least another one of the first gate electrode G1 or the second gate electrode G2 may be an amplification gate electrode of the second amplification transistor SF2. At least another one of the first gate electrode G1 or the second gate electrode G2 may be an amplification gate electrode of the first selection transistor SX1. At least another one of the first gate electrode G1 or the second gate electrode G2 may be a selection gate electrode of the second selection transistor SX2. At least another one of the first gate electrode G1 or the second gate electrode G2 may be a reset gate electrode of the reset transistor RX. At least another one of the first gate electrode G1 or the second gate electrode G2 may be a double conversion gain gate electrode of the double conversion gain transistor DCX.

Figure 19D:
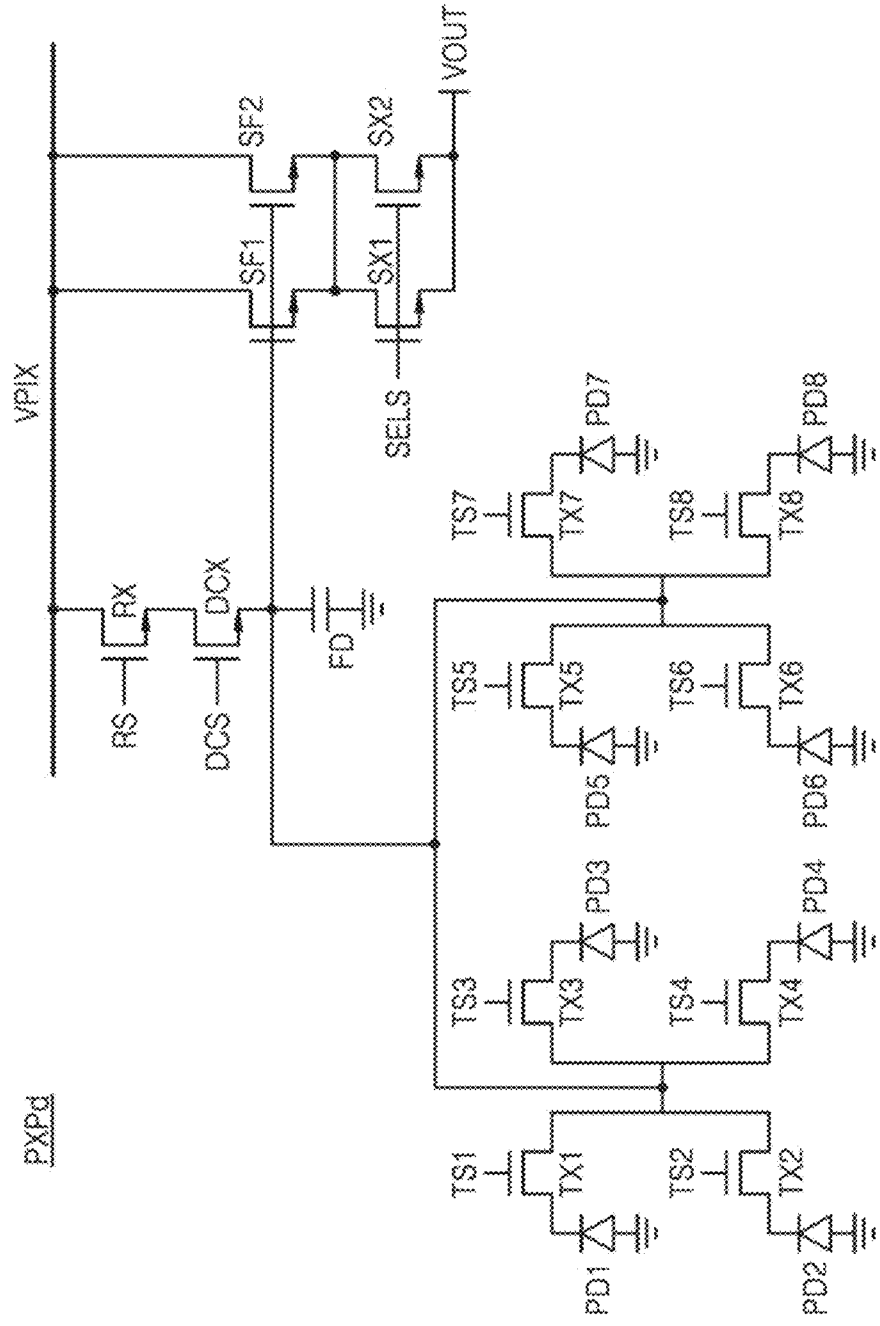
Figure 19E:
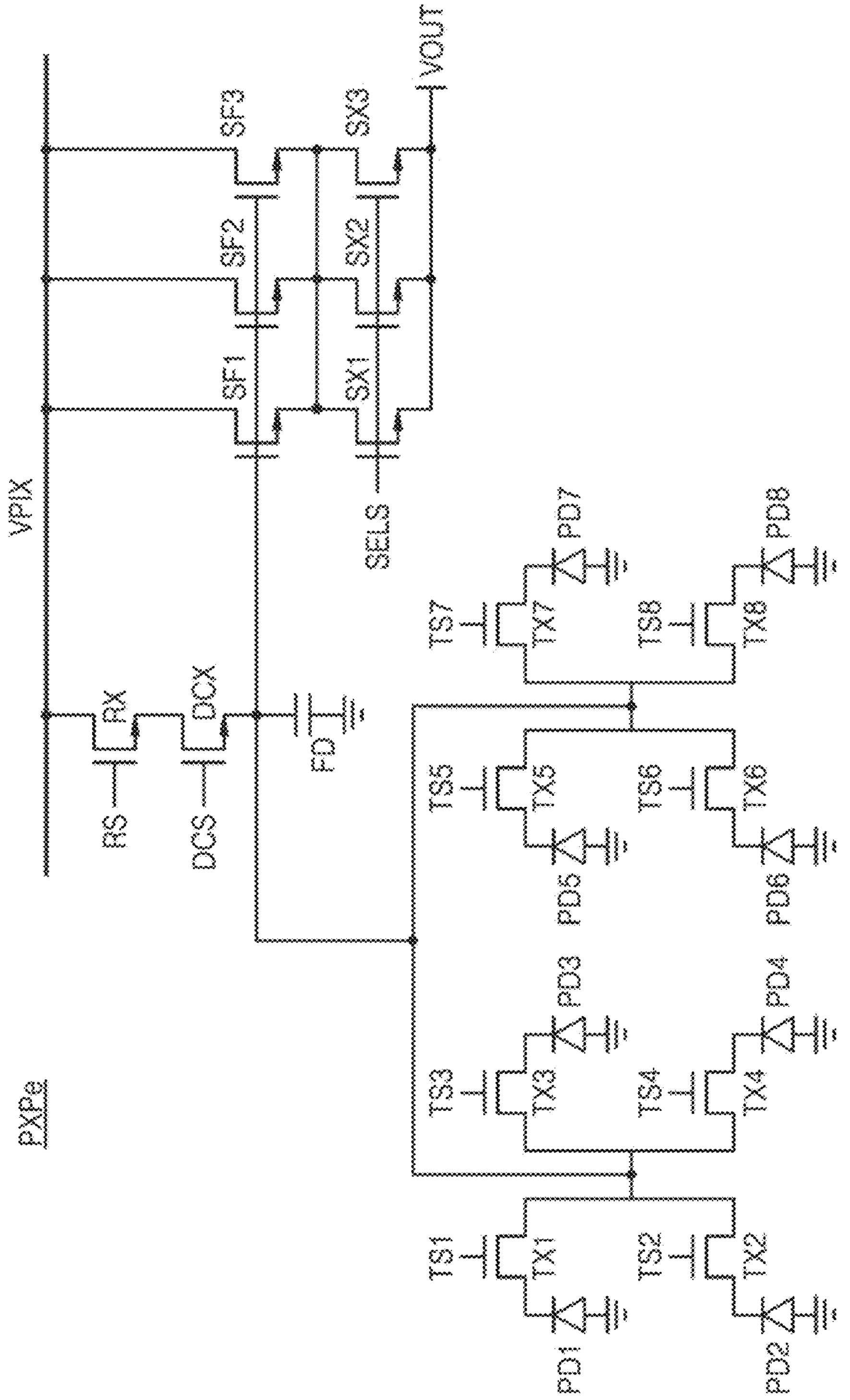

Referring to FIGS. 1, 3, 4, and 19E, the pixel portion PXPe may include the first to eighth photoelectric conversion devices PD1 to PD8, the first to eighth transfer transistors TX1 to TX8, the reset transistor RX, the double conversion gain transistor DCX, the first to third amplification transistors SF1 to SF3, and the first to third selection transistors SX1 to SX3. Differences from the pixel portion PXPd described with reference to FIG. 19D are mainly described.

The pixel portion PXPe may further include the third amplification transistor SF3 and the third selection transistor SX3. The first amplification transistor SF1 may be connected between the power supply voltage VPIX and the first selection transistor SX1. The second amplification transistor SF2 may be connected between the power supply voltage VPIX and the second selection transistor SX2. The third amplification transistor SF3 may be connected between the power supply voltage VPIX and the third selection transistor SX3. The first to third amplification transistors SF1 to SF3 may be connected in parallel to each other. The first selection transistor SX1 may be connected between the first amplification transistor SF1 and a column output line. The second selection transistor SX2 may be connected between the second amplification transistor SF2 and the column output line. The third selection transistor SX3 may be connected between the third amplification transistor SF3 and the column output line. The first to third selection transistors SX1 to SX3 may be connected in parallel to each other.

The first and second gate electrodes G1 and G2 of FIGS. 4, 8, 9, 11, 12, 14, and 17 may constitute the double conversion gain transistor DCX and a first amplification transistor SF1, the second amplification transistor SF2, the third amplification transistor SF3, the first selection transistor SX1, the second selection transistor SX2, the third selection transistor SX3, and the reset transistor RX. For example, at least one of the first gate electrode G1 or the second gate electrode G2 may be an amplification gate electrode of the first amplification transistor SF1. At least another one of the first gate electrode G1 or the second gate electrode G2 may be an amplification gate electrode of the second amplification transistor SF2. At least another one of the first gate electrode G1 or the second gate electrode G2 may be an amplification gate electrode of the third amplification transistor SF3. At least another one of the first gate electrode G1 or the second gate electrode G2 may be a selection gate electrode of the first selection transistor SX1. At least another one of the first gate electrode G1 or the second gate electrode G2 may be a selection gate electrode of the second selection transistor SX2. At least another one of the first gate electrode G1 or the second gate electrode G2 may be a selection gate electrode of the third selection transistor SX3. At least another one of the first gate electrode G1 or the second gate electrode G2 may be a reset gate electrode of the reset transistor RX. At least another one of the first gate electrode G1 or the second gate electrode G2 may be a double conversion gain gate electrode of the double conversion gain transistor DCX.

As described above, the pixel portions PXPa to PXPe may be configured in various ways. The scope of the disclosure is not limited thereto.

FIGS. 20A to 20D are plan views of an image sensor according to some embodiments. For simplicity of description, differences from the image sensor 1 described with reference to FIGS. 1 to 5C are mainly described.

Figure 20A:
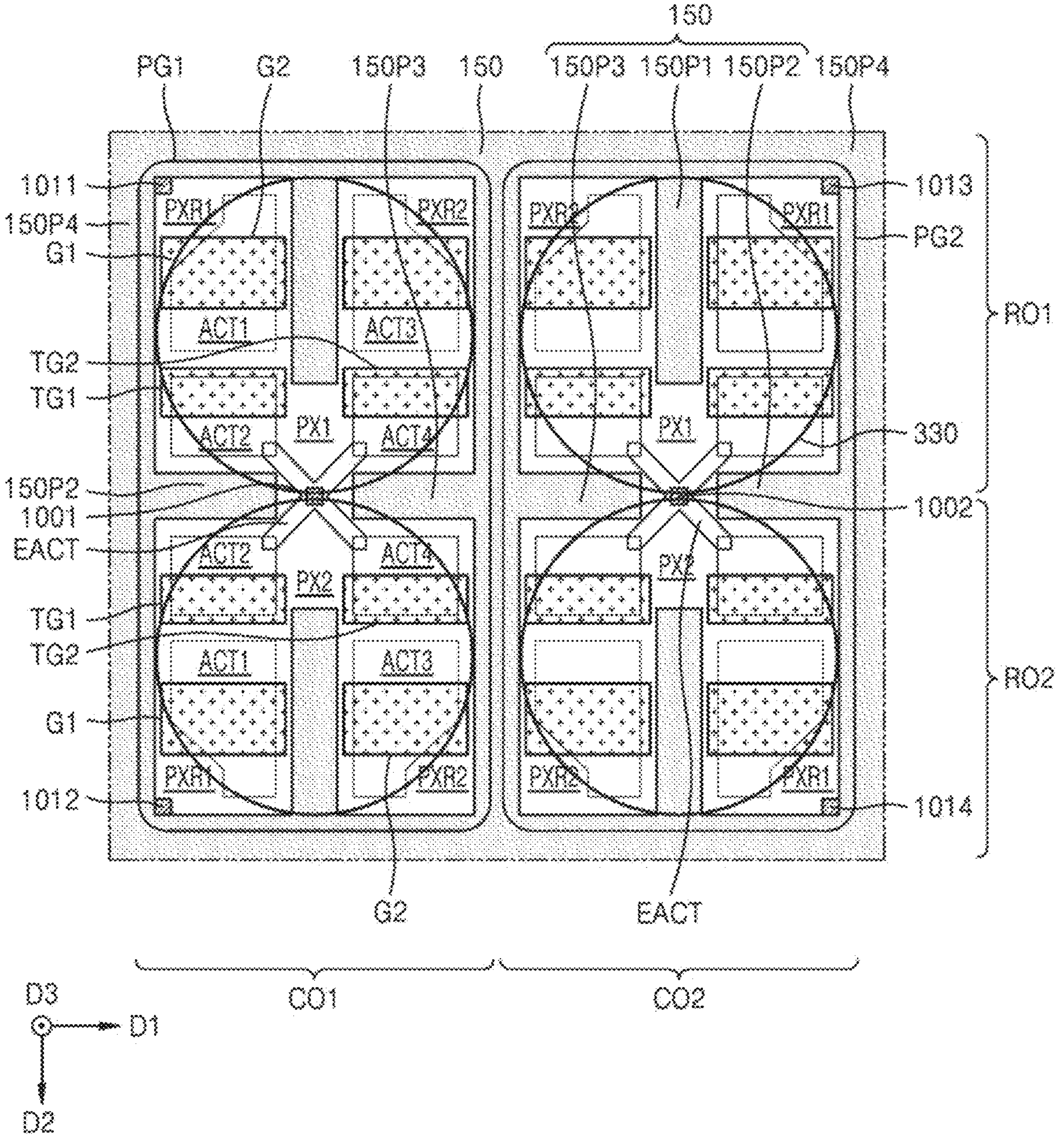
FIGS. 20A to 20D are plan views of an image sensor according to some embodiments.

Referring to FIGS. 20A to 20D, a microlens array may include a plurality of microlenses, such as microlens 330. As shown in FIG. 20A, the microlens 330 may be respectively disposed on the plurality of pixels PX. For example, the microlens 330 may be disposed on the first pixel PX1 of the first pixel group PG1, the microlens 330 may be disposed on the second pixel PX2 of the first pixel group PG1, the microlens 330 may be disposed on the first pixel PX1 of the second pixel group PG2, and the microlens 330 may be disposed on the second pixel PX2 of the second pixel group PG2. Each of plurality of microlenses may be disposed to overlap the photoelectric conversion region 110 of each of the plurality of pixels PX1 and PX2 vertically (e.g., in the third direction D3).

According to an embodiment, each of the plurality of microlenses may be disposed on two adjacent pixels PX1 and PX2 among the plurality of pixels PX1 and PX2. Each of the plurality of microlenses may overlap the two pixels PX1 and PX2 vertically (e.g., in the third direction D3), and overlap the photoelectric conversion regions 110 of the two pixels PX1 and PX2 vertically (e.g., in the third direction D3).

Figure 20B:
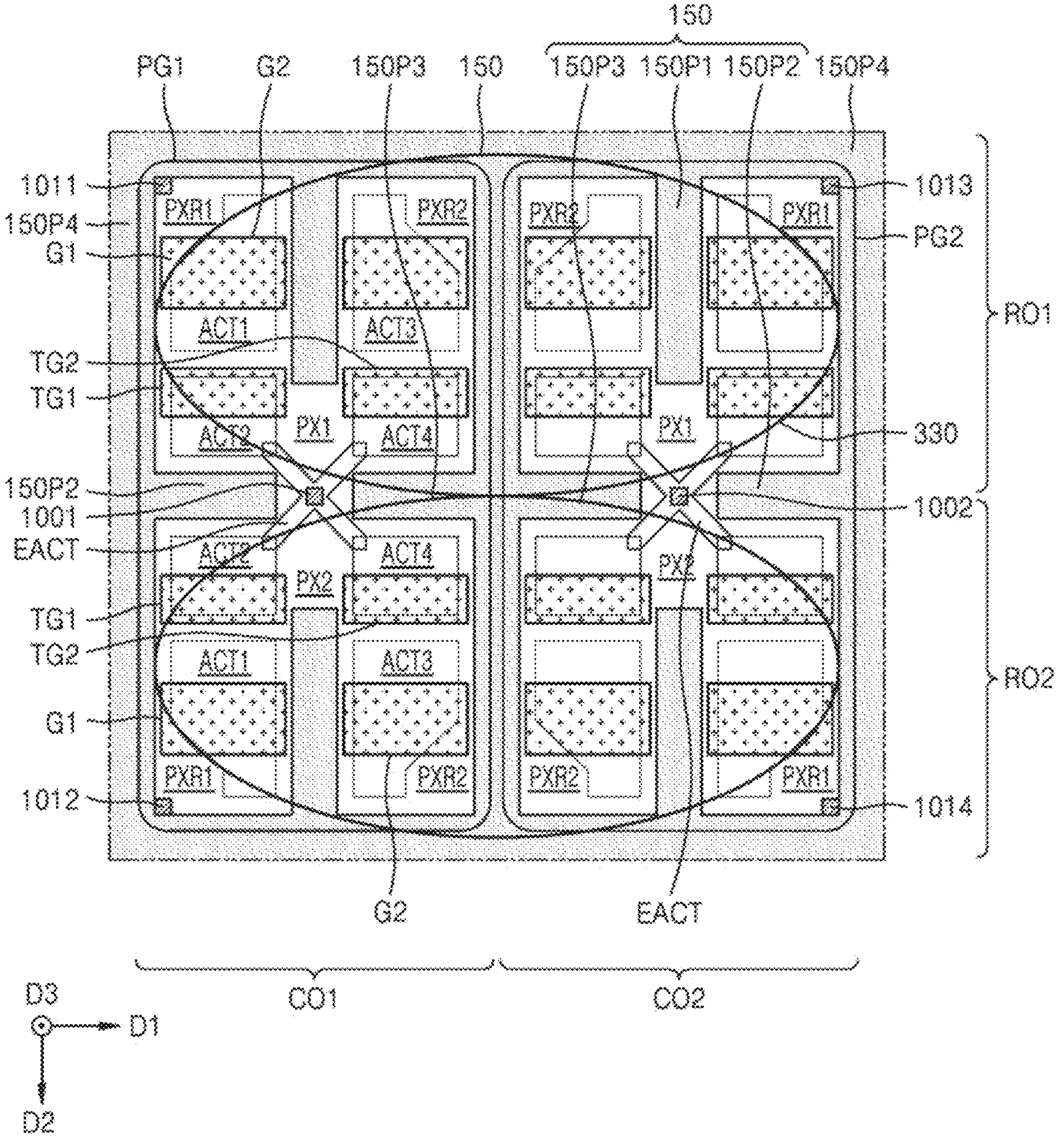

Referring to FIG. 20B, each of the plurality of microlenses, such as microlens 330, may be disposed on two pixels PX1 and PX2 adjacent to each other in the first direction D1 among the plurality of pixels PX1 and PX2, and may vertically overlap two pixel regions adjacent to each other in the first direction D1.

For example, the microlens 330 may be disposed on the first pixel PX1 of the first pixel group PG1 and the first pixel PX1 of the second pixel group PG2. The microlens 330 may be disposed on the second pixel PX2 of the first pixel group PG1 and the second pixel PX2 of the second pixel group PG2.

Figure 20C:
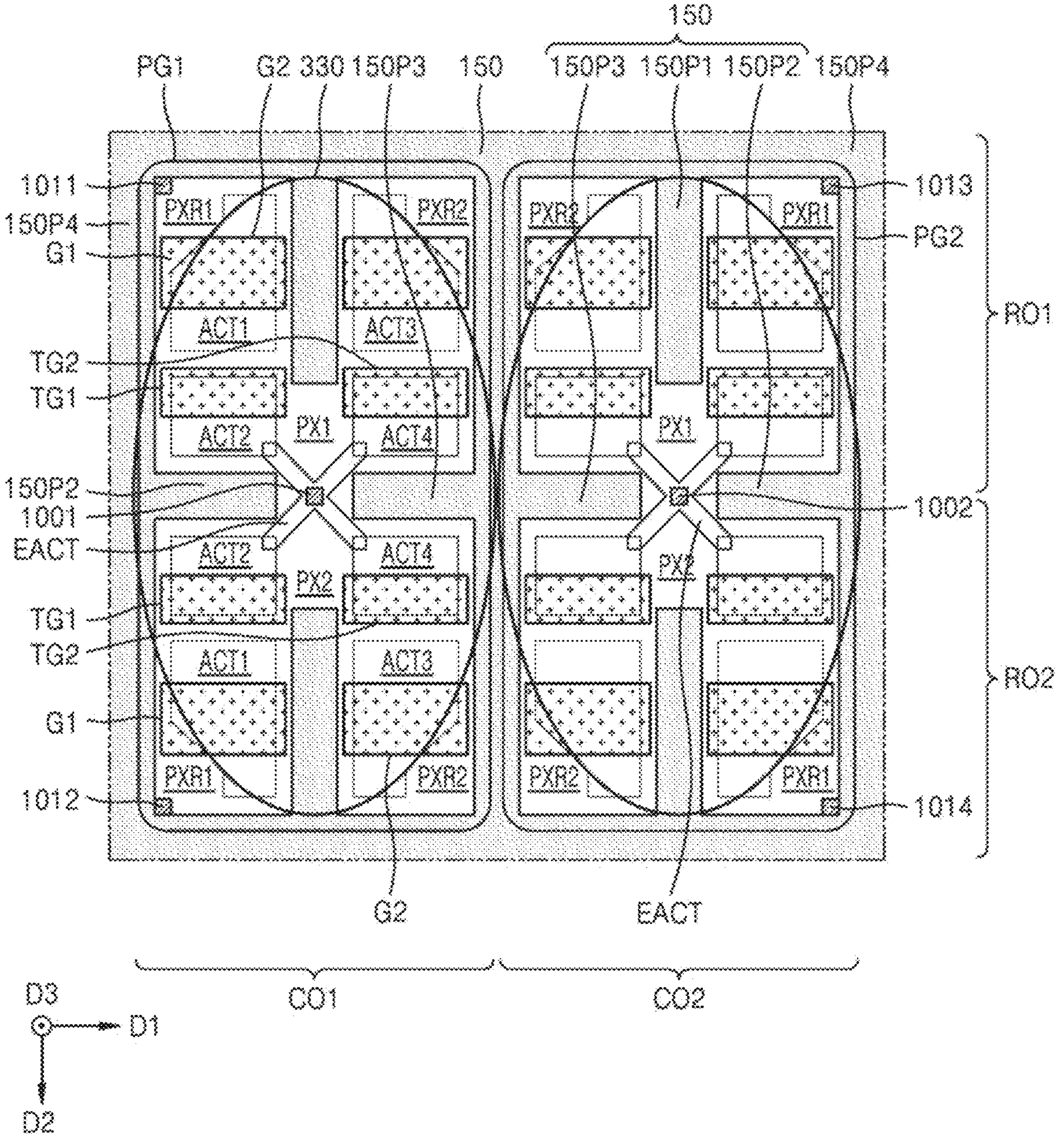

Referring to FIG. 20C, each of the plurality of microlenses, such as microlens 330, may be disposed on two pixel regions adjacent to each other in the second direction D2 among the plurality of pixels PX1 and PX2, and may vertically overlap the two pixel regions adjacent to each other in the second direction D2.

For example, the microlens 330 may be disposed on the first pixel PX1 of the first pixel group PG1 and the second pixel PX2 of the first pixel group PG1. The microlens 330 may be disposed on the first pixel PX1 of the second pixel group PG2 and the second pixel PX2 of the second pixel group PG2.

Figure 20D:
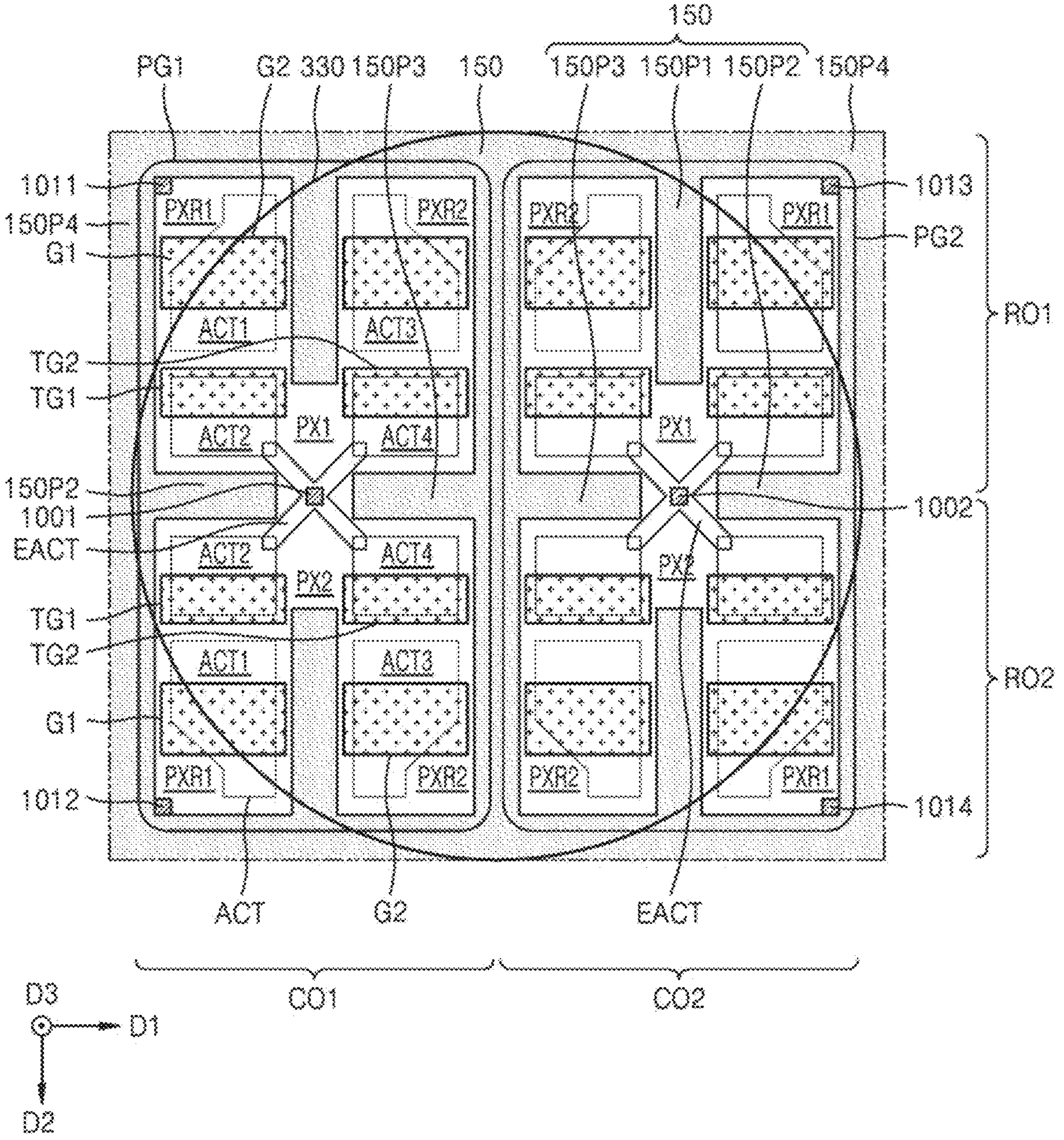

Referring to FIG. 20D, the microlens 330 may be disposed on four pixels PX1 and PX2 adjacent to each other among the plurality of pixels PX1 and PX2. The microlens 330 may overlap the four pixels PX1 and PX2 vertically (e.g., in the third direction D3), and vertically overlap the photoelectric conversion regions 110 of the four pixels PX1 and PX2 (e.g., in the third direction D3). For example, the microlens 330 may be disposed on the first pixel PX1 of the first pixel group PG1, the second pixel PX2 of the first pixel group PG1, the first pixel PX1 of the second pixel group PG2, and the second pixel PX2 of the second pixel group PG2.

Figure 21:
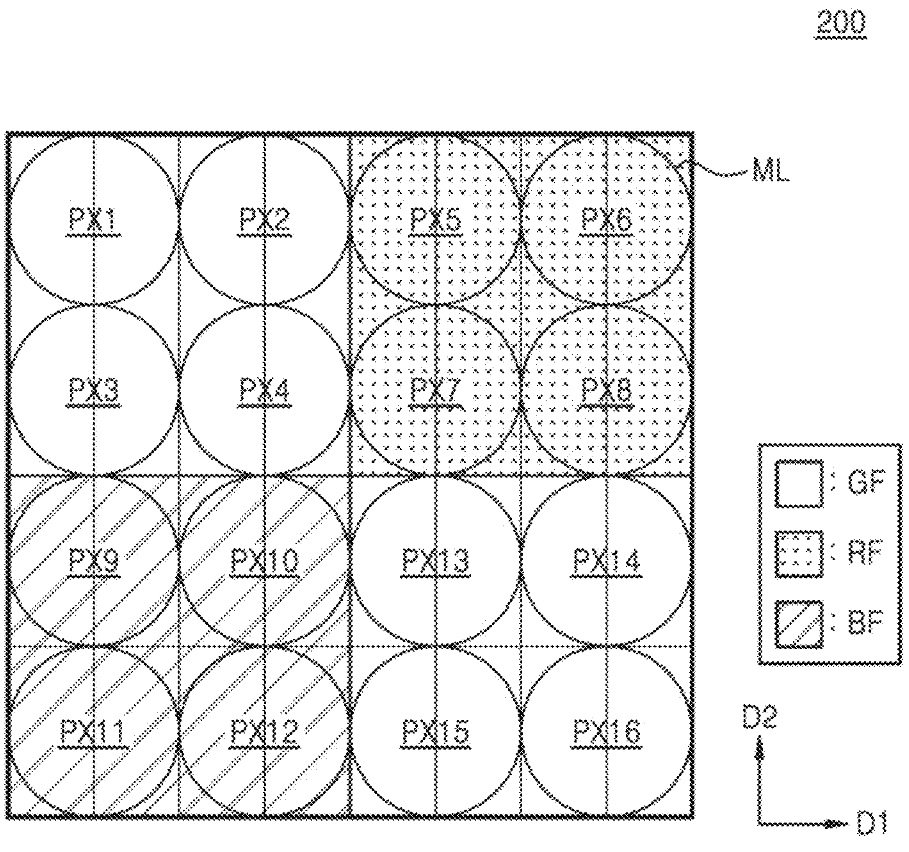
FIG. 21 is a diagram of a pixel array of an image sensor according to an embodiment.

FIG. 21 is a diagram of a pixel array of an image sensor according to an embodiment. FIG. 21 is a diagram illustrating an example of the pixel array 11 of FIG. 1.

Referring to FIG. 21, a pixel array 200 may include a plurality of pixel groups, for example, first to sixteenth pixels PX1 to PX16. Each of the first to sixteenth pixels PX1 to PX16 may include a first photoelectric conversion device and a second photoelectric conversion device disposed adjacent to each other in the first direction D1, and may include one microlens ML disposed on the first photoelectric conversion device and the second photoelectric conversion device.

The pixel array 200 may include color filters to sense various colors. Each of the first to sixteenth pixels PX1 to PX16 may include one of a green color filter GF, a red color filter RF, and a blue color filter BF. In an embodiment, an arrangement ratio of the red color filter RF, the green color filter GF, and the blue color filter BF in the pixel array 200 may be 1:2:1.

In an embodiment, four pixels disposed adjacent to each other among the plurality of pixel (e.g., the first to sixteenth pixels PX1 to PX16) included in the pixel array 200 may include the same color filter. Color filters may be disposed to form a Bayer pattern in units of four pixels among the first to sixteenth pixels PX1 to PX16. For example, each of the first to fourth pixels PX1 to PX4 and the thirteenth to sixteenth pixels PX13 to PX16 may include the green color filter GF, the fifth to eighth pixels PX5 to PX8 may include the red color filter RF, and the ninth to twelfth pixels PX9 to PX12 may include the blue color filter BF. However, the disclosure is not limited thereto, and color filters may form a Bayer pattern in units of one pixel, color filters may form a Bayer pattern in units of 9 pixels, and color filters may form a Bayer pattern in units of 16 pixels.

Figure 22:
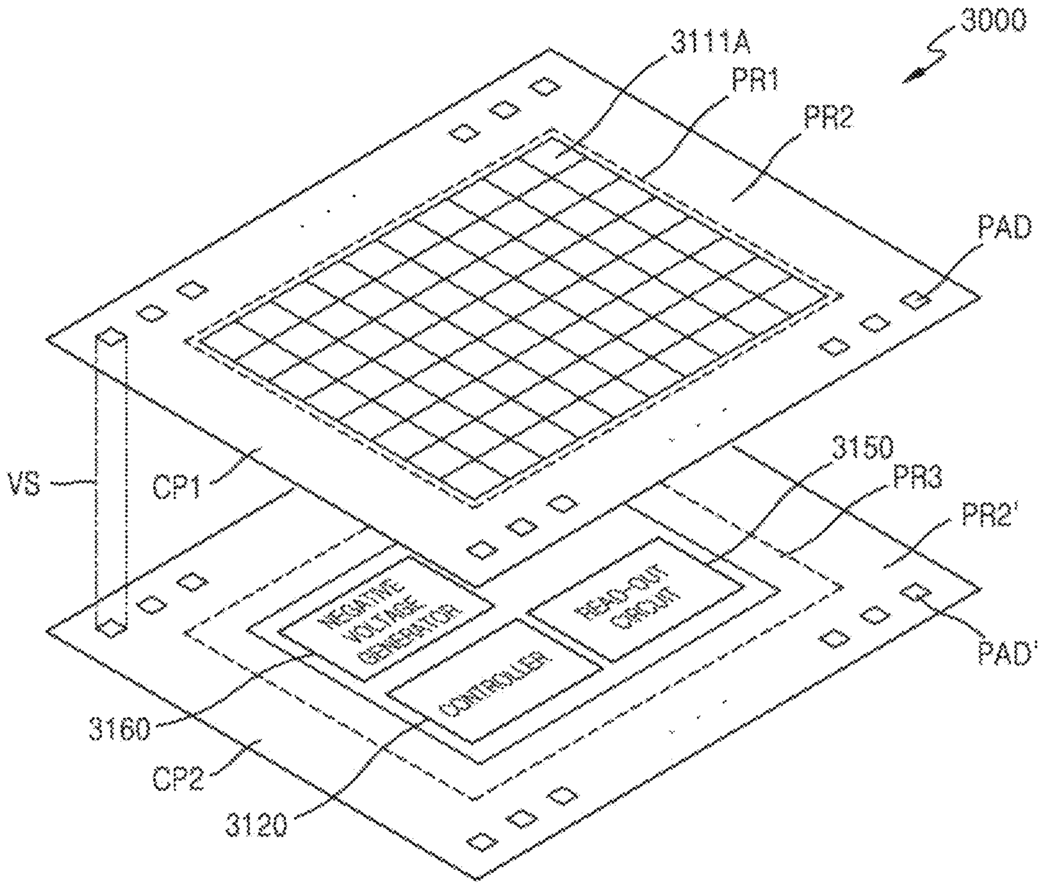
FIGS. 22 and 23 are diagrams of image sensors according to an embodiment.
Figure 23:
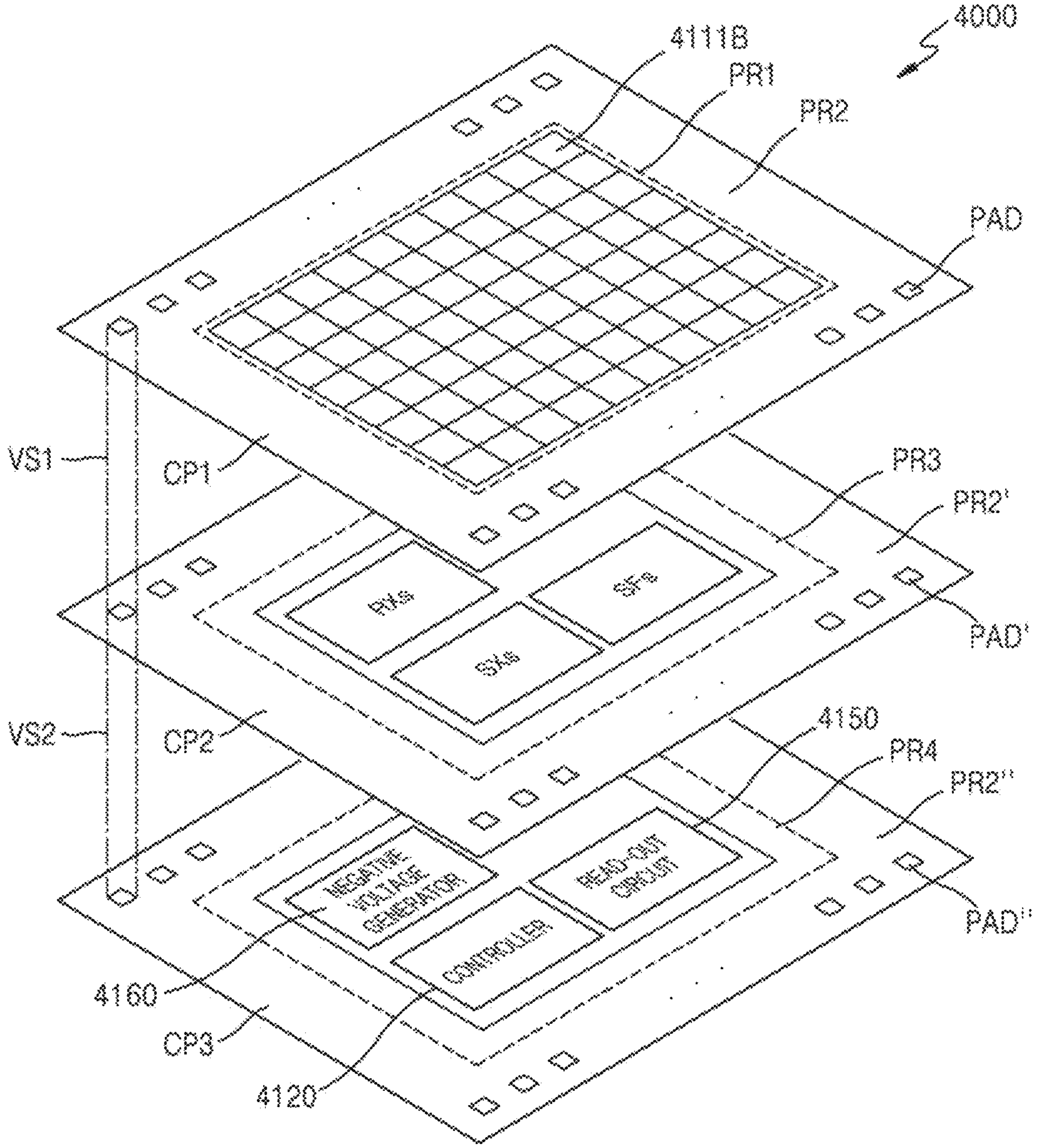

FIGS. 22 and 23 are diagrams of image sensors according to some embodiments.

Referring to FIG. 22, an image sensor 3000 may be a stacked type image sensor including a first chip CP1 and a second chip CP2 stacked in a vertical direction. The image sensor 3000 may be an implementation of the image sensor 1 described in FIG. 1.

The first chip CP1 may include a pixel region PR1 and a pad region PR2, and the second chip CP2 may include a circuit region PR3 and a pad region PR2'. The pixels PX described in FIGS. 1 to 21 may be formed in the pixel region PR1. In an embodiment, the first photoelectric conversion device PD1, the second photoelectric conversion device PD2, the first transfer transistor TX1, the second transfer transistor TX2, the floating diffusion region FD, the reset transistor RX, the amplification transistor SF, and the selection transistor SX of the pixel PX of FIG. 2 may be formed in the pixel region PR1 of the first chip CP1.

A plurality of transistors may be formed in the circuit region PR3 of the second chip CP2. For example, in the circuit region PR3 of the second chip CP2, a controller 3120 (12 in FIG. 1), a signal processor (13 in FIG. 1), a row driver (14 in FIG. 1), a read-out circuit 3150 (15 in FIG. 1), and a negative voltage generator 3160 (16 in FIG. 1) described with reference to FIG. 1 may be formed.

The pad region PR2 of the first chip CP1 may include a plurality of first conductive pads PAD, and the pad region PR2' of the second chip CP2 may include a plurality of second conductive pads PAD'. The plurality of first conductive pads PAD may respectively correspond to the plurality of second conductive pads PAD' and may be electrically connected to the plurality of second conductive pads PAD' by a via structure VS. A negative voltage generated by the negative voltage generator 3160 may be applied to a device isolation structure formed on the first chip CP1 through the corresponding second conductive pad PAD' among the plurality of second conductive pads PAD', the via structure VS, and the corresponding first conductive pad PAD among the plurality of first conductive pads PAD.

Referring to FIG. 23, an image sensor 4000 may be a stacked type image sensor including the first chip CP1, the second chip CP2, and a third chip CP3 stacked in a vertical direction. The image sensor 4000 may be an implementation of the image sensor 1 described in FIG. 1.

At least some of the pixels PX described in FIGS. 1 to 21 may be formed in the pixel region PR1 of the first chip CP1. In an embodiment, the first photoelectric conversion device PD1, the second photoelectric conversion device PD2, the first transfer transistor TX1, the second transfer transistor TX2, and the floating diffusion region FD of the pixel PX described with reference to FIG. 2 may be formed in the pixel region PR1 of the first chip CP1, and a ground contact providing a ground voltage to the pixel PX may also be formed in the pixel region PR1 of the first chip CP1. On the other hand, a plurality of reset transistors RXs, a plurality of amplification transistors SFs, and a plurality of selection transistors SXs included in the plurality of pixels PX may be formed in a circuit region PR3 of the second chip CP2.

A plurality of transistors may be formed in a circuit region PR4 of the third chip CP3. For example, in the circuit region PR4 of the third chip CP3, a controller 4120 (12 in FIG. 1), a signal processor (13 in FIG. 1), a row driver (14 in FIG. 1), a read-out circuit 4150 (15 in FIG. 1), and a negative voltage generator 4160 (16 in FIG. 1) described in FIG. 1 may be formed.

The pad region PR2 of the first chip CP1 may include the plurality of first conductive pads PAD, the pad region PR2' of the second chip CP2 may include the plurality of second conductive pads PAD', and a pad region PR2" of the third chip CP3 may include a plurality of third conductive pads PAD". The plurality of first conductive pads PAD, the plurality of second conductive pads PAD', and the plurality of third conductive pads PAD" may be electrically connected to each other by a first via structure VS1 and a second via structure VS2. A negative voltage generated by the negative voltage generator 4160 may be applied to a device isolation structure formed on the first chip CP1 through the corresponding third conductive pad PAD" among the plurality of third conductive pads PAD", the second via structure VS2, the corresponding second conductive pad PAD' among the plurality of second conductive pads PAD", the first via structure VS1, and the corresponding first conductive pad PAD among the plurality of first conductive pads PAD.

At least one of the devices, units, components, modules, units, or the like represented by a block or an equivalent indication in the above embodiments including, but not limited to, FIGS. 1, 22 and 23 may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. An image sensor comprising:
a substrate comprising:
a first pixel;
a second pixel;
a device isolation pattern; and
at least one open region,
wherein each of the first pixel and the second pixel comprises:

a first pixel region comprising a first photoelectric conversion device; and a second pixel region comprising a second photoelectric conversion device, the first pixel region and the second pixel region being parallel to each other in a first direction, wherein the device isolation pattern comprises:

a first portion between the first pixel region and the second pixel region of the first pixel and between the first pixel region and the second pixel region of the second pixel;

a second portion between the first pixel region of the first pixel and the first pixel region of the second pixel;

a third portion between the second pixel region of the first pixel and the second pixel region of the second pixel; and a fourth portion at least partially surrounding the first pixel and the second pixel and physically connected to the first portion, the second portion, and the third portion, and wherein the at least one open region comprises:

a first open region between the first pixel region and the second pixel region, the first open region being adjacent to the first portion in a second direction that is orthogonal to the first direction, and the first open region being at an edge of the first pixel and an edge of the second pixel; and a second open region between the first pixel and the second pixel and between the second portion and the third portion.

2. The image sensor of claim 1, wherein the second open region is between the first pixel and the second pixel.

3. The image sensor of claim 1, further comprising a floating diffusion region in the second open region and configured to accumulate photocharges generated by the first pixel and the second pixel.

4. The image sensor of claim 1, further comprising a floating diffusion contact plug in the second open region.

5. The image sensor of claim 4, further comprising a ground contact plug contacting the fourth portion at an edge of either the first pixel region or the second pixel region, the ground contact plug configured to provide a ground voltage.

6. The image sensor of claim 1, wherein the first pixel region of the first pixel comprises a first active pattern, wherein the second pixel region of the first pixel comprises a second active pattern, wherein the first pixel region of the second pixel comprises a third active pattern, and wherein the second pixel region of the second pixel comprises a fourth active pattern, and wherein the image sensor further comprises an extended active pattern connected to the first active pattern, the second active pattern, the third active pattern, and the fourth active pattern.

7. The image sensor of claim 6, wherein at least a portion of the extended active pattern is in the second open region.

8. The image sensor of claim 7, wherein at least a portion of the extended active pattern is in the first open region.

9. The image sensor of claim 1, wherein the first pixel region further comprises:

a first active pattern;

a second active pattern;

a first gate electrode on the first active pattern; and a first transfer gate electrode on the second active pattern, wherein the second pixel region further comprises:

a third active pattern;

a fourth active pattern;

a second gate electrode on the third active pattern; and a second transfer gate electrode on the fourth active pattern, and wherein at least a portion of the first portion is between the first active pattern and the third active pattern.

10. The image sensor of claim 9, further comprising an extended active pattern connected to the second active pattern and the fourth active pattern, wherein at least a portion of the extended active pattern is in the second open region.

11. The image sensor of claim 1, further comprising a ground contact plug contacting the fourth portion and the second portion at an edge of the first pixel region, and configured to provide a ground voltage.

12. The image sensor of claim 1, further comprising a ground contact plug in the second open region and configured to provide a ground voltage applied to the first pixel and the second pixel.

13. The image sensor of claim 12, wherein the first pixel region of the first pixel comprises a first active pattern, wherein the second pixel region of the first pixel comprises a second active pattern, wherein the first pixel region of the second pixel comprises a third active pattern, wherein the second pixel region of the second pixel comprises a fourth active pattern, and wherein the image sensor further comprises:

a first extended active pattern connected to the first active pattern and the second active pattern and in the first open region of the first pixel;

a second extended active pattern connected to the third active pattern and the fourth active pattern and in the first open region of the second pixel; and a fifth active pattern in the second open region.

14. The image sensor of claim 12, wherein the first pixel region further comprises:

a first active pattern;

a second active pattern;

a first gate electrode on the first active pattern; and a first transfer gate electrode on the second active pattern, wherein the second pixel region further comprises:

a third active pattern;

a fourth active pattern;

a second gate electrode on the third active pattern; and a second transfer gate electrode on the fourth active pattern, and wherein at least a portion of the first portion is between the second active pattern and the fourth active pattern.

15. The image sensor of claim 14, further comprising an extended active pattern connected to the first active pattern and the third active pattern, wherein at least a portion of the extended active pattern is in the first open region.

16. The image sensor of claim 1, further comprising:

a first microlens on the first pixel; and a second microlens on the second pixel.

17. The image sensor of claim 1, further comprising a microlens on the first pixel and the second pixel.

18. An image sensor comprising:

a substrate comprising:

a first pixel;

a second pixel; and a device isolation pattern, wherein each of the first pixel and the second pixel comprises:

a first pixel region comprising a first photoelectric conversion device; and a second pixel region comprising a second photoelectric conversion device, the first pixel region and the second pixel region being parallel to each other in a first direction, wherein the device isolation pattern comprises:

a first portion between the first pixel region and the second pixel region of the first pixel and between the first pixel region and the second pixel region of the second pixel;

a second portion between the first pixel region of the first pixel and the first pixel region of the second pixel;

a third portion between the second pixel region of the first pixel and the second pixel region of the second pixel; and a fourth portion at least partially surrounding the first pixel and the second pixel and physically connected to the first portion, the second portion, and the third portion, wherein the first portion of the first pixel and the first portion of the second pixel are spaced apart from each other in a second direction that is orthogonal to the first direction, and wherein the second portion and the third portion are spaced apart from each other in the first direction.

19. An image sensor comprising:

a substrate comprising:

a first pixel;

a second pixel;

a device isolation pattern; and at least one open region, wherein each of the first pixel and the second pixel comprises:

a first pixel region comprising a first photoelectric conversion device; and a second pixel region comprising a second photoelectric conversion device, the first pixel region and the second pixel region being parallel to each other in a first direction, wherein the device isolation pattern comprises:

a first portion between the first pixel region and the second pixel region of the first pixel and between the first pixel region and the second pixel region of the second pixel;

a second portion spaced apart from the first portion in the first direction and on one side of the first pixel region; and a third portion at least partially surrounding the first pixel and the second pixel and physically connected to the first portion and the second portion, and wherein the at least one open region comprises:

a first open region between the first pixel region and the second pixel region, the first open region being adjacent to the first portion in a second direction that is orthogonal to the first direction, and the first open region being at an edge of each of the first pixel and the second pixel; and a second open region between the first pixel and the second pixel and between the second portion of the first pixel and the second portion of the second pixel.

20. The image sensor of claim 19, further comprising a ground contact plug in the second open region.

* * * * *